(12) United States Patent
Young et al.

(10) Patent No.: US 12,238,926 B2
(45) Date of Patent: *Feb. 25, 2025

(54) THREE-DIMENSIONAL MEMORY DEVICE AND METHOD

(71) Applicant: Taiwan Semiconductor Manufacturing Co., Ltd., Hsinchu (TW)

(72) Inventors: Bo-Feng Young, Taipei (TW); Sai-Hooi Yeong, Zhubei (TW); Han-Jong Chia, Hsinchu (TW); Sheng-Chen Wang, Hsinchu (TW); Yu-Ming Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/149,442

(22) Filed: Jan. 3, 2023

(65) Prior Publication Data

US 2023/0147923 A1   May 11, 2023

Related U.S. Application Data

(63) Continuation of application No. 17/157,489, filed on Jan. 25, 2021, now Pat. No. 11,545,500.

(Continued)

(51) Int. Cl.
*H10B 41/20* (2023.01)
*G11C 7/18* (2006.01)
(Continued)

(52) U.S. Cl.
CPC .............. *H10B 41/20* (2023.02); *G11C 7/18* (2013.01); *G11C 8/14* (2013.01); *H10B 41/10* (2023.02)

(58) Field of Classification Search
CPC ........ H10B 41/20; H10B 41/10; H10B 51/20; H10B 51/50; H10B 43/20; H10B 43/50;
(Continued)

(56) References Cited

U.S. PATENT DOCUMENTS 8,513,729 B2    8/2013  Choe et al.
9,620,712 B2 *  4/2017  Hayashi ............. H10N 70/8418
(Continued)

FOREIGN PATENT DOCUMENTS

CN    109980012 A    7/2019
CN    111406319 A    7/2020
(Continued)

*Primary Examiner* — Allison Bernstein
(74) *Attorney, Agent, or Firm* — Slater Matsil, LLP

(57) ABSTRACT

In an embodiment, a device includes: a first dielectric layer having a first sidewall; a second dielectric layer having a second sidewall; a word line between the first dielectric layer and the second dielectric layer, the word line having an outer sidewall and an inner sidewall, the inner sidewall recessed from the outer sidewall, the first sidewall, and the second sidewall; a memory layer extending along the outer sidewall of the word line, the inner sidewall of the word line, the first sidewall of the first dielectric layer, and the second sidewall of the second dielectric layer; and a semiconductor layer extending along the memory layer.

20 Claims, 45 Drawing Sheets

Related U.S. Application Data

(60) Provisional application No. 63/064,731, filed on Aug. 12, 2020.

(51) Int. Cl.
*G11C 8/14* (2006.01)
*H10B 41/10* (2023.01)

(58) Field of Classification Search
CPC .......... H10B 51/10; H10B 51/30; G11C 7/18; G11C 8/14; G11C 11/223; H01L 29/78391
See application file for complete search history.

(56) References Cited

U.S. PATENT DOCUMENTS

| | | |
|---|---|---|
| 10,381,376 B1 | 8/2019 | Nishikawa et al. |
| 11,705,503 B2 | 7/2023 | Kim et al. |
| 2002/0028541 A1 | 3/2002 | Lee et al. |
| 2010/0140679 A1 | 6/2010 | Walker |
| 2011/0298037 A1 | 12/2011 | Choe et al. |
| 2015/0179577 A1 | 6/2015 | Tobitsuka et al. |
| 2015/0214239 A1 | 7/2015 | Rhie |
| 2016/0126455 A1 | 5/2016 | Hayashi et al. |
| 2018/0040623 A1 | 2/2018 | Kanakamedala et al. |
| 2020/0026990 A1 | 1/2020 | Lue |
| 2020/0176475 A1 | 6/2020 | Harari |

FOREIGN PATENT DOCUMENTS

| | | |
|---|---|---|
| KR | 20110001594 A | 1/2011 |
| KR | 20110132817 A | 12/2011 |
| KR | 20200084211 A | 7/2020 |

\* cited by examiner

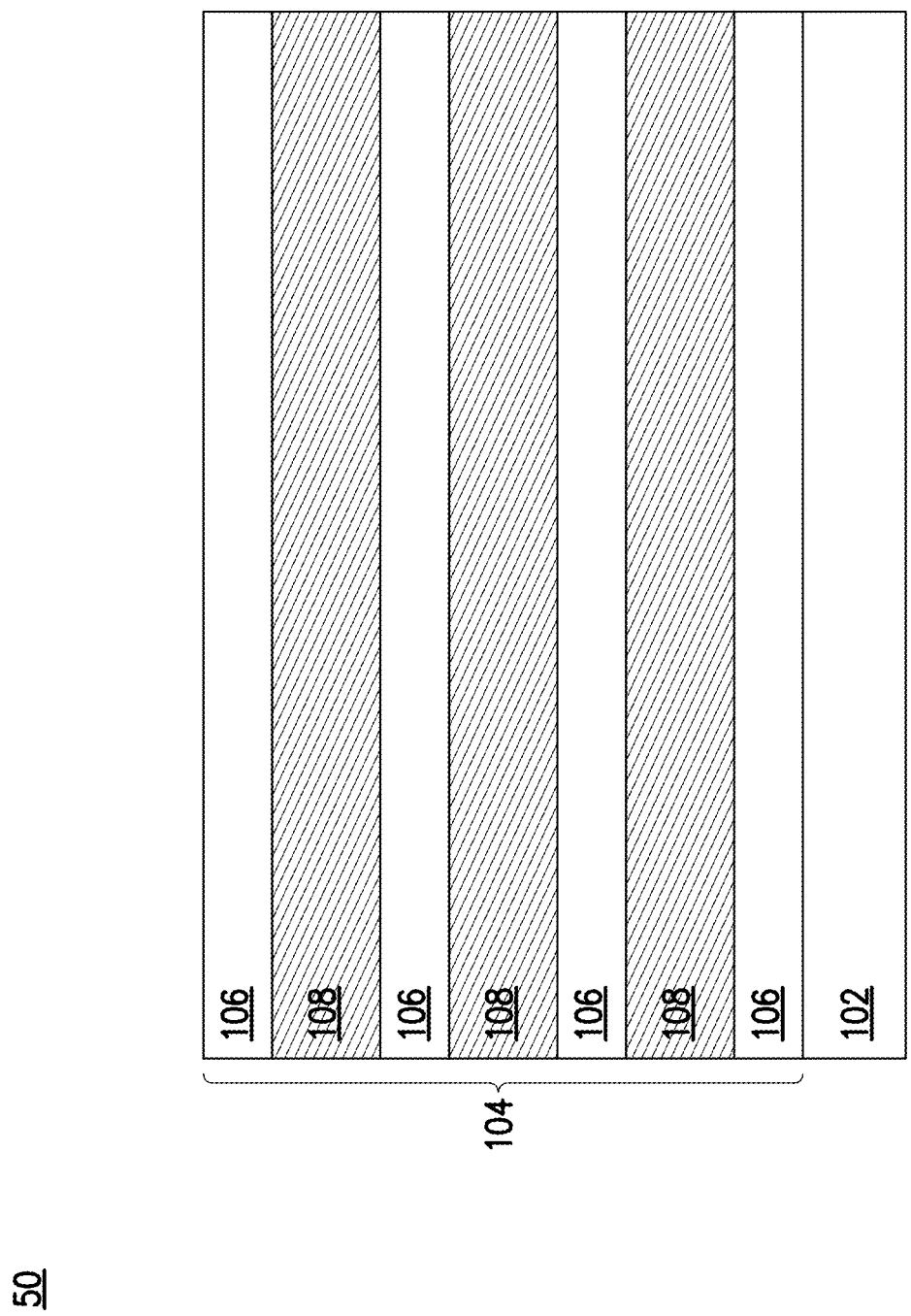

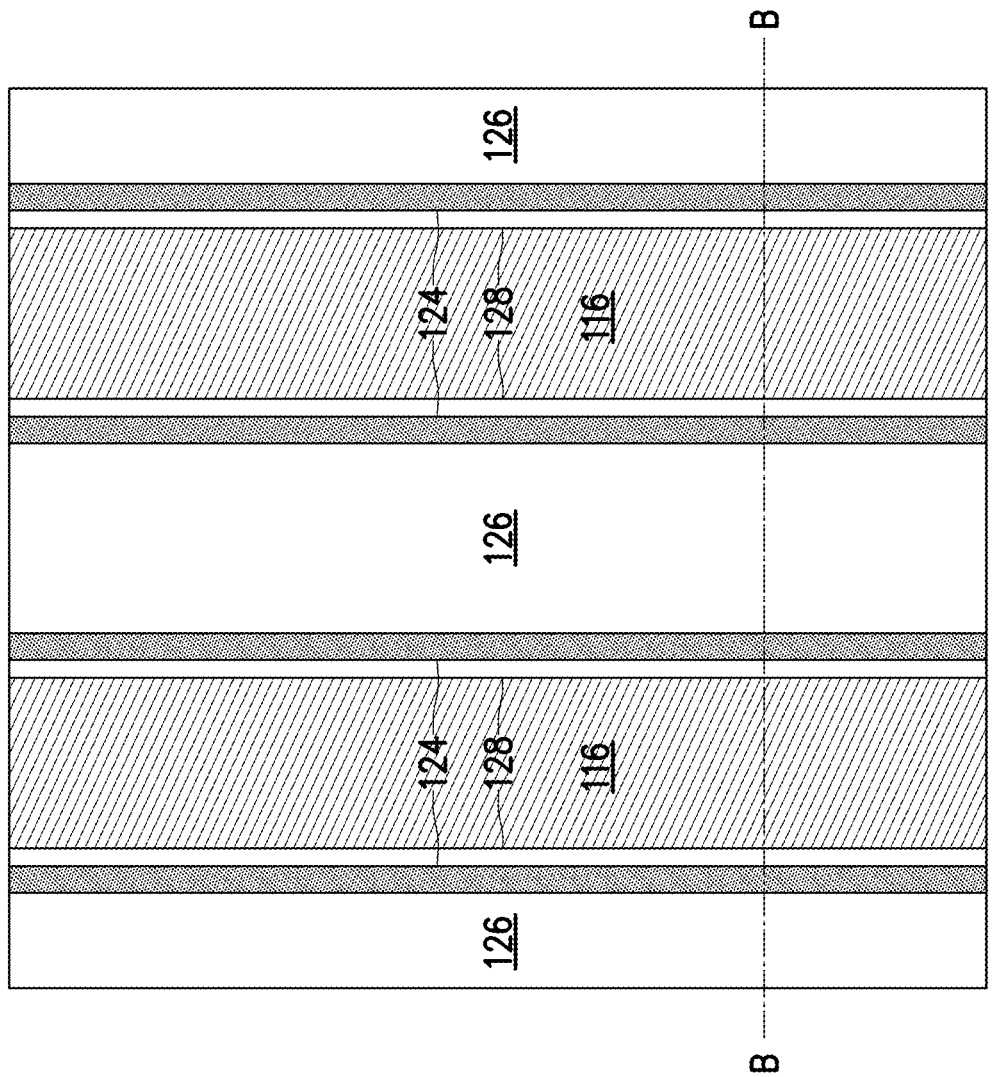

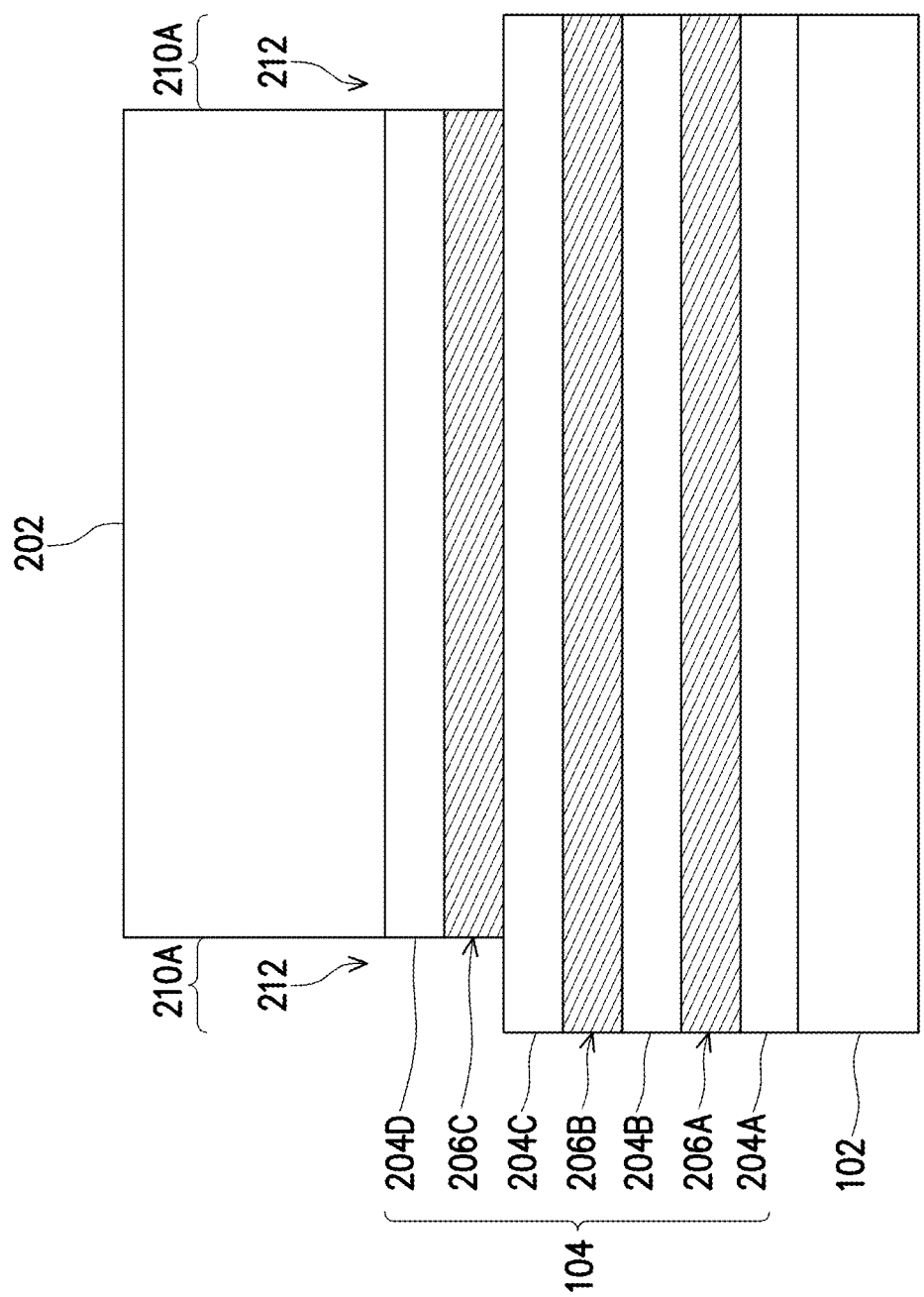

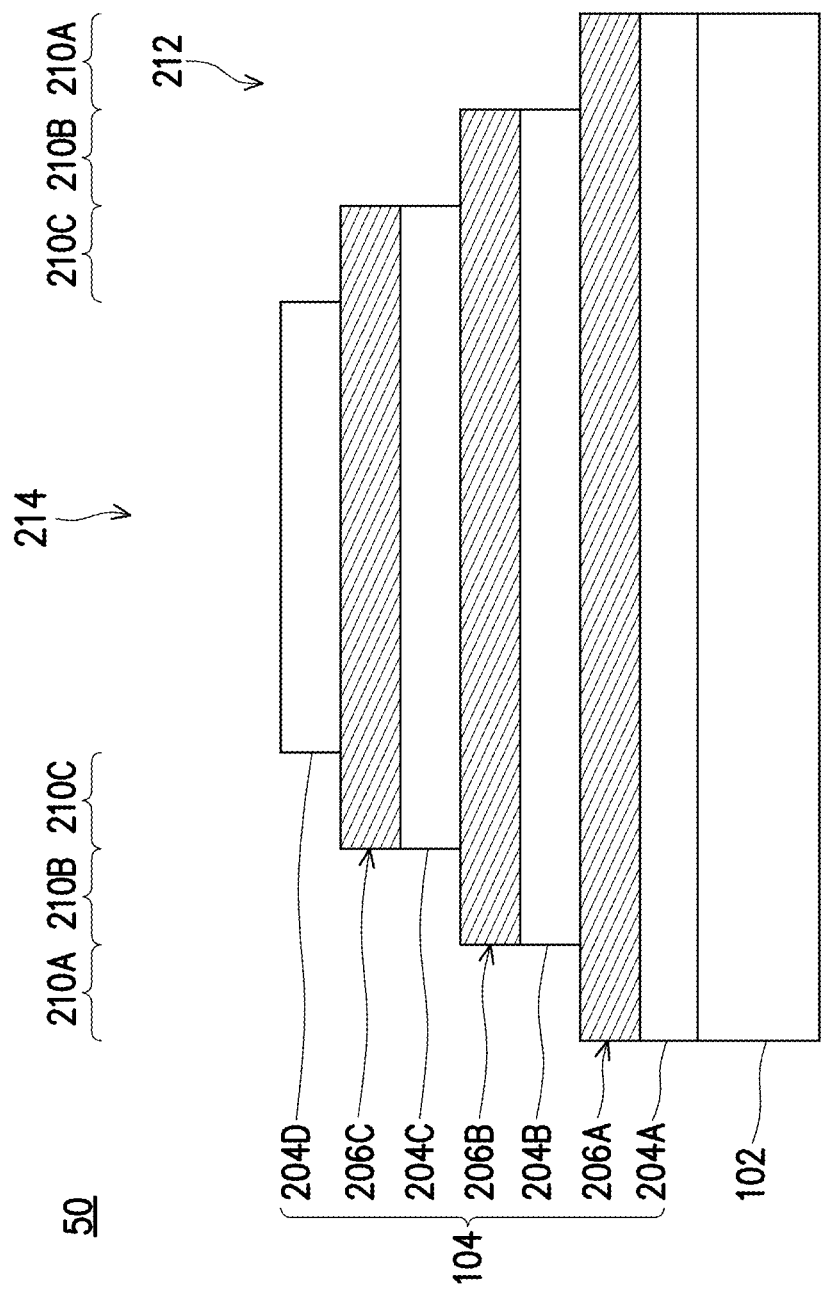

THREE-DIMENSIONAL MEMORY DEVICE AND METHOD

PRIORITY CLAIM AND CROSS-REFERENCE

This application is a continuation of U.S. patent application Ser. No. 17/157,489, filed on Jan. 25, 2021, entitled "Three-Dimensional Memory Device and Method," which claims the benefit of U.S. Provisional Application No. 63/064,731, filed on Aug. 12, 2020, which applications are hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is ferroelectric random access memory (FeRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 16D are views of intermediate stages in the manufacturing of a memory array, in accordance with some embodiments.

FIGS. 17A through 17J are views of intermediate stages in the manufacturing of a staircase structure of a memory array, in accordance with some embodiments.

DETAILED DESCRIPTION

Figure 1A:
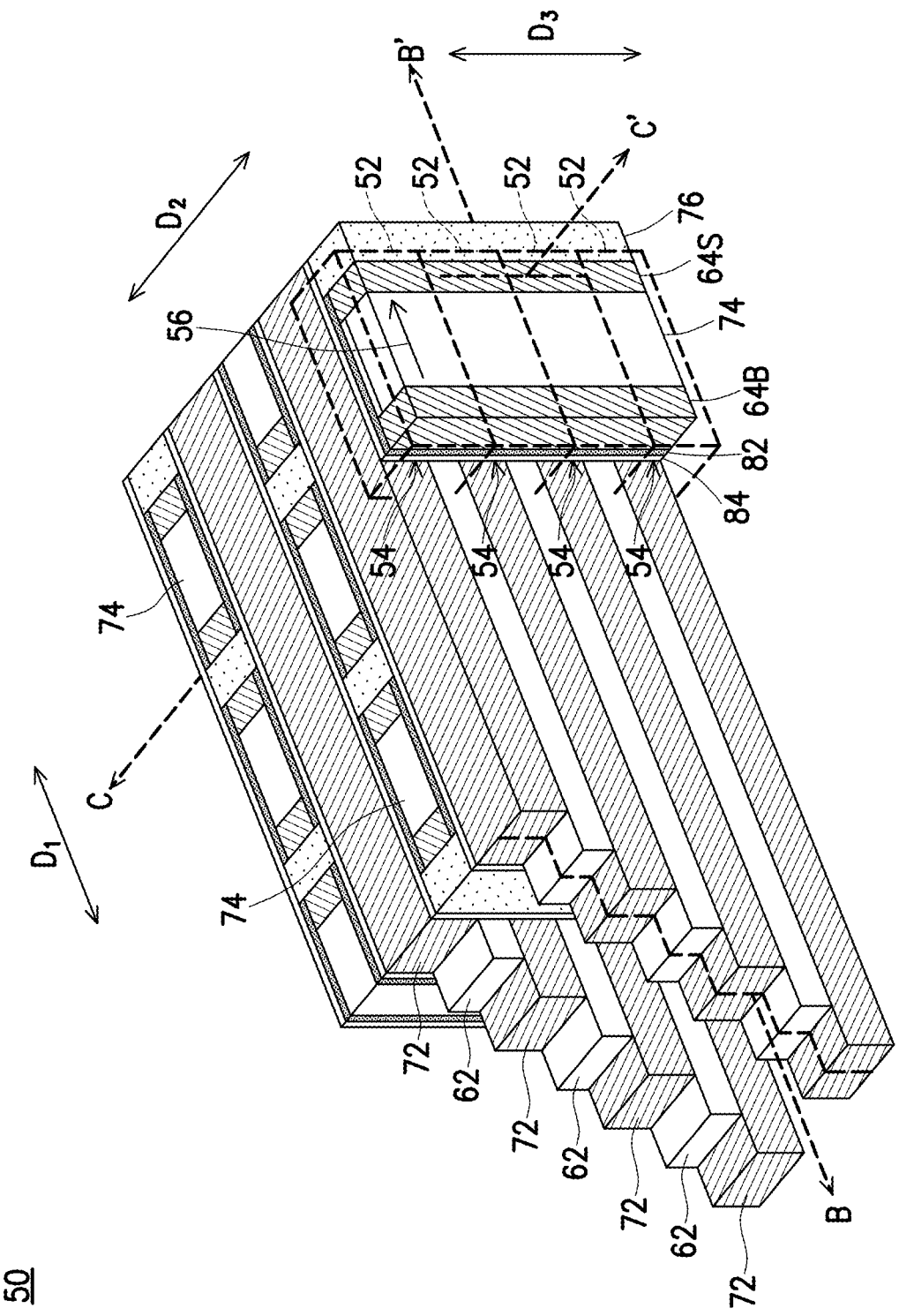
FIGS. 1A, 1B, and 1C are various views of a memory array.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, three-dimensional memory arrays are formed of transistors (such as programmable thin film transistors (TFTs)) having three-dimensional channel regions. Such channel regions can be formed by forming word lines with main portions and projecting portions. Film stacks for the transistors are then deposited along the main portions and the projecting portions of the word lines. Bit lines and source lines are formed in contact with the film stacks for the transistors, thereby completing formation of the transistors. Forming transistors with three-dimensional channel regions may allow the performance of the transistors to be improved.

Figure 1B:
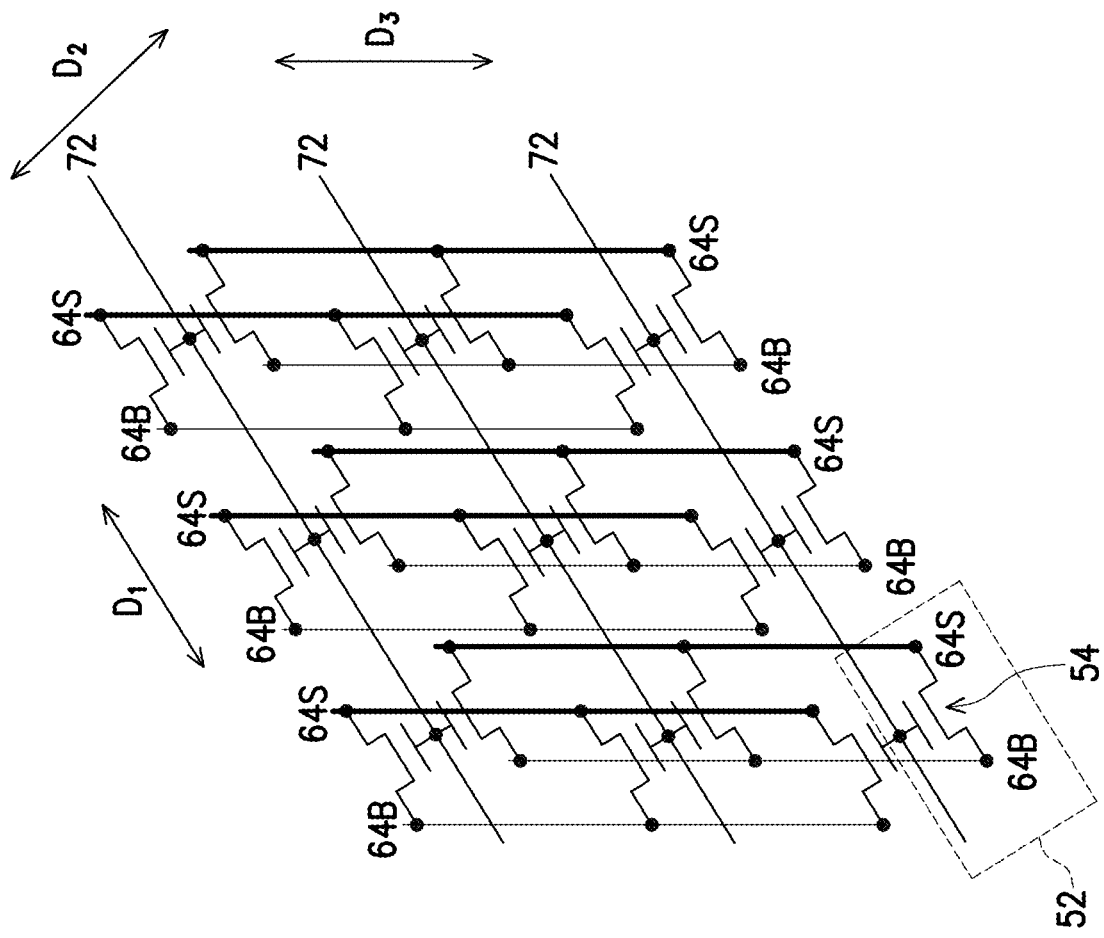
Figure 1C:
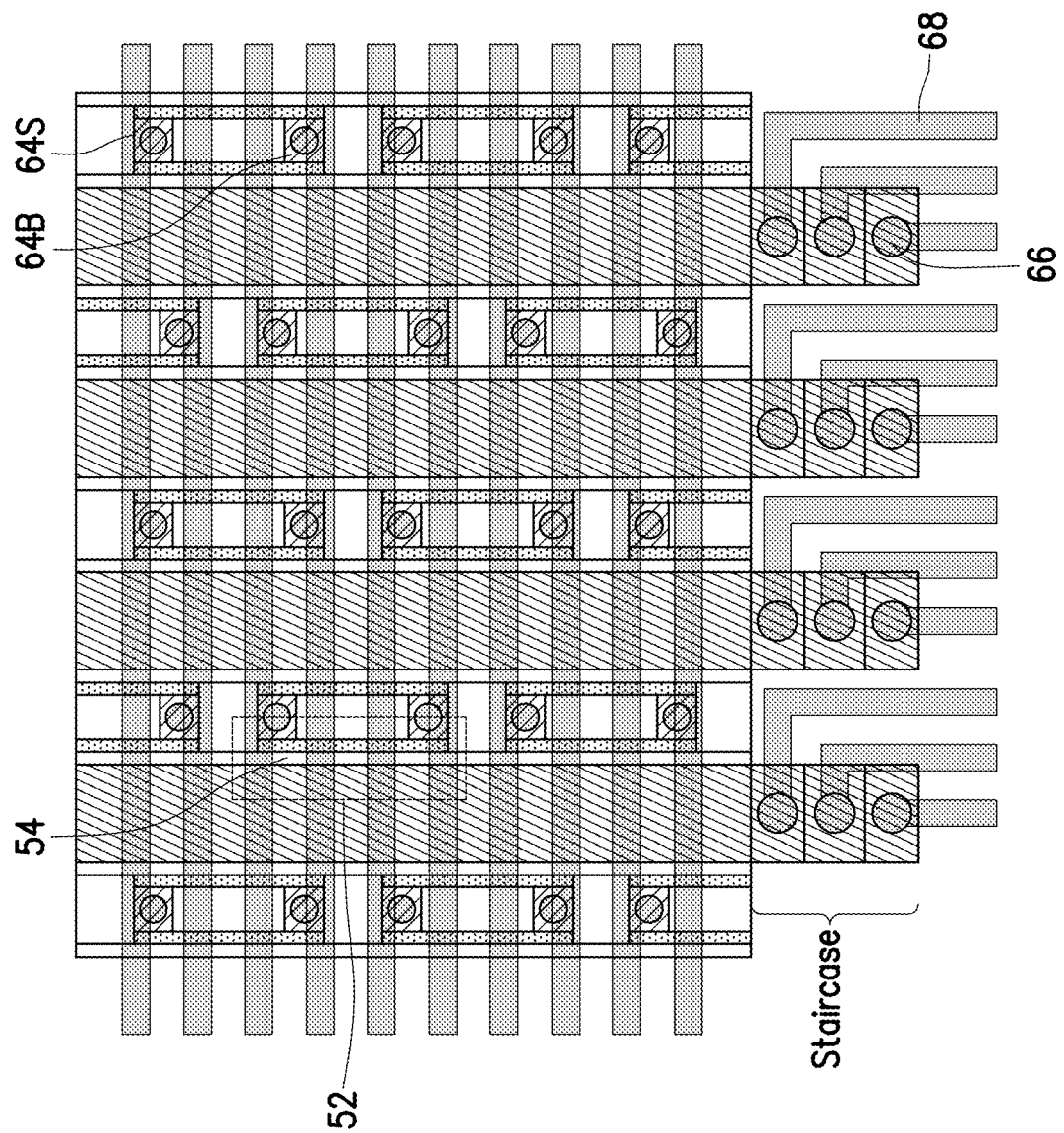

FIGS. 1A, 1B, and 1C illustrate examples of a memory array 50. FIG. 1A illustrates an example of a portion of the memory array 50 in a three-dimensional view; FIG. 1B illustrates a circuit diagram of the memory array 50; and FIG. 1C illustrates a top down view of a portion of the memory array 50. The memory array 50 includes a plurality of memory cells 52, which may be arranged in a grid of rows and columns. The memory cells 52 may further stacked vertically to provide a three dimensional memory array, thereby increasing device density. The memory array 50 may be disposed in the back end of line (BEOL) of a semiconductor die. For example, the memory array 50 may be disposed in the interconnect layers of the semiconductor die, such as, above one or more active devices (e.g., transistors) formed on a semiconductor substrate.

The memory array 50 may be a memory array such as a NOR memory array, or the like. Each memory cell 52 may include a transistor 54 (such as a TFT) with an insulating, memory layer 84 as a gate dielectric. A gate of each transistor 54 is electrically coupled to a respective word line (e.g., conductive line 72), a first source/drain region of each transistor 54 is electrically coupled to a respective bit line (e.g., conductive line 64B), and a second source/drain region of each transistor 54 is electrically coupled to a respective source line (e.g., conductive line 64S), which electrically couples the second source/drain region to ground. The memory cells 52 in a same horizontal row of the memory array 50 may share a common word line while the memory cells 52 in a same vertical column of the memory array 50 may share a common source line and a common bit line.

The memory array 50 includes a plurality of vertically stacked conductive lines 72 (e.g., word lines) with dielectric layers 62 disposed between adjacent ones of the conductive lines 72. The conductive lines 72 extend in a direction $D_1$ parallel to a major surface of an underlying substrate (not explicitly illustrated in FIGS. 1A and 1B). The conductive lines 72 may be part of a staircase structure such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 50, and conductive contacts 66 (see FIG. 1C) may be made to an exposed portion of each of the conductive lines 72. The conductive contacts 66 may be, e.g., vias that connect the exposed portions of the conductive lines 72 to interconnects 68 (see FIG. 1C) of overlying interconnect layers when the memory array 50 is disposed in the interconnect layers of a semiconductor die.

The memory array 50 further includes a plurality of conductive lines 64B (e.g., bit lines) and conductive lines 64S (e.g., source lines). The conductive lines 64B, 64S are disposed between the conductive lines 72 along a direction $D_2$ perpendicular to the direction $D_1$. The conductive lines 64B, 64S may each extend in a direction $D_3$ perpendicular to the direction $D_1$. Isolation regions 74 are disposed between and isolate adjacent ones of the conductive lines 64B and the conductive lines 64S. Pairs of the conductive lines 64B, 64S along with an intersecting conductive line 72 define boundaries of each memory cell 52, and an isolation region 76 is disposed between and isolates adjacent pairs of the conductive lines 64B, 64S. The conductive lines 64S may be electrically coupled to ground. Although FIG. 1A illustrates a particular placement of the conductive lines 64B relative the conductive lines 64S, it should be appreciated that the placement of the conductive lines 64B, 64S may be flipped.

The memory array 50 may also include semiconductor layers 82. The semiconductor layers 82 may provide channel regions for the transistors 54 of the memory cells 52. For example, when an appropriate voltage (e.g., higher than a respective threshold voltage ($V_{th}$) of a corresponding transistor 54) is applied through a corresponding conductive line 72, a region of a semiconductor layer 82 that intersects the conductive line 72 may allow current to flow from the conductive lines 64B to the conductive lines 64S (e.g., in the direction indicated by arrow 56). In FIG. 1A, each semiconductor layer 82 contacts one surface of each corresponding word line (e.g., each conductive line 72), thus providing planar channel regions for the transistors 54. As discussed in greater detail below, according to various embodiments, the semiconductor layers 82 are formed to contact multiple surfaces of the corresponding word lines (e.g., the conductive lines 72), thus providing three-dimensional channel regions for the transistors 54.

A memory layer 84 is disposed between the conductive lines 72 and the semiconductor layers 82, and the memory layer 84 may provide gate dielectrics for the transistors 54. The memory layer 84 may comprise a ferroelectric material, such as a hafnium oxide, hafnium zirconium oxide, silicon-doped hafnium oxide, or the like. Accordingly, the memory array 50 may also be referred to as a ferroelectric random access memory (FERAM) array. Alternatively, the memory layer 84 may be a multilayer structure comprising a layer of silicon nitride between two silicon oxide layers (e.g., an oxide-nitride-oxide (ONO) structure), a different ferroelectric material, a different type of memory layer (e.g., capable of storing a bit), or the like.

When the memory layer 84 comprises a ferroelectric material, the memory layer 84 may be polarized in one of two different directions, and the polarization direction may be changed by applying an appropriate voltage differential across the memory layer 84 and generating an appropriate electric field. The polarization may be relatively localized (e.g., generally contained within each boundaries of the memory cells 52), and a continuous region of the memory layer 84 may extend across a plurality of memory cells 52. Depending on a polarization direction of a particular region of the memory layer 84, a threshold voltage of a corresponding transistor 54 varies, and a digital value (e.g., 0 or 1) can be stored. For example, when a region of the memory layer 84 has a first electrical polarization direction, the corresponding transistor 54 may have a relatively low threshold voltage, and when the region of the memory layer 84 has a second electrical polarization direction, the corresponding transistor 54 may have a relatively high threshold voltage. The difference between the two threshold voltages may be referred to as the threshold voltage shift. A larger threshold voltage shift makes it easier (e.g., less error prone) to read the digital value stored in the corresponding memory cell 52.

To perform a write operation on a memory cell 52, a write voltage is applied across a portion of the memory layer 84 corresponding to the memory cell 52. The write voltage can be applied, for example, by applying appropriate voltages to a corresponding conductive line 72 (e.g., the word line) and the corresponding conductive lines 64B, 64S (e.g., the bit line/source line). By applying the write voltage across the portion of the memory layer 84, a polarization direction of the region of the memory layer 84 can be changed. As a result, the corresponding threshold voltage of the corresponding transistor 54 can also be switched from a low threshold voltage to a high threshold voltage or vice versa, and a digital value can be stored in the memory cell 52. Because the conductive lines 72 intersect the conductive lines 64B, 64S, individual memory cells 52 may be selected for the write operation.

To perform a read operation on the memory cell 52, a read voltage (a voltage between the low and high threshold voltages) is applied to the corresponding conductive line 72 (e.g., the world line). Depending on the polarization direction of the corresponding region of the memory layer 84, the transistor 54 of the memory cell 52 may or may not be turned on. As a result, the conductive line 64B may or may not be discharged through the conductive line 64S (e.g., a source line that is coupled to ground), and the digital value stored in the memory cell 52 can be determined. Because the conductive lines 72 intersect the conductive lines 64B, 64S, individual memory cells 52 may be selected for the read operation.

FIGS. 2 through 16D are views of intermediate stages in the manufacturing of a memory array 50, in accordance with some embodiments. FIGS. 15D and 16D are three-dimensional views. FIGS. 2, 3, 4, 5, 6, 7A, 7B, 7C, 7D, 8, 9, and 10 are cross-sectional views shown along reference cross-section B-B in FIG. 15D. FIGS. 11A, 12A, 13A, 14A, 15A, and 16A are top-down views shown along reference cross-section A-A in FIG. 15D. FIGS. 11B, 12B, 13B, 14B, 15B, and 16B are top-down views shown along reference cross-section B-B in FIG. 15D and also along reference cross-section B-B in the corresponding "A" figure. FIGS. 15C and 16C are cross-sectional views shown along reference cross-section C-C in FIG. 15D and also along reference cross-section C-C in the corresponding "A" figure. A portion of the memory array 50 is illustrated. Some features, such as the staircase arrangement of the word lines (see FIG. 1A), are not shown in some figures for clarity of illustration.

In FIG. 2, a substrate 102 is provided. The substrate 102 may be any structure that will underly the memory array 50. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multilayered or gradient substrate may also be used. In some embodiments, the semiconductor material of the substrate 102 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof. The substrate 102 may include a dielectric material. For example, the substrate 102 may be a dielectric layer, or may include a dielectric layer on a semiconductor substrate. Acceptable dielectric materials for dielectric substrates include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. In some embodiments, the substrate 102 is formed of silicon carbide.

A multilayer stack 104 is formed over the substrate 102. The multilayer stack 104 includes alternating dielectric layers 106 and conductive layers 108. The multilayer stack 104 will be patterned in subsequent processing. As such, the materials of the dielectric layers 106 and the conductive layers 108 each have a high etching selectivity from the etching of the substrate 102. The patterned dielectric layers 106 will be used to isolate subsequently formed transistors. The patterned conductive layers 108 will function as word lines for the transistors, and will subsequently be recessed so that the channel regions of the transistors contact multiple surfaces of the word lines, thus providing three-dimensional channel regions for the transistors. As such, the material of the dielectric layers 106 also has a high etching selectivity from the etching of the material of the conductive layers 108.

The dielectric layers 106 may each be formed of an oxide such as silicon oxide, a nitride such as silicon nitride, a carbide such as silicon carbide, combinations thereof such as silicon oxynitride or silicon oxycarbide, or the like. The dielectric material of the dielectric layers 106 may be formed by an acceptable deposition process such as chemical vapor deposition (CVD), atomic layer deposition (ALD), or the like. A thickness of each of the dielectric layers 106 may be in the range of about 40 nm to about 50 nm.

The conductive layers 108 may each be formed of a metal such as such as tungsten, ruthenium, molybdenum, cobalt, aluminum, nickel, copper, silver, gold, or the like; a metal nitride such as titanium nitride, tantalum nitride, molybdenum nitride, zirconium nitride, hafnium nitride, or the like; alloys thereof; multilayers thereof; or the like. The conductive material of the conductive layers 108 may be formed by an acceptable deposition process such as physical vapor deposition (PVD), chemical vapor deposition (CVD), atomic layer deposition (ALD), or the like. A thickness of each of the conductive layers 108 may be in the range of about 40 nm to about 50 nm. In some embodiments, the conductive layers 108 are formed to a different thickness than the dielectric layers 106. For example, the conductive layers 108 can be formed to a greater thickness than the dielectric layers 106.

In the illustrated embodiment, the multilayer stack 104 includes four layers the dielectric layers 106 and three of the conductive layers 108. It should be appreciated that the multilayer stack 104 may include other quantities of the dielectric layers 106 and the conductive layers 108. The multilayer stack 104 can have an overall height in the range of about 1000 nm to about 10000 nm.

Figure 3:
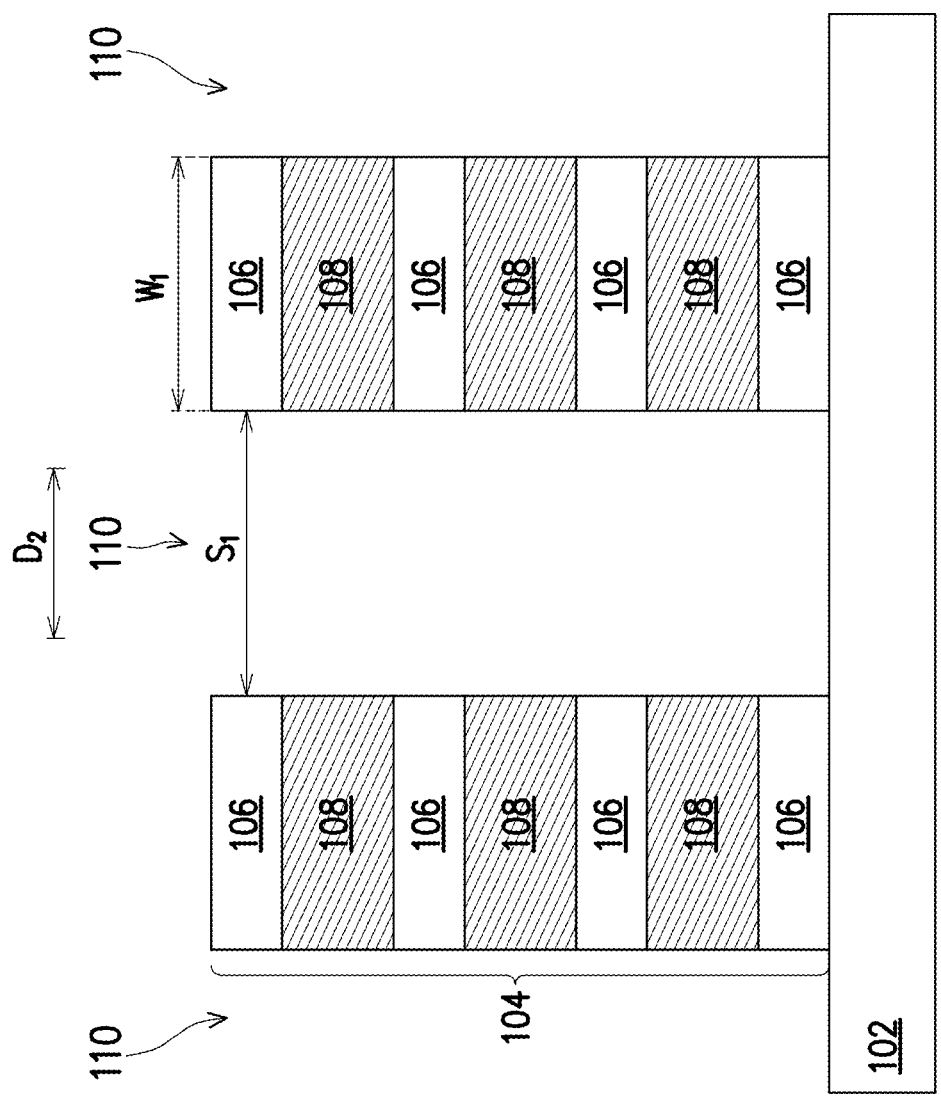

In FIG. 3, trenches 110 are formed in the multilayer stack 104. In the illustrated embodiment, the trenches 110 extend through the multilayer stack 104 and expose the substrate 102. In another embodiment, the trenches 110 extend through some but not all layers of the multilayer stack 104. The trenches 110 may be patterned using acceptable photolithography and etching techniques, such as with an etching process that is selective to the multilayer stack 104 (e.g., selectively removes the materials of the dielectric layers 106 and the conductive layers 108 at a faster rate than the material of the substrate 102). The patterning may be any acceptable etch process, such as a reactive ion etch (RIE), neutral beam etch (NBE), the like, or a combination thereof. The etching may be anisotropic. In embodiments where the substrate 102 is formed of silicon carbide, the dielectric layers 106 are formed of silicon oxide, and the conductive layers 108 are formed of tungsten, the trenches 110 can be formed by a dry etch using a fluorine-based gas (e.g., $CF_6$, $SF_6$, etc.) mixed with oxygen (O2) gas. After the patterning, respective patterned portions of the multilayer stack 104 are disposed between respective pairs of the trenches 110. Each patterned portion of the multilayer stack 104 has a width $W_1$ in the second direction $D_2$, which can be in the range of about 100 nm to about 120 nm. Further, each patterned portion of the multilayer stack 104 is separated by a separation distance $S_1$ in the second direction $D_2$, which can be in the range of about 75 nm to about 85 nm.

In some embodiments, the conductive layers 108 are formed by another process. For example, the multilayer stack 104 can instead include alternating dielectric layers 106 and sacrificial layers. The sacrificial layers may be formed of a different material than the dielectric layers 106. After the trenches 110 are formed in the multilayer stack 104, the sacrificial layers can be replaced with the conductive layers 108. For example, the sacrificial layers can be removed with an etching process that selectively etches the material of the sacrificial layers at a faster rate than the material of the dielectric layers 106. One or more layers of conductive material can then be conformally deposited in the resulting openings, e.g., between the dielectric layers 106. A removal process, such as an anisotropic etch, can be performed to remove the portions of the conductive material that are not between the dielectric layers 106 (e.g., those portions in the trenches 110), with the remaining portions of the conductive material between the dielectric layers 106 defining the conductive layers 108.

Figure 4:
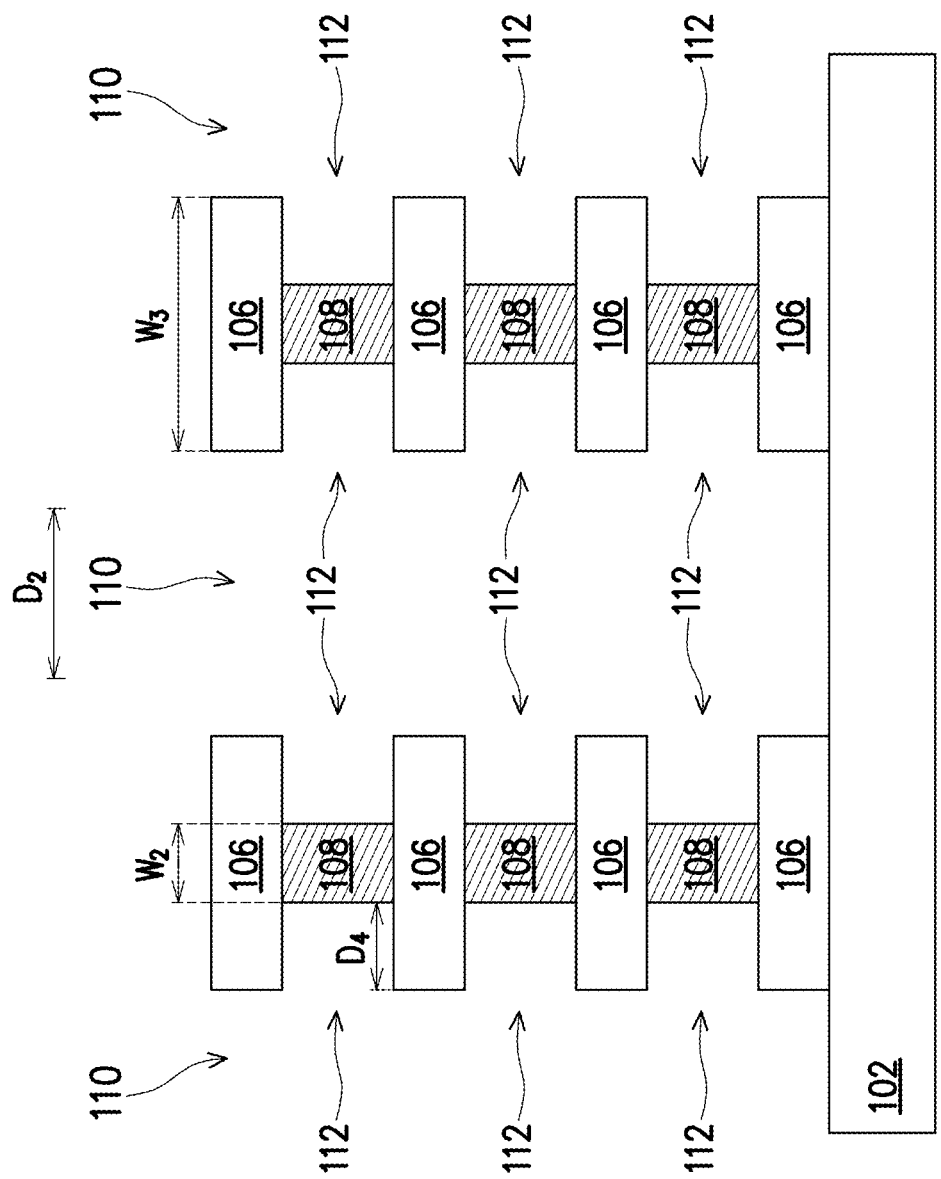

In FIG. 4, the trenches 110 are expanded to form sidewall recesses 112. Specifically, portions of the sidewalls of the conductive layers 108 exposed by the trenches 110 are recessed from the portions of the sidewalls of the dielectric layers 106 exposed by the trenches 110 to form the sidewall recesses 112. Although sidewalls of the conductive layers 108 are illustrated as being straight, the sidewalls may be concave or convex. The sidewall recesses 112 may be formed by an acceptable etching process, such as one that is selective to the material of the conductive layers 108 (e.g., selectively removes the material of the conductive layers 108 at a faster rate than the material(s) of the dielectric layers 106 and the substrate 102). The etching may be isotropic. In embodiments where the substrate 102 is formed of silicon carbide, the dielectric layers 106 are formed of silicon oxide, and the conductive layers 108 are formed of tungsten, the trenches 110 can be expanded by a wet etch using dilute hydrofluoric acid (dHF) and nitric acid ($HNO_3$).

After formation, the sidewall recesses 112 have a depth $D_4$ in the second direction $D_2$, extending past the sidewalls of the dielectric layers 106. Timed etch processes may be used to stop the etching of the sidewall recesses 112 after the sidewall recesses 112 reach a desired depth $D_4$. For example, when the sidewall recesses 112 are formed by a wet etch using dHF and $HNO_3$, the wet etch can be performed for a duration in the range of about 10 seconds to about 120 seconds, which can result in the sidewall recesses 112 having a depth $D_4$ in the range of about 20 nm to about 60 nm. Forming the sidewall recesses 112 exposes the top and bottom surfaces of the dielectric layers 106. After the sidewall recesses 112 are formed, the remaining portions of the conductive layers 108 have a width $W_2$ in the second direction $D_2$, which can be in the range of about 10 nm to about 200 nm, and the dielectric layers have a width $W_3$ in the second direction $D_2$, which can be in the range of about 50 nm to about 320 nm. Forming the sidewall recesses 112 can reduce the widths of the conductive layers 108 by about 5% to about 40%.

Figure 5:
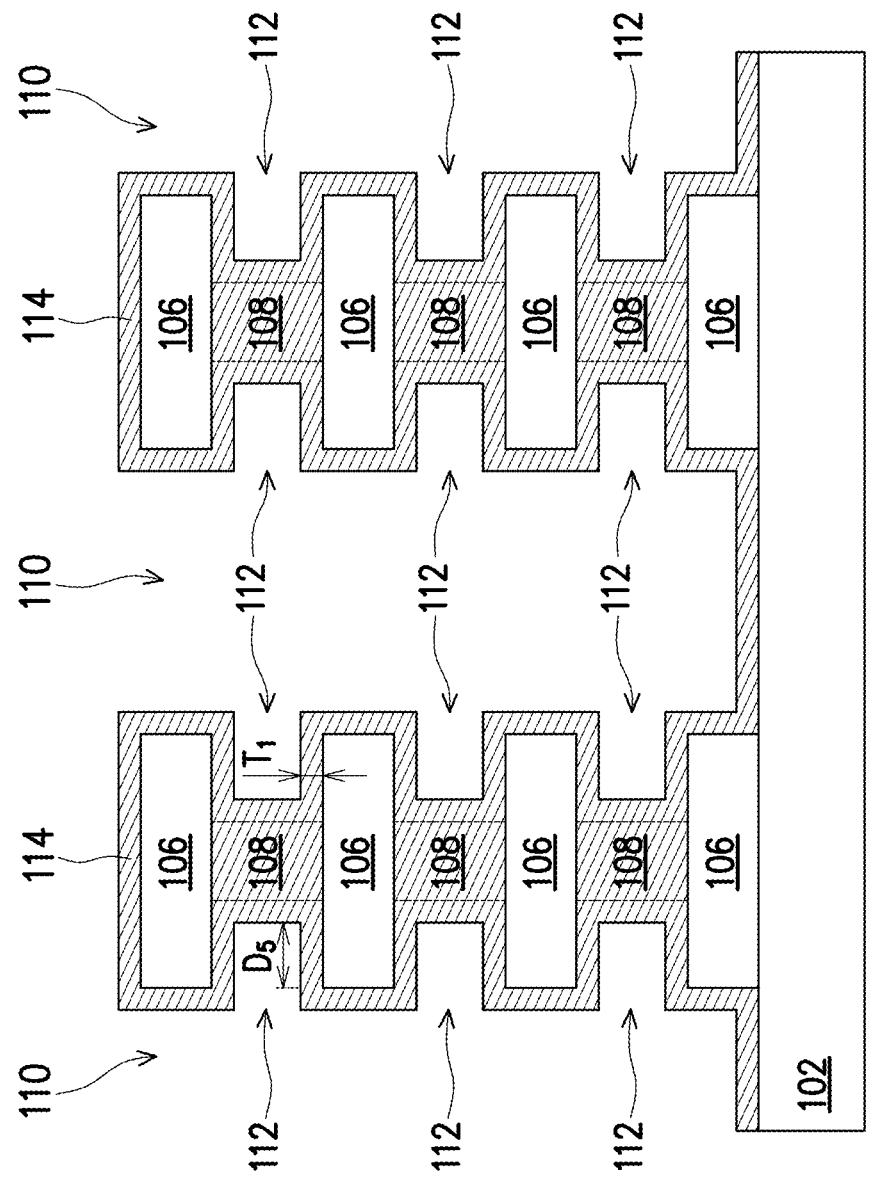

In FIG. 5, a conductive layer 114 is conformally formed in the trenches 110 and the sidewall recesses 112. The conductive layer 114 may be formed of a metal such as such as tungsten, ruthenium, molybdenum, cobalt, aluminum, nickel, copper, silver, gold, or the like; a metal nitride such as titanium nitride, tantalum nitride, molybdenum nitride, zirconium nitride, hafnium nitride, or the like; alloys thereof; multilayers thereof; or the like. The conductive material of the conductive layer 114 may be formed by an acceptable deposition process such as chemical vapor deposition (CVD), atomic layer deposition (ALD), or the like. In some embodiments, the conductive layer 114 is formed of the same conductive material as the conductive layers 108. For example, the conductive layers 108, 114 can each be formed of tungsten. In some embodiments, the conductive layer 114 is formed of a different conductive material than the conductive layers 108. For example, the conductive layers 108 can each be formed of tungsten and the conductive layer 114 can be formed of titanium nitride or tantalum nitride.

The conductive layer 114 lines but does not completely fill (e.g., only partially fills) each of the sidewall recesses 112. After they are lined, the sidewall recesses 112 have a depth $D_5$ in the second direction $D_2$, extending past the sidewalls of the dielectric layers 106. The depth $D_5$ is smaller than the depth $D_4$ (discussed above for FIG. 4). The thickness $T_1$ of the conductive layer 114 is controlled so that the remaining portions of the sidewall recesses 112 have a desired depth $D_5$. For example, the thickness $T_1$ of the conductive layer 114 may be in the range of about 5 nm to about 20 nm, which can result in the remaining portions of the sidewall recesses 112 having a depth $D_5$ in the range of about 10 nm to about 50 nm.

Figure 6:
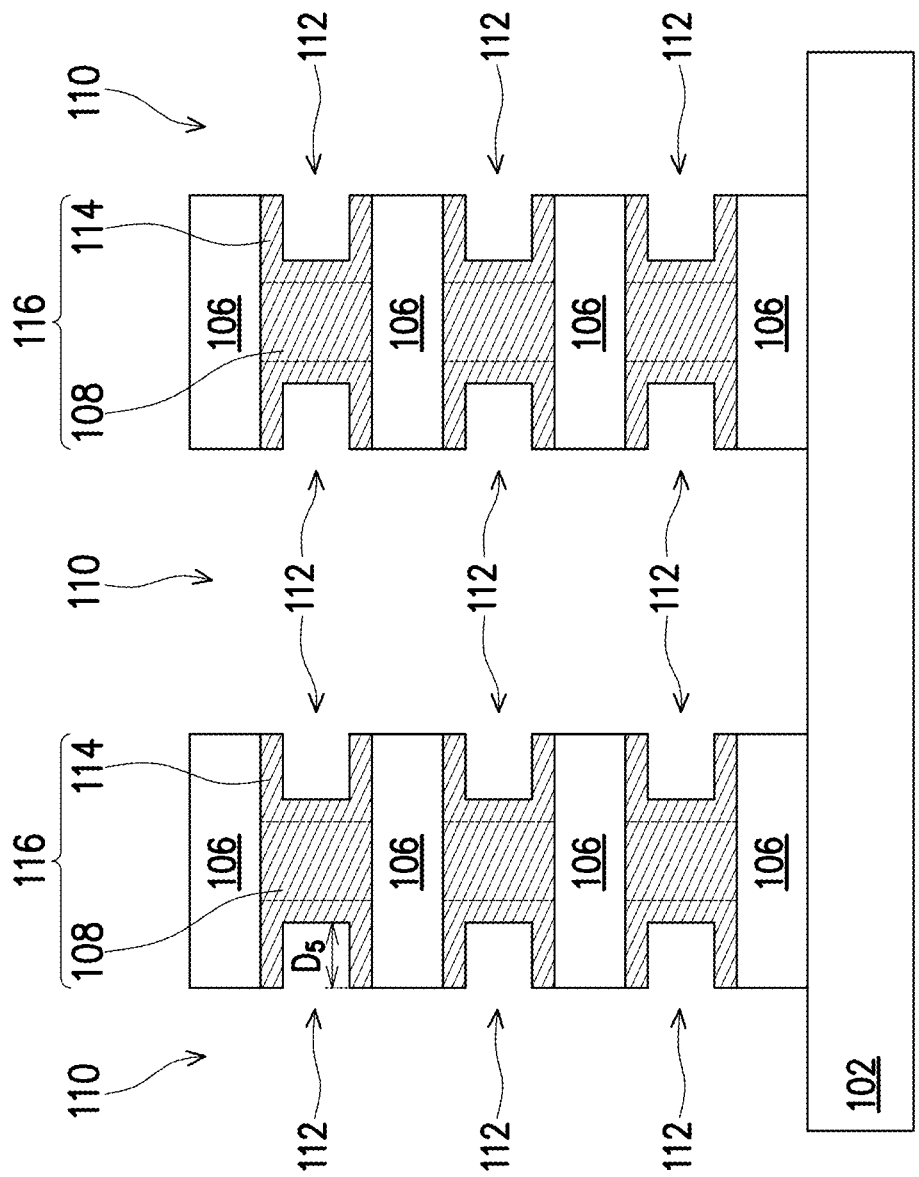

In FIG. 6, the conductive layer 114 is patterned to remove the portions of the conductive layer 114 outside of the sidewall recesses 112, such as the portions of the conductive layer 114 on the sidewalls of the dielectric layers 106, the top surfaces of the dielectric layer 106, and the top surface of the substrate 102. The patterning may be any acceptable etch process, such as a reactive ion etch (RIE), neutral beam etch (NBE), the like, or a combination thereof. The etching may be anisotropic. For example, the etching may include a dry etch using a fluorine-based gas (e.g., $CF_6$, $SF_6$, etc.) mixed with oxygen ($O_2$) gas.

After the patterning, the remaining portions of the conductive layers 108, 114 constitute word lines 116. In other words, the patterning defines the word lines 116, with each word line 116 including a conductive layer 108 and patterned portions of a conductive layer 114. In embodiments where the conductive layer 114 is formed of the same conductive material as the conductive layers 108, the various conductive layers of the word lines 116 may merge such that no discernable interfaces exist between them. In embodiments where the conductive layer 114 is formed of a different conductive material than the conductive layers 108, the various conductive layers of the word lines 116 may not merge such that discernable interfaces exist between them. Thus, each word line 116 can be a single conductive material that extends continuously between the outer sidewalls of the word line 116, or can include multiple conductive materials (e.g., adjacent one another) that extend discontinuously between the outer sidewalls of the word line 116.

After the word lines 116 are formed, the sidewall recesses 112 extend into the word lines 116. The sidewall recesses 112 may extend into the word lines 116 along the entire lengths of the word lines 116. The sidewall recesses 112 retain the depth $D_5$ (discussed above for FIG. 5) in the second direction $D_2$, extending past the outer sidewalls of the word lines 116 and the dielectric layers 106. As discussed in greater detail below, one or more layers providing channel regions for the subsequently formed transistors are formed in the sidewall recesses 112, thus allowing the layers to contact a greater quantity of surfaces of the word lines 116 than planar transistors.

FIGS. 7A, 7B, 7C, and 7D are details views of word lines 116, in accordance with various embodiments. The word lines 116 have I-beam shapes, with each including a main portion 116M and plurality of (e.g., four) projecting portions 116P. Two pairs of the projecting portions 116P extend away from opposite sides of the main portion 116M. The main portion 116M can have a width $W_4$ in the range of about 20 nm to about 240 nm, and a thickness $T_2$ in the range of about 30 nm to about 200 nm. Each of the projecting portions 116P can have a width $W_5$ in the range of about 10 nm to about 50 nm, and an average thickness $T_3$ in the range of about 5 nm to about 30 nm. The thickness $T_3$ is smaller than the thickness $T_2$, such as from about 5% to about 30% of thickness $T_2$.

Each word line 116 has an outer sidewall $116S_1$ (corresponding to a sidewall of a projecting portion 116P) and an inner sidewall $116S_2$ (corresponding to a sidewall of a main portion 116M). The inner sidewalls $116S_2$ are recessed from the outer sidewalls $116S_1$, as well as from the sidewalls of the dielectric layers 106 (see FIG. 6). Each outer sidewall $116S_1$ is connected to a corresponding inner sidewall $116S_2$ by a connecting surface $116S_3$.

Figure 7A:
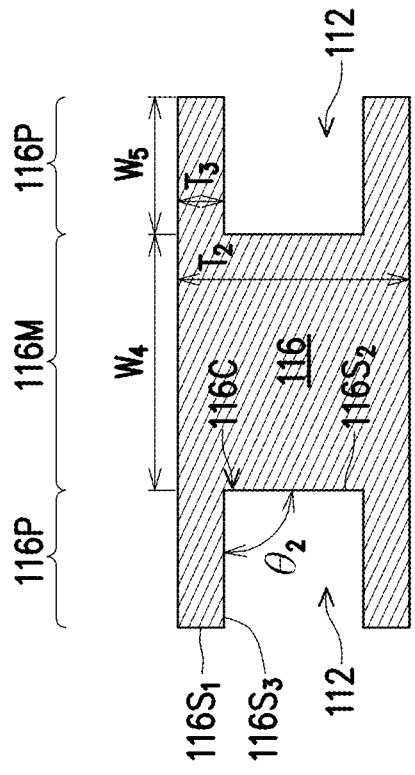
Figure 7B:
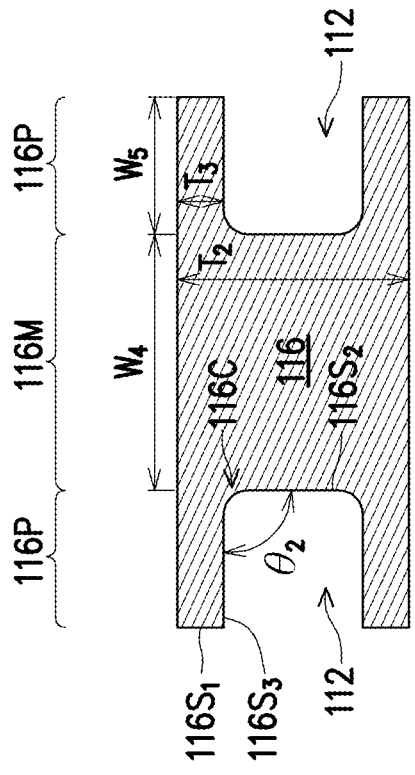
Figure 7C:
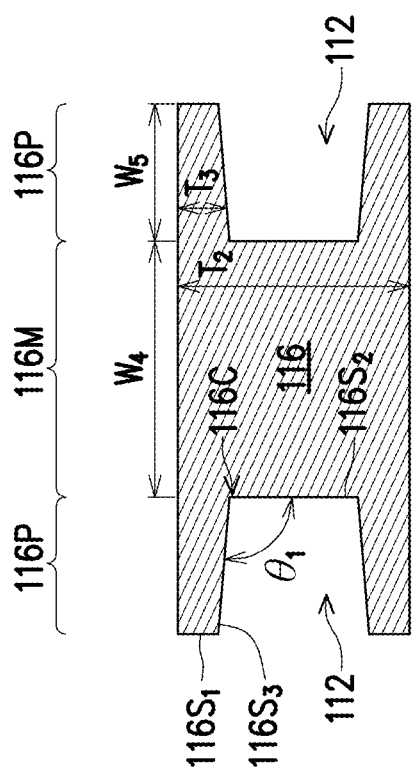
Figure 7D:
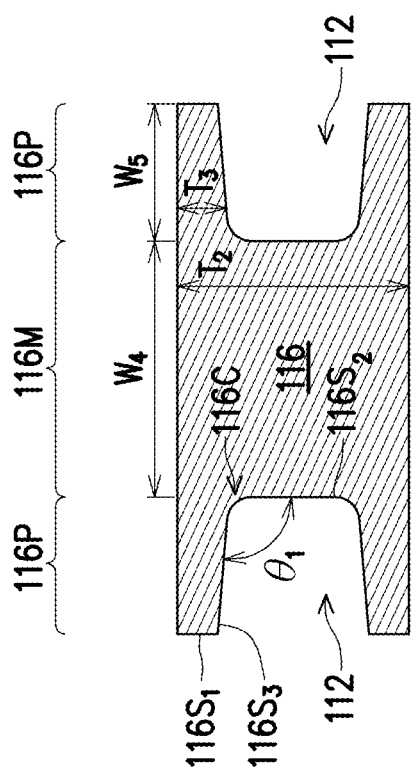

The sidewall recesses 112 can have several different profile shapes. In the embodiments of FIGS. 7A and 7B, the sidewall recesses 112 have trapezoidal profile shapes, where each connecting surface $116S_3$ forms an obtuse angle $\theta_1$ with a corresponding inner sidewall $116S_2$. The obtuse angle $\theta_1$ can be in the range of about 92 degrees to about 98 degrees. Each connecting surface $116S_3$ similarly forms an obtuse angle with a corresponding outer sidewall $116S_1$. In the embodiments of FIGS. 7C and 7D, the sidewall recesses 112 have rectangular profile shapes, where each connecting surface $116S_3$ forms a right angle $\theta_2$ with a corresponding inner sidewall $116S_2$. Each connecting surface $116S_3$ similarly forms a right angle with a corresponding outer sidewall $116S_1$.

The sidewall recesses 112 have inner corners 116C at the intersections of the outer sidewalls $116S_2$ and the connecting surfaces $116S_3$. The inner corners 116C can have several different corner shapes. In the embodiments of FIGS. 7A and 7C, the inner corners 116C of the sidewall recesses 112 have sharp corner shapes. Sharp corner shapes are those formed by an arc having a length of less than about 3% of the thickness $T_2$ of the word lines 116, such as an arc length in the range of about 1.2 nm to about 1.5 nm. In the embodiments of FIGS. 7B and 7D, the inner corners 116C of the sidewall recesses 112 have rounded corner shapes. Rounded corner shapes are those formed by an arc having a length of greater than about 3% of the thickness $T_2$ of the word lines 116, such as a length in the range of about 1.2 nm to about 1.5 nm.

The different profile shapes and inner corner shapes of the sidewall recesses 112 may be determined by the etching selectivity between the material of the dielectric layers 106 and the material of the conductive layer 114 during the etching process used to remove the portions of the conductive layer 114 outside of the sidewall recesses 112 (discussed above for FIG. 6). The sidewall recesses 112 can be formed with trapezoidal profile shapes and/or rounded corner shapes by performing the etching with a low etching selectivity, such as an etching process that selectively removes the material of the conductive layer 114 from about 2 to about 5 times faster than the material of the dielectric layers 106. The sidewall recesses 112 can be formed with rectangular profile shapes and/or sharp corner shapes by performing the etching with a high etching selectivity, such as an etching process that selectively removes the material of the conductive layer 114 from about 5 to about 20 times faster than the material of the dielectric layers 106.

As discussed in greater detail below, channel regions of subsequently formed transistors will extend along and contact each of the surfaces $116S_1$, $116S_2$, $116S_3$ of the word lines 116, thus providing three-dimensional channel regions for the transistors. Such channel regions will be formed by forming film stacks for the transistors in the sidewall recesses 112, e.g., between pairs of the projecting portion 116P. At least memory layers (discussed further below for FIG. 8) will be disposed between the projecting portions 116P. In some embodiments, semiconductor layers (discussed further below for FIG. 9) are also disposed between the projecting portions 116P. In some embodiments, isolation regions (discussed further below for FIGS. 11A and 11B) are also disposed between the projecting portions 116P. In some embodiments, conductive lines (discussed further below for FIG. 18B) are also disposed between the projecting portions 116P.

Figure 8:
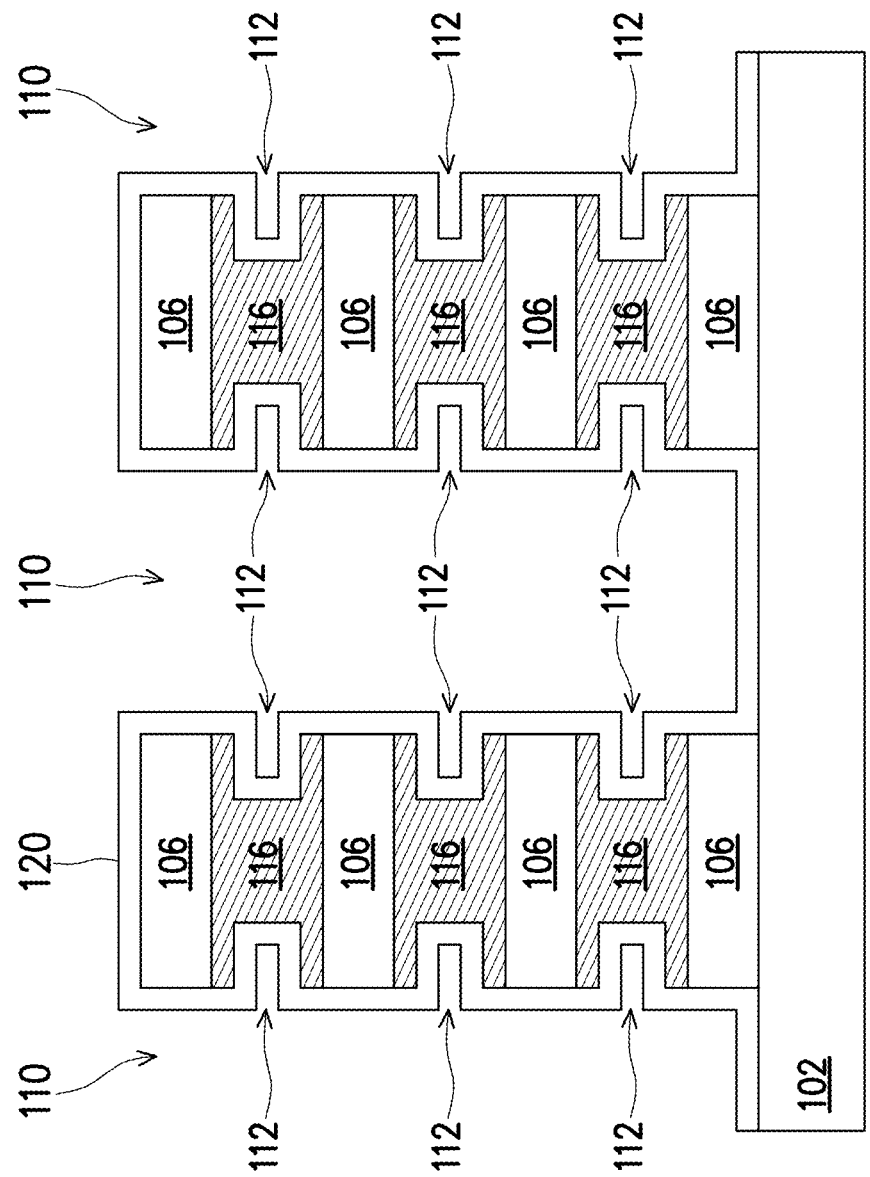

In FIG. 8, a memory layer 120 is conformally formed in the trenches 110 and the sidewall recesses 112. The memory layer 120 only partially fills the sidewall recesses 112. The memory layer 120 will be subsequently patterned to form a plurality of memory layers (also referred to as data storage layers). The memory layer 120 is formed of an acceptable material for storing digital values in the transistors. In some embodiments, the memory layer 120 is formed of a high-k ferroelectric material, such as hafnium zirconium oxide (HfZrO); zirconium oxide (ZrO); hafnium oxide (HfO) doped with lanthanum (La), silicon (Si), aluminum (Al), or the like; undoped hafnium oxide (HfO); or the like. In some embodiments, the memory layer 120 includes one or more low-k dielectric materials, such as silicon nitride, silicon oxide, silicon oxynitride, or the like. The material of the memory layer 120 may be formed by an acceptable deposition process such as ALD, CVD, physical vapor deposition (PVD), or the like. In some embodiments, the memory layer 120 is HfZrO deposited by ALD. The memory layer 120 can have a thickness in the range of about 9 nm to about 11 nm.

Figure 9:
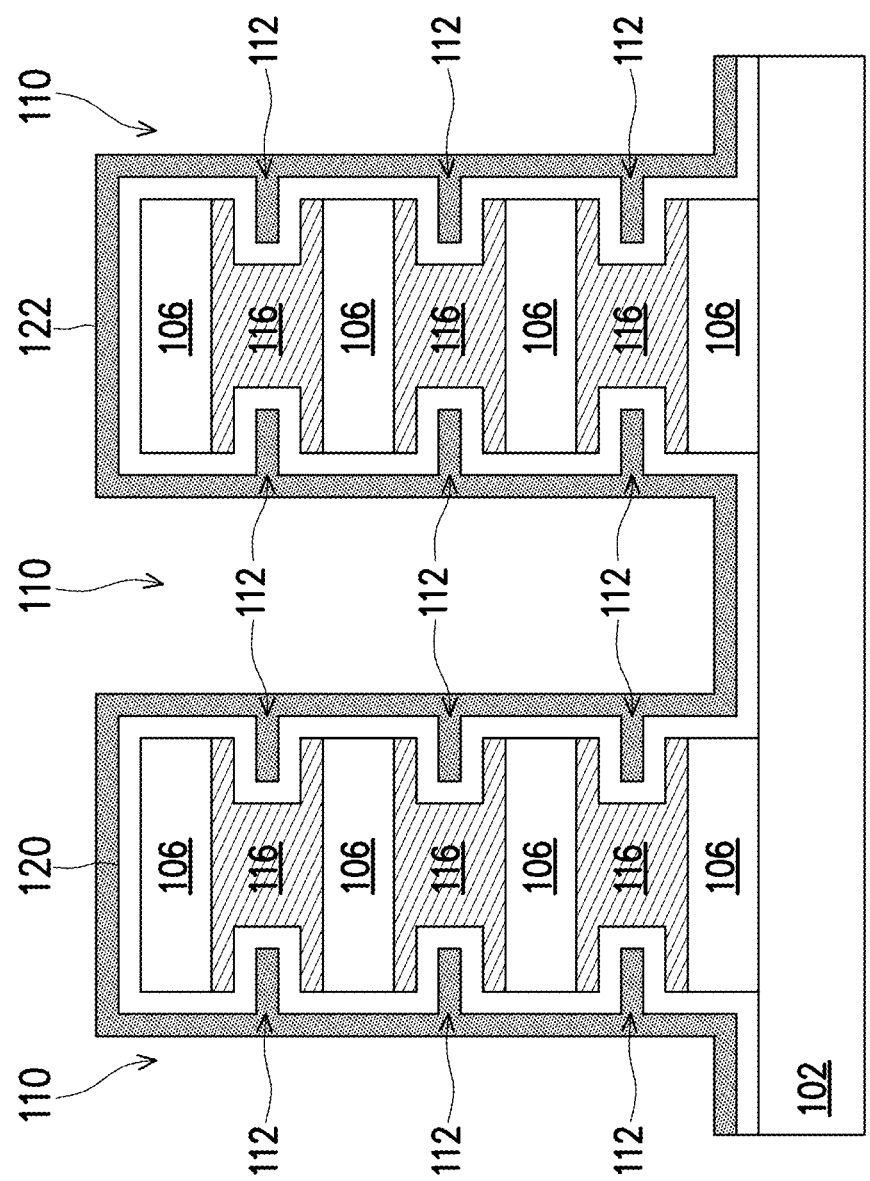

In FIG. 9, a semiconductor layer 122 is conformally formed on the memory layer 120, e.g., in the trenches 110 and the sidewall recesses 112. In this embodiment, the semiconductor layer 122 completely fills the remaining portions of the sidewall recesses 112 that are not filled by the memory layer 120. In another embodiment (discussed further below for FIG. 20), the memory layer 120 and the semiconductor layer 122 both only partially fill the sidewall recesses 112. The semiconductor layer 122 will be subsequently patterned to form a plurality of semiconductor layers (also referred to as channel layers). The semiconductor layer 122 is formed of an acceptable semiconductor material for providing channel regions for the transistors, such as indium gallium zinc oxide (IGZO), indium tin oxide (ITO), indium gallium zinc tin oxide (IGZTO), zinc oxide (ZnO), polysilicon, amorphous silicon, or the like. The material of the semiconductor layer 122 may be formed by an acceptable deposition process such as ALD, CVD, PVD, or the like. In some embodiments, the semiconductor layer 122 is IGZTO deposited by ALD. The semiconductor layer 122 can have a thickness in the range of about 9 nm to about 11 nm.

Figure 10:
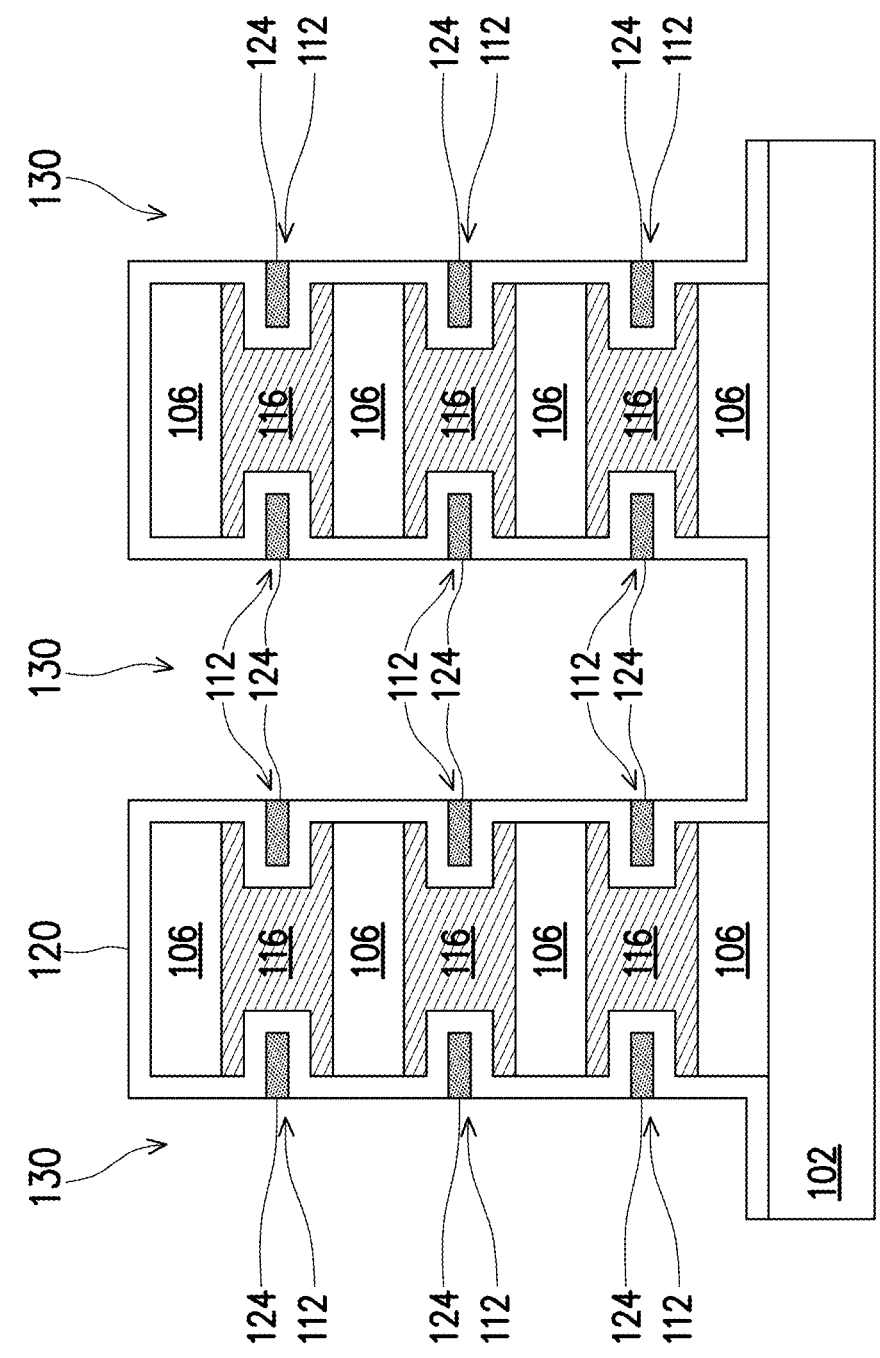

In FIG. 10, the semiconductor layer 122 is patterned to form semiconductor layers 124. The semiconductor layer 122 is etched to remove the portions of the semiconductor layer 122 at the bottoms of the trenches 110, such as the portions of the semiconductor layer 122 on the substrate 102, thus exposing the substrate 102 and separating the semiconductor layers 124 of horizontally adjacent transistors. The patterning may be any acceptable etch process, such as a reactive ion etch (RIE), neutral beam etch (NBE), the like, or a combination thereof. The etching may be anisotropic. In this embodiment, the etching is performed to also remove the portions of the semiconductor layer 122 outside of the sidewall recesses 112, such as the portions of the semiconductor layer 122 on the outer sidewalls of the memory layer 120, thus exposing the outer sidewalls of the memory layer 120 and separating the semiconductor layers 124 of vertically adjacent transistors. In some other embodiments (discussed further below for FIGS. 19 and 20), the etching is only performed to remove the portions of the semiconductor layer 122 at the bottoms of the trenches 110, such that the portions of the semiconductor layer 122 on the outer sidewalls of the memory layer 120 remain. The amount of the semiconductor layer 122 removed may be determined by the duration of the etching process, with longer etching processes removing more of the semiconductor layer 122.

Figure 11B:
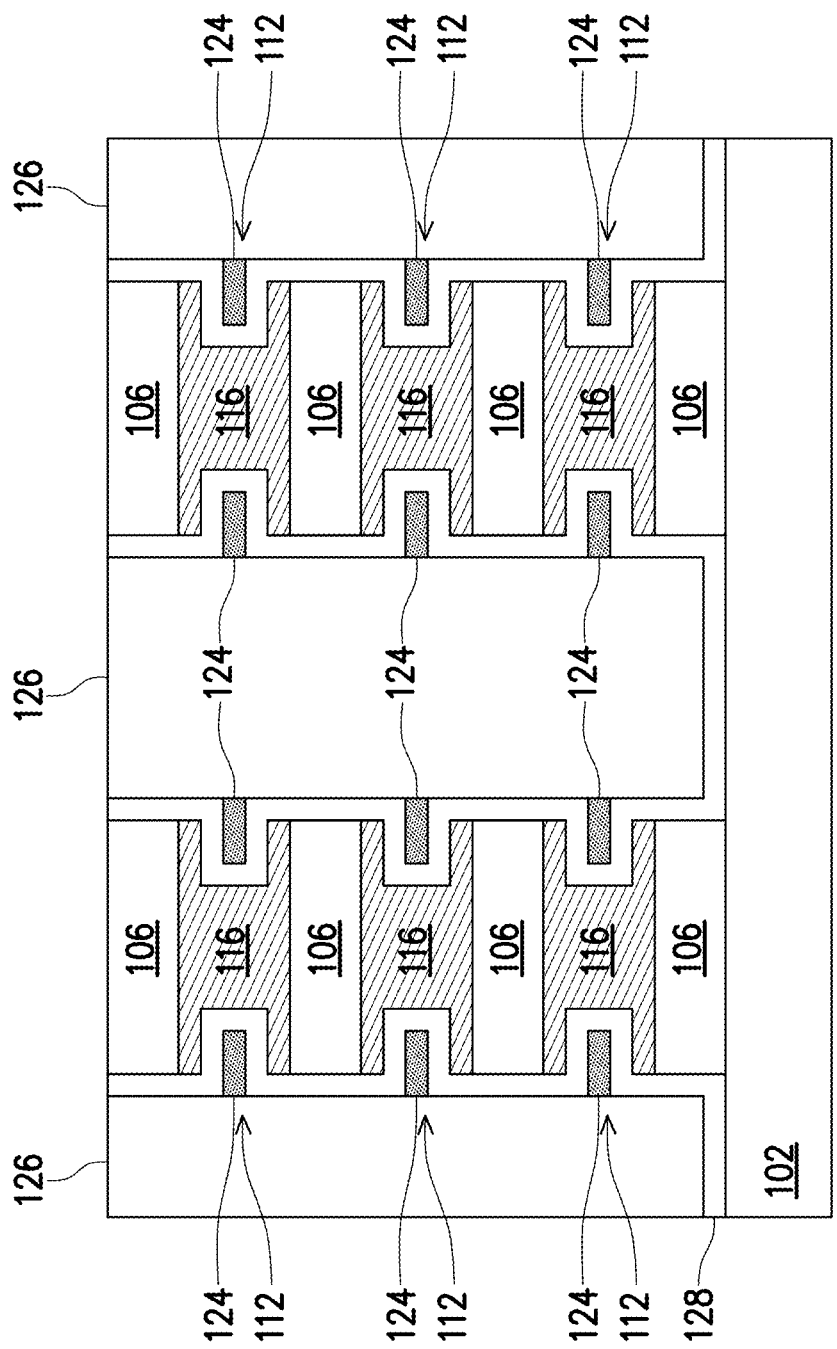

In FIGS. 11A and 11B, isolation regions 126 are formed to fill the remaining portions of the trenches 110. In embodiments where the sidewall recesses 112 are not completely filled by the semiconductor layers 124 (discussed further below for FIG. 20), the isolation regions 126 are also formed to fill the remaining portions of the sidewall recesses 112. In embodiments where the semiconductor layers 124 are confined to the sidewall recesses 112, the isolation regions 126 extend along and contact both the semiconductor layers 124 and the memory layers 128. In embodiments where the semiconductor layers 124 extend outside of the sidewall recesses 112, the isolation regions 126 are separated from the memory layers 128 by the semiconductor layers 124. The isolation regions 126 are formed of an insulating material that can protect and electrically isolate the underlying semiconductor layers 124 and memory layer 120. Acceptable dielectric materials include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. The material of the isolation regions 126 may be formed by an acceptable deposition process such as ALD, CVD, flowable CVD (FCVD), or the like.

In some embodiments, after the isolation material of the isolation regions 126 is formed in the trenches 110, a removal process is applied to the various layers to remove excess materials over the topmost dielectric layer 106/word line 116. The removal process may be a planarization process such as a chemical mechanical polish (CMP), an etch-back, combinations thereof, or the like. The portions of the isolation material and the memory layer 120 remaining in the trenches 110 form the isolation regions 126 and memory layers 128, respectively. The planarization process exposes the topmost dielectric layer 106/word line 116 such that top surfaces of the topmost dielectric layer 106/word line 116, the semiconductor layers 124, the isolation regions 126, and the memory layers 128 are coplanar (within process variations) after the planarization process.

At least the semiconductor layers 124 and the memory layers 128 have portions in the sidewall recesses 112. The isolation regions 126 may also have portions in the sidewall recesses 112 (discussed further below for FIG. 20). These features may extend into the sidewalls of the word lines 116 along the entire lengths of the word lines 116. The semiconductor layers 124 and the memory layers 128 thus extend along multiple surfaces of the word lines 116, thus providing three-dimensional channel regions 124C (see FIGS. 15A and 16A) for the transistors. By increasing the contacted area of the word lines 116, the lengths of the channel regions 124C for the transistors may thus be increased, thereby improving the performance and efficiency of the transistor as compared to transistors with planar channel regions. For example, three-dimensional channel regions can produce a greater electric field with lower gate voltages, a smaller on-current ($I_{ON}$), improved on-off current ratios, and less leakage than planar channel regions. Increasing the electric field in the channel regions can help improve the write speed of the memory array 50.

Figure 12A:
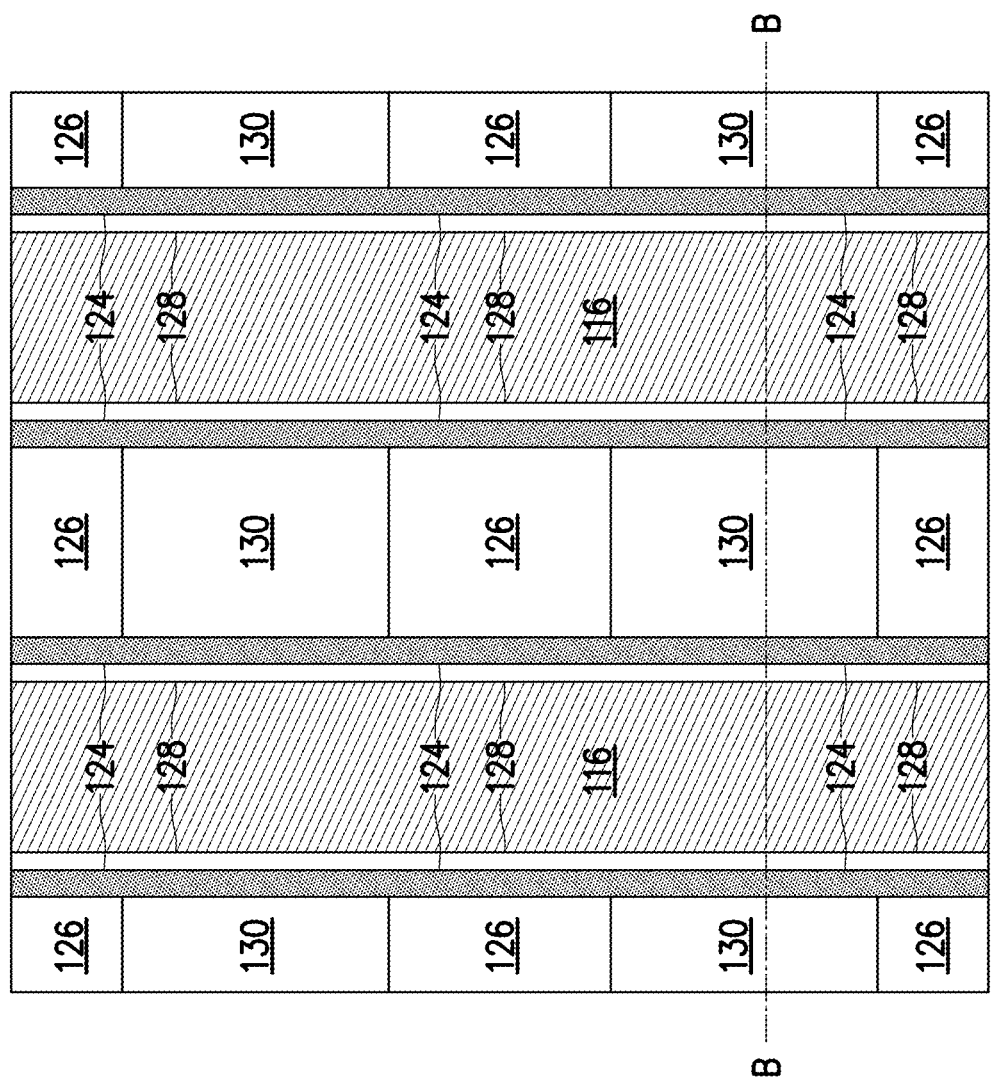
Figure 12B:
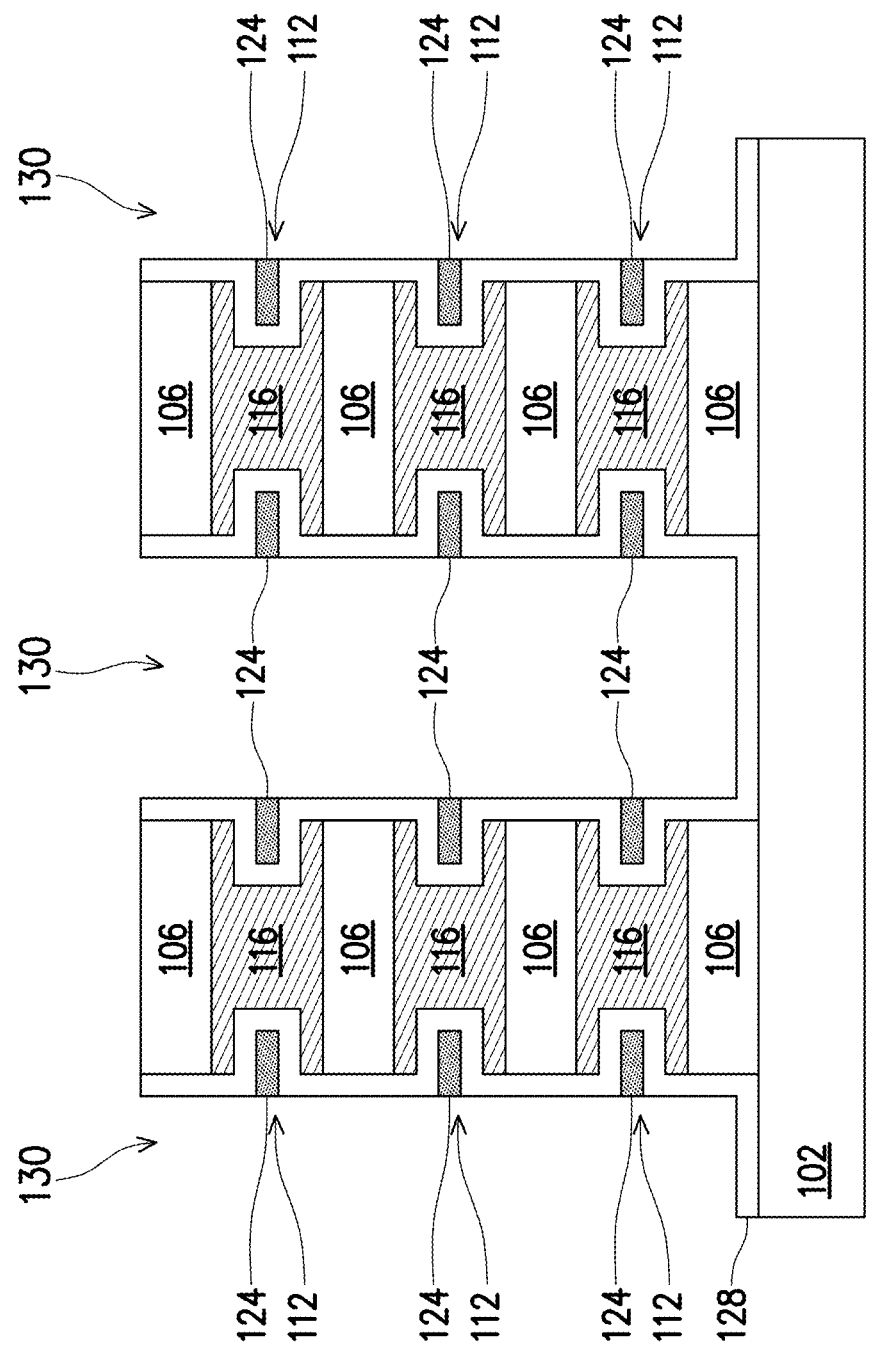

In FIGS. 12A and 12B, openings 130 for conductive lines are formed through the isolation regions 126. The openings 130 may be formed with an etching process that is selective to the isolation regions 126 (e.g., selectively removes the material of the isolation regions 126 at a faster rate than the materials of the semiconductor layers 124 and/or the memory layers 128). For example, the openings 130 may be formed through the isolation regions 126 by a dry etch using ammonia ($NH_3$) and hydrogen fluoride (HF) gas, which may be performed using an etching mask having a pattern of the subsequently formed conductive lines. In this embodiment, the etch is not selective to the material of the semiconductor layers 124, and the portions of the semiconductor layers 124 in the openings 130 remain after etching. Thus, the sidewall recesses 112 remain filled after the etching so that the subsequently formed conductive lines do not extend into the sidewall recesses 112 (discussed further below for FIG. 18A). In another embodiment, the etch is also selective to the material of the semiconductor layers 124, and the portions of the semiconductor layers 124 in the openings 130 are removed after etching so that the openings 130 extend laterally into the semiconductor layers 124. Thus, the sidewall recesses 112 can be partially reformed so that the subsequently formed conductive lines also extend into the sidewall recesses 112 (discussed further below for FIG. 18B).

Figure 13A:
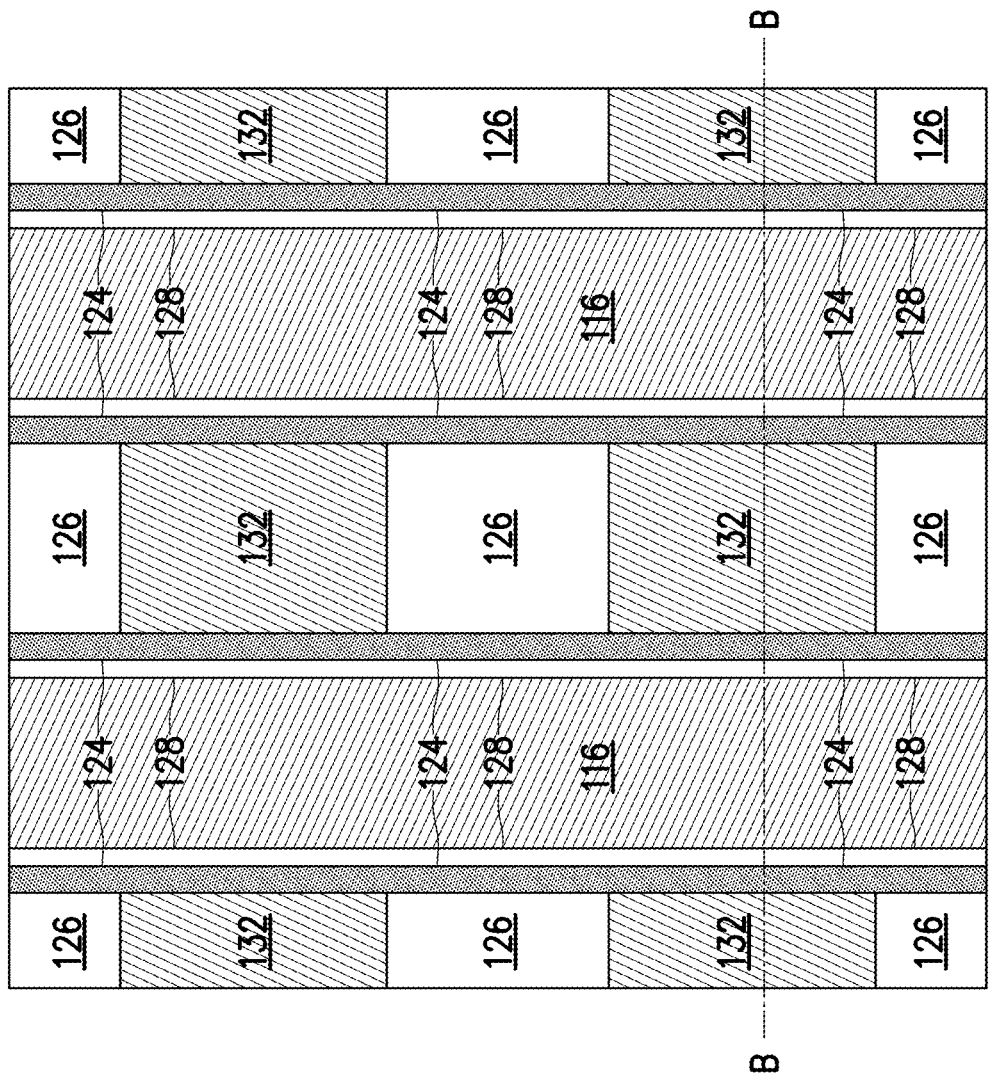
Figure 13B:
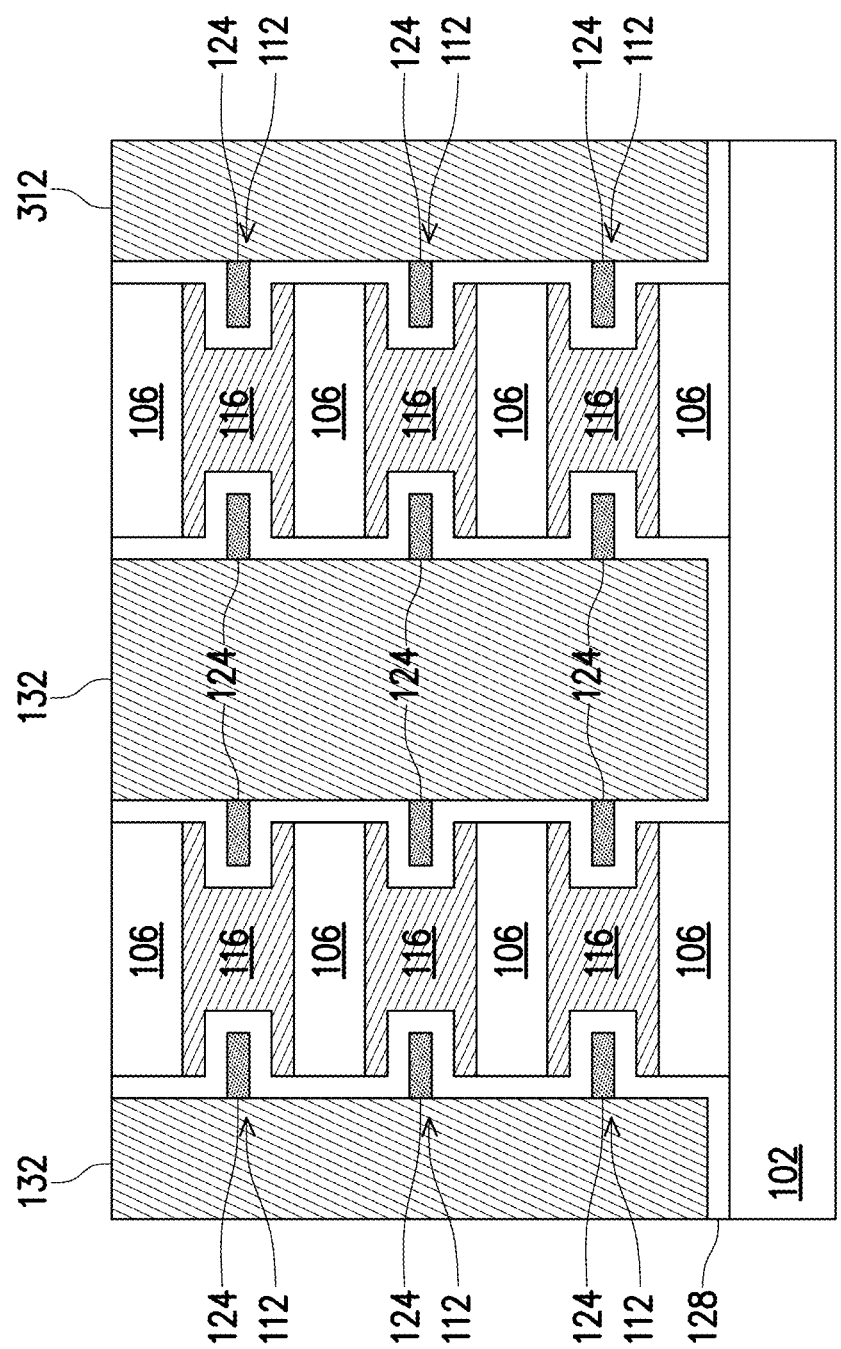

In FIGS. 13A and 13B, conductive lines 132 are formed in the openings 130. The conductive lines 132 thus extend through the isolation regions 126. As discussed in greater detail below, the conductive lines 132 are columns that will be divided into bit lines and source lines for the transistors. The bit lines and the source lines also act as source/drain regions of the transistors. As such, the conductive lines 132 are formed in contact with at least the semiconductor layers 124, so that the bit lines and the source lines will adjoin the channel regions 124C (see FIGS. 15A and 16A) of the transistors. In embodiments where the semiconductor layers 124 are confined to the sidewall recesses 112, the conductive lines 132 (and thus the subsequently formed bit lines and source lines) extend along and contact both the semiconductor layers 124 and the memory layers 128. In embodiments where the semiconductor layers 124 extend outside of the sidewall recesses 112, the conductive lines 132 (and thus the subsequently formed bit lines and source lines) are separated from the memory layers 128 by the semiconductor layers 124.

As an example to form the conductive lines 132, a liner, such as a diffusion barrier layer, an adhesion layer, or the like, and a main layer are formed in the openings 130. The liner may be formed of a conductive material such as titanium, titanium nitride, tantalum, tantalum nitride, or the like, which may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The main layer may be formed of a conductive material such as tungsten, cobalt, ruthenium, aluminum, nickel, copper, a copper alloy, silver, gold, or the like, which may be deposited by ALD, CVD, PVD, or the like. In some embodiments, the conductive lines 132 include a liner formed of titanium nitride and a main layer formed of tungsten. A removal process is then applied to the various layers to remove excess material(s) of the conductive lines 132 over the memory layers 128, the isolation regions 126, the semiconductor layers 124, and the topmost dielectric layer 106/word line 116. The removal process may be a planarization process such as a chemical mechanical polish (CMP), an etch-back, combinations thereof, or the like. The remaining material(s) form the conductive lines 132 in the openings 130.

Figure 14A:
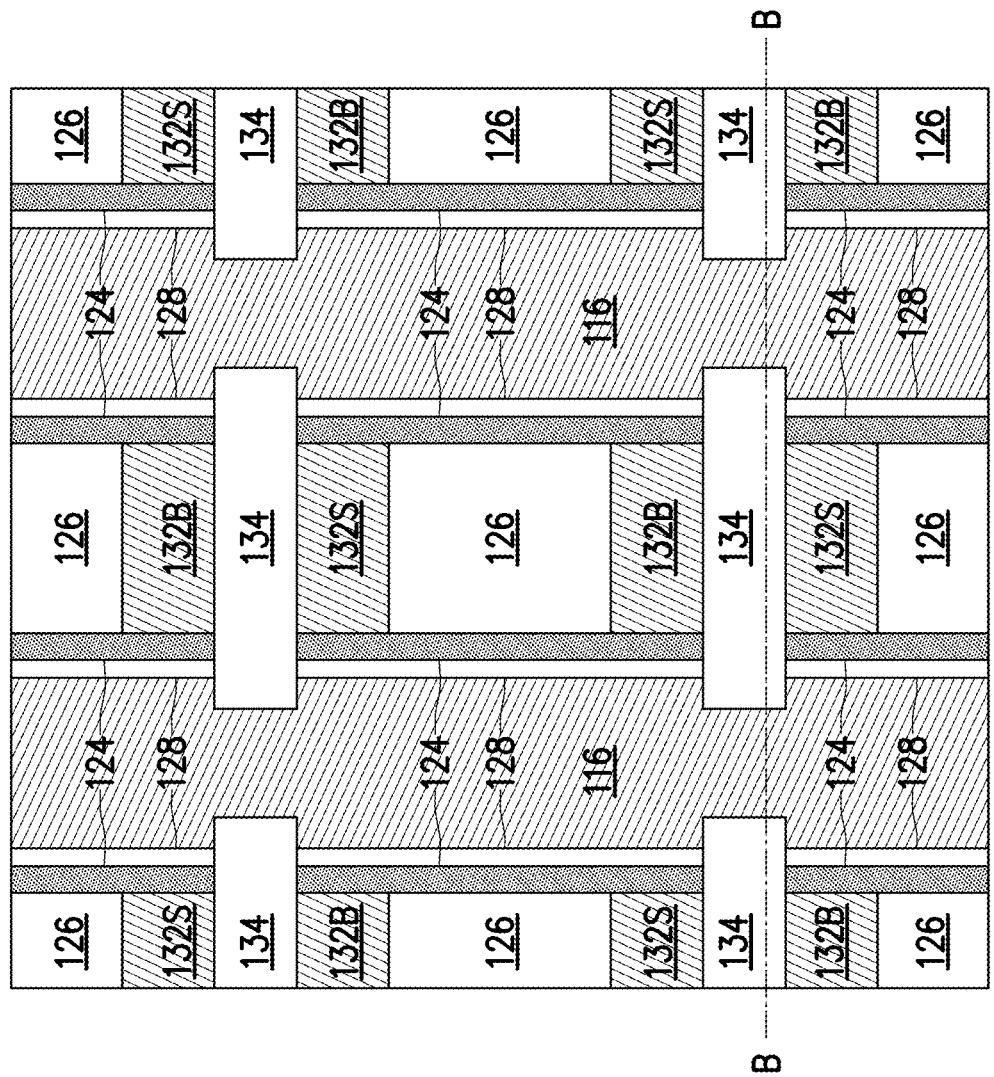
Figure 14B:
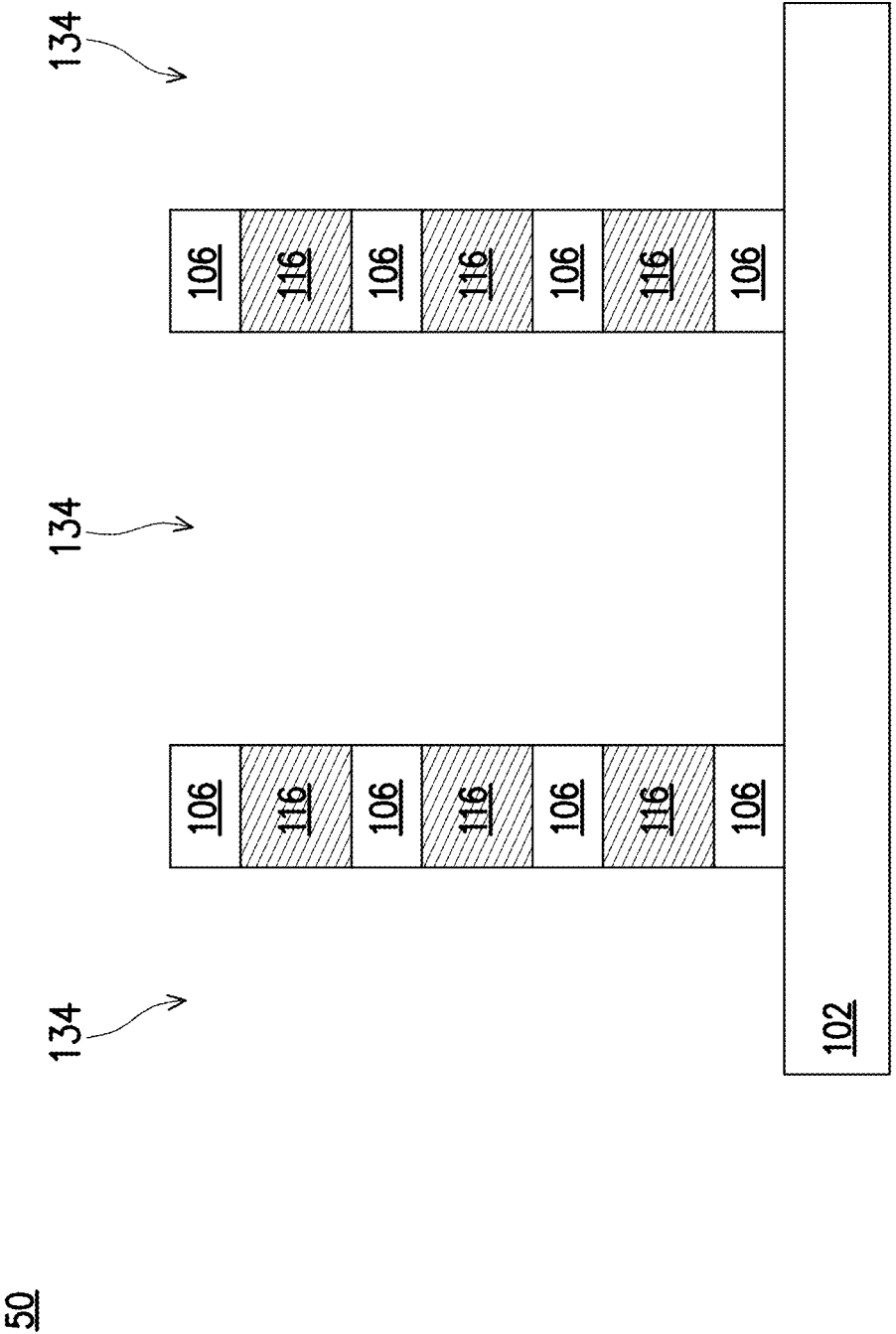
Figure 15A:
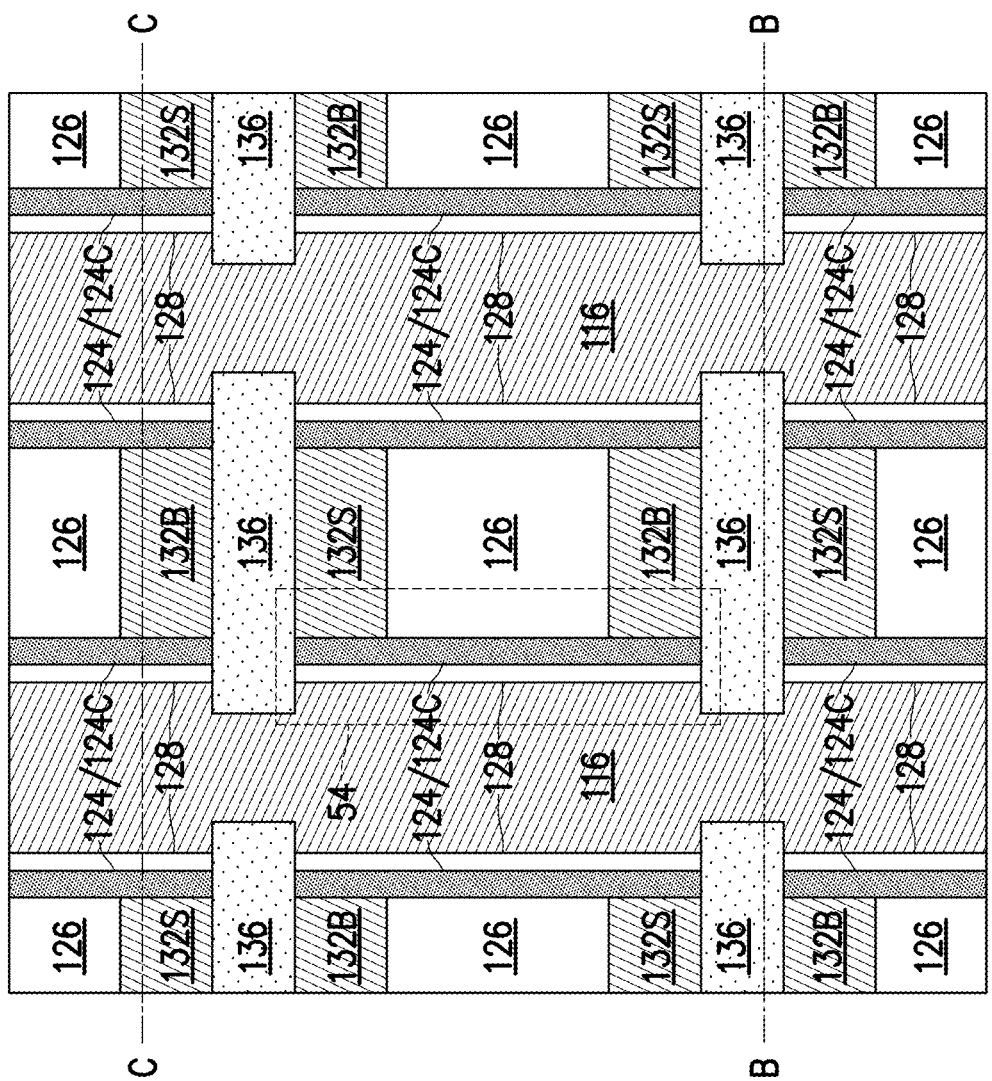
Figure 15B:
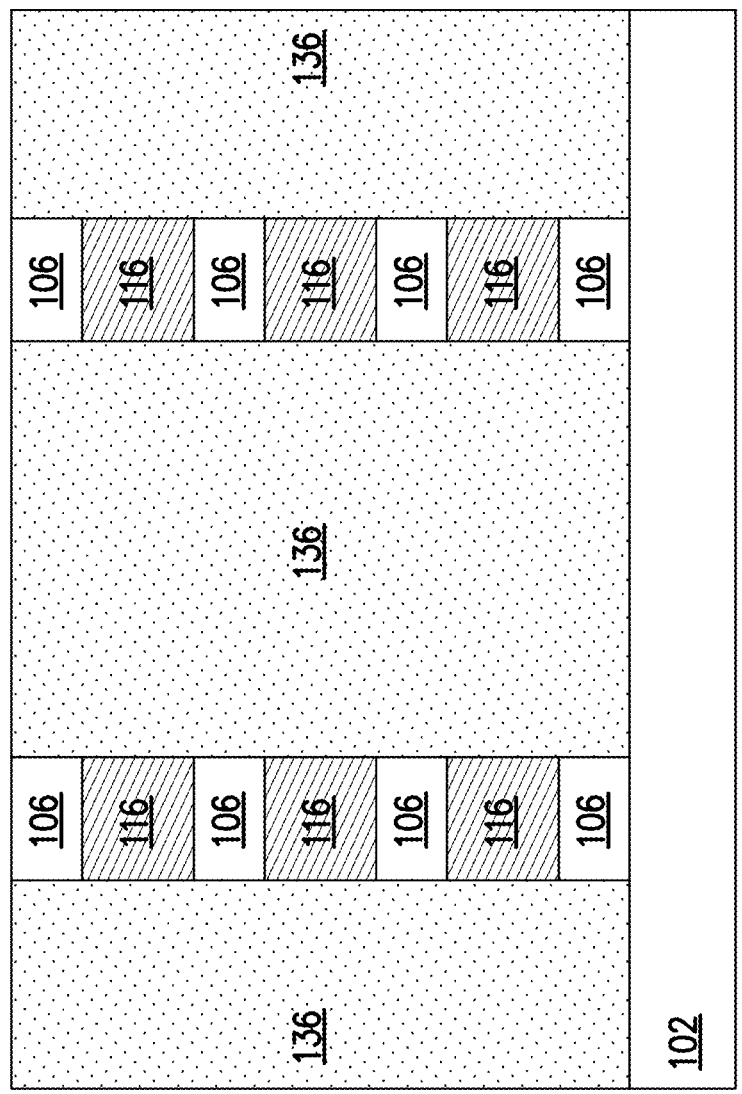
Figure 15C:
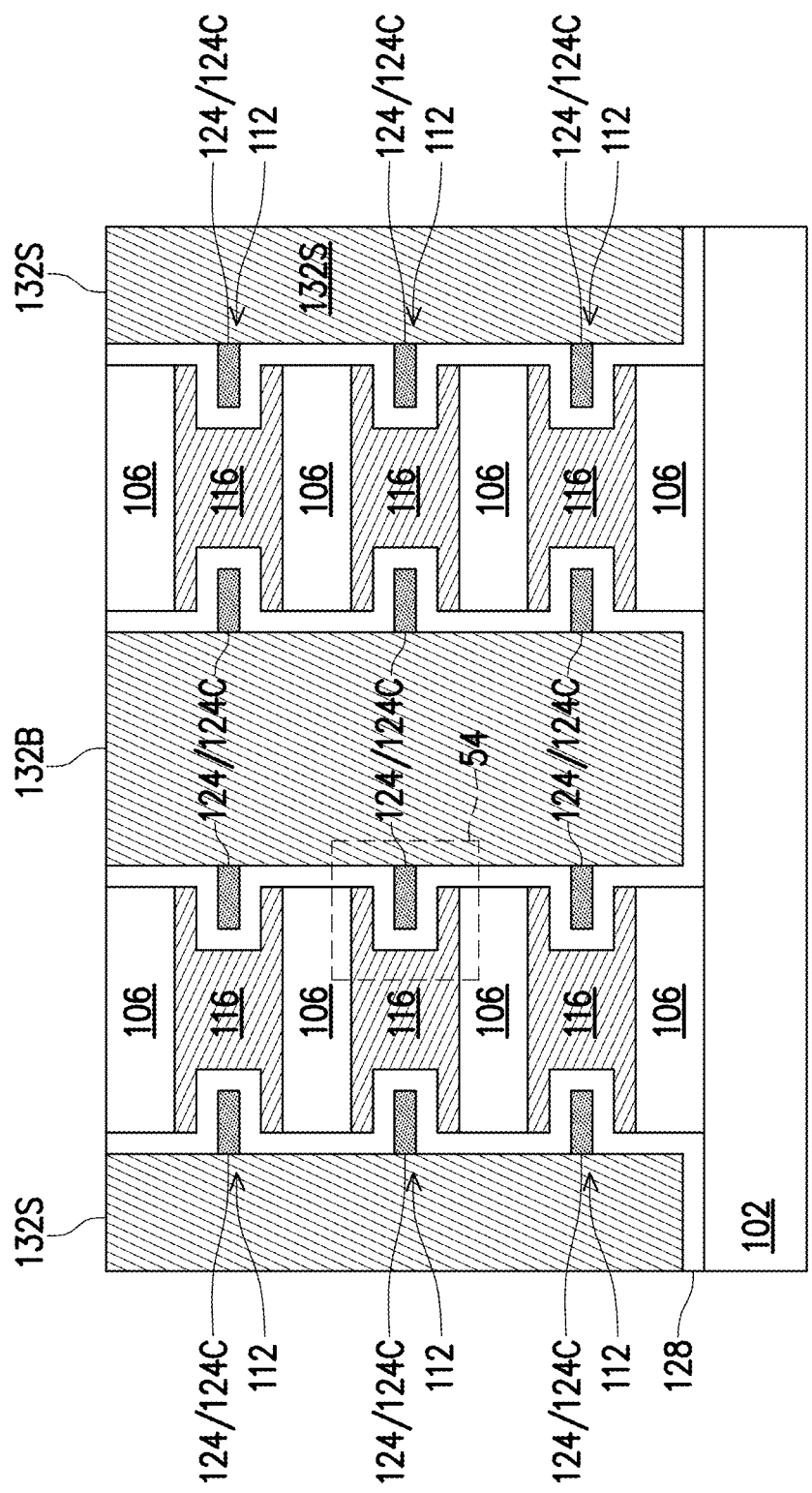
Figure 15D:
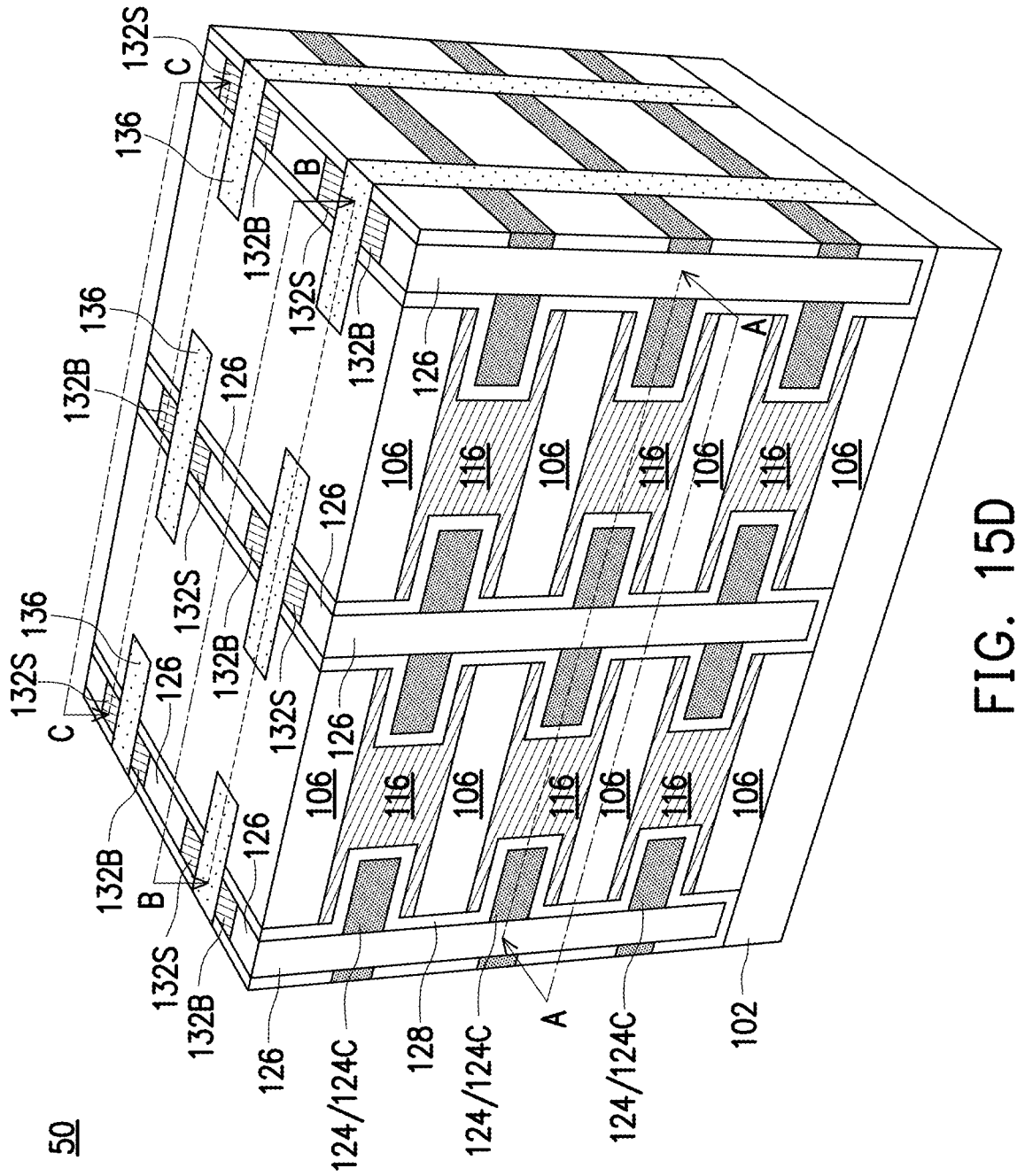

In FIGS. 14A and 14B, openings 134 for isolation structures are formed through the conductive lines 132, the memory layers 128, and the semiconductor layers 124. The openings 134 divide the semiconductor layers 124 and the conductive lines 132 to form transistors 54 (see FIGS. 15A, 15C, 16A and 16C). Specifically, the conductive lines 132 are divided to form bit lines 132B and source lines 132S. The openings 134 may divide the conductive lines 132 into bit lines 132B and source lines 132S of equal or unequal widths. As noted above, the bit lines 132B and the source lines 132S act as source/drain regions of the transistors 54. The openings 134 may also divide the memory layers 128. After the openings 134 are formed, each transistor 54 includes a portion of a semiconductor layer 124, a portion of a memory layer 128, a bit line 132B, and a source line 132S. The openings 134 are wider than the conductive lines 132, such that the openings 134 also extend laterally into the dielectric layers 106 and the word lines 116. The openings 134 do not divide the word lines 116. The openings 134 may be formed with an etching process that removes the conductive and dielectric materials of the layers of the memory array 50. For example, the openings 134 may be formed by a dry etch using, e.g., $C_4F_6$ mixed with hydrogen ($H_2$) or oxygen ($O_2$) gas, which may be performed using an etching mask having a pattern of the subsequently formed isolation structures.

In FIGS. 15A, 15B, 15C, and 15D, isolation structures 136 are formed in the openings 134. The isolation structures 136 thus extend through the conductive lines 132, the memory layers 128, and the semiconductor layers 124. The isolation structures 136 also extend laterally into the dielectric layers 106 and the word lines 116.

As an example to form the isolation structures 136, an isolation material is formed in the openings 134. The isolation material may be formed of oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like, which may be deposited by CVD, ALD, or the like. In some embodiments, the isolation structures 136 are formed of silicon oxide. A removal process is then applied to the various layers to remove excess isolation material of the isolation structures 136 over the source lines 132S, the bit lines 132B, the memory layers 128, the isolation regions 126, the semiconductor layers 124, and the topmost dielectric layer 106/word line 116. The removal process may be a planarization process such as a chemical mechanical polish (CMP), an etch-back, combinations thereof, or the like. The remaining isolation material forms the isolation structures 136 in the openings.

In FIGS. 16A, 16B, 16C, and 16D, an interconnect structure 160 is formed over the intermediate structure. The interconnect structure 160 may include, e.g., metallization patterns 162 in a dielectric material 164 (not shown in FIG. 16D, see FIGS. 16B and 16C). The dielectric material 164 may include one or more dielectric layers, such as one or more layers of a low-k (LK) or an extra low-K (ELK) dielectric material. The metallization patterns 162 may be metal interconnects (e.g., metal lines and vias) formed in the one or more dielectric layers. The interconnect structure 160 may be formed by a damascene process, such as a single damascene process, a dual damascene process, or the like. The metallization patterns 162 of the interconnect structure 160 are electrically connected to the bit lines 132B and the source lines 132S, and interconnect the transistors 54 to form functional memories.

Figure 16A:
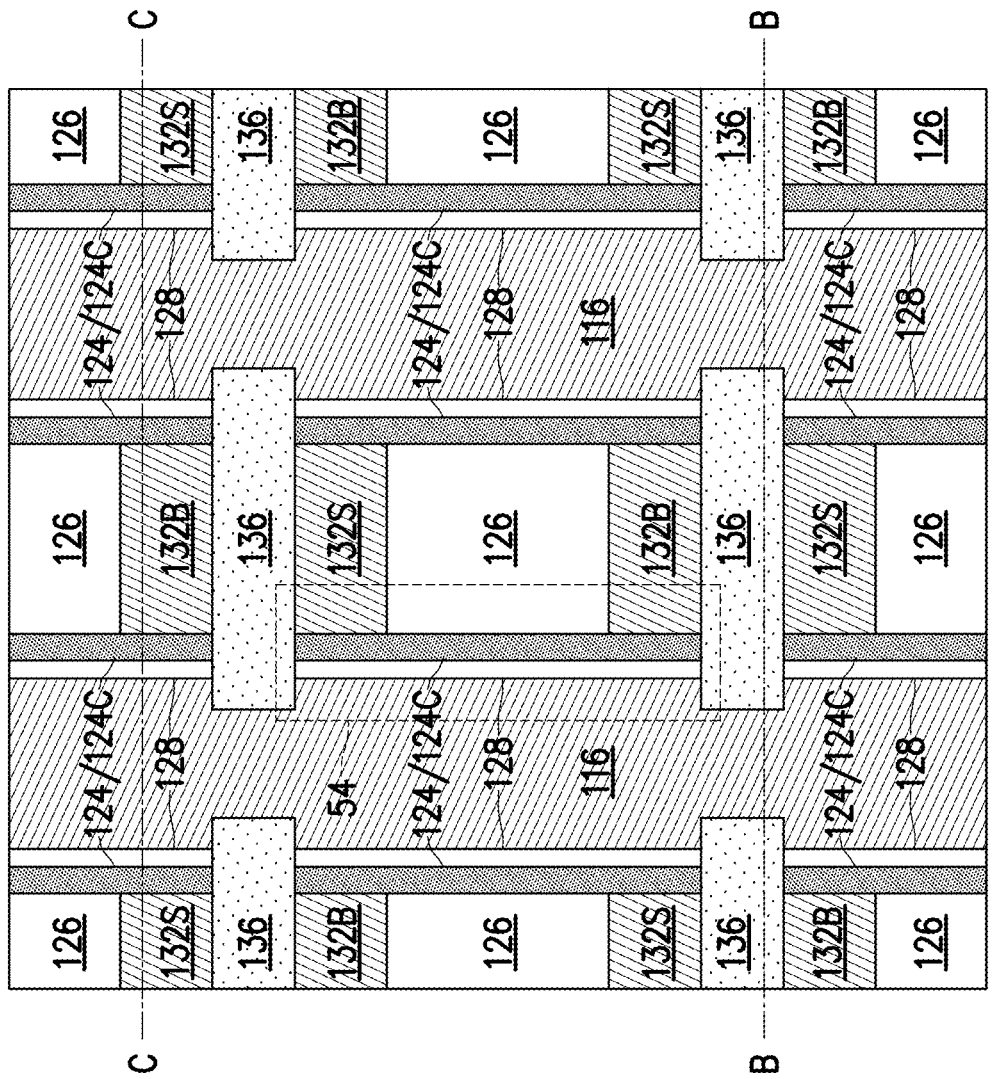
Figure 16B:
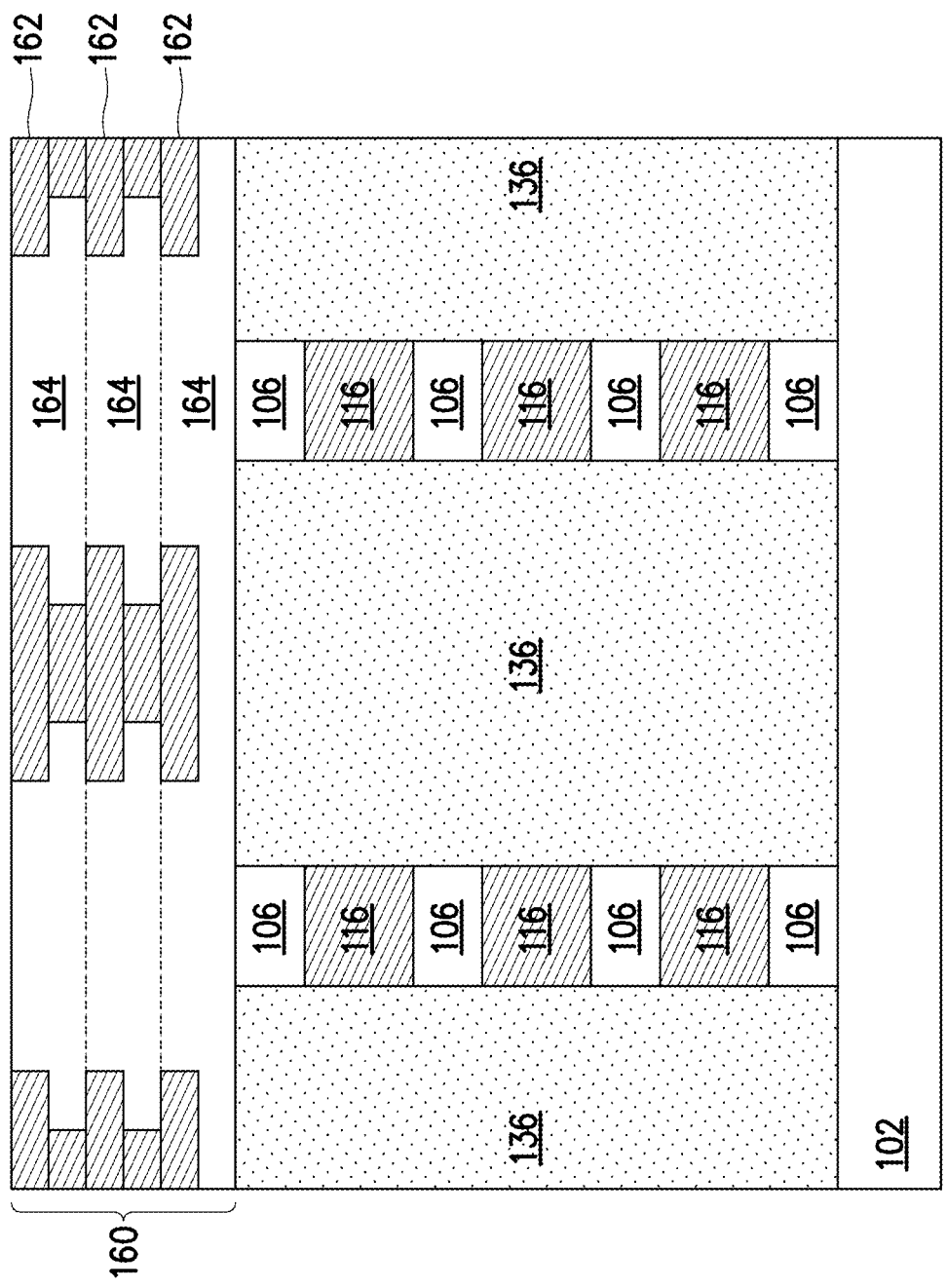
Figure 16C:
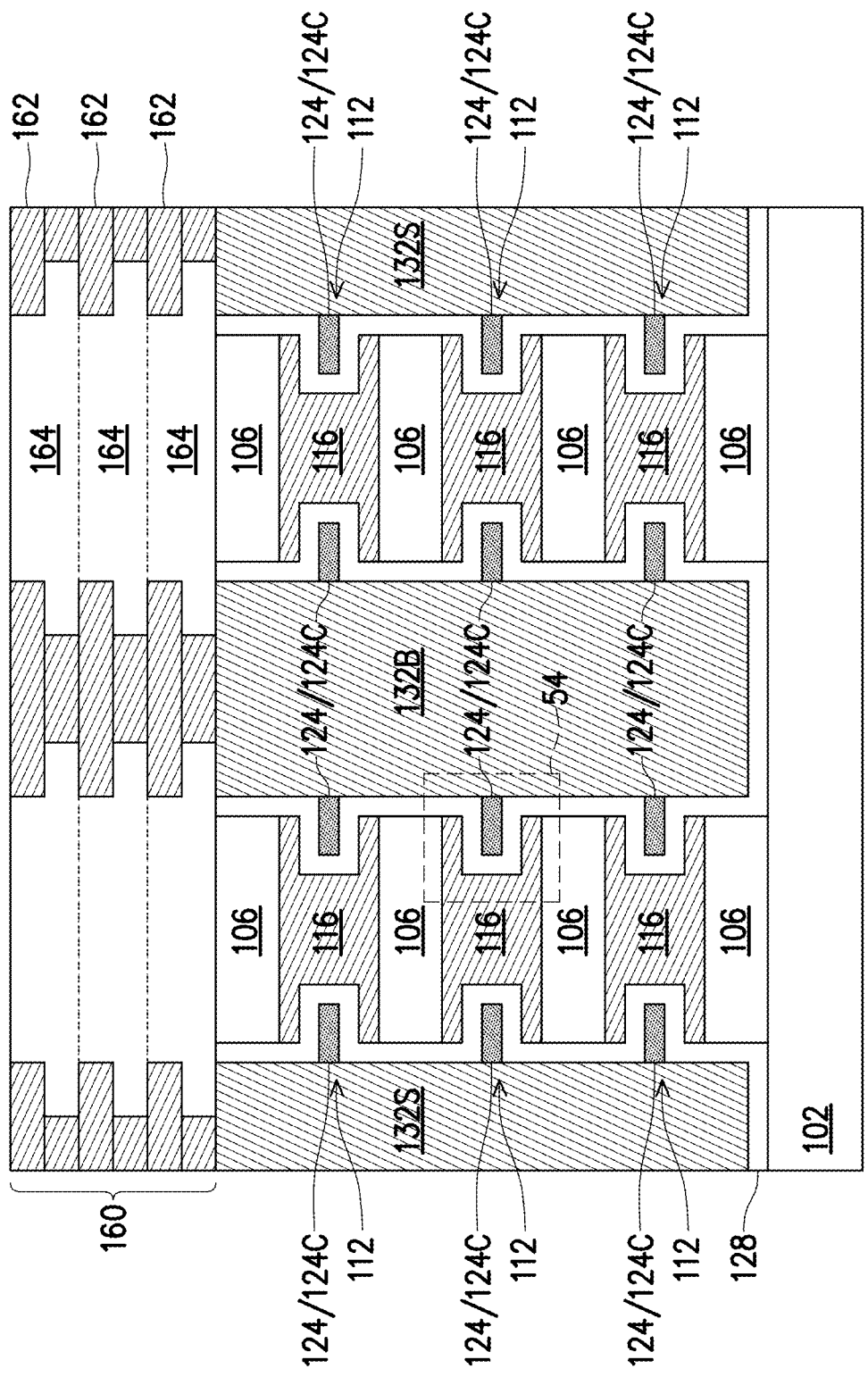
Figure 16D:
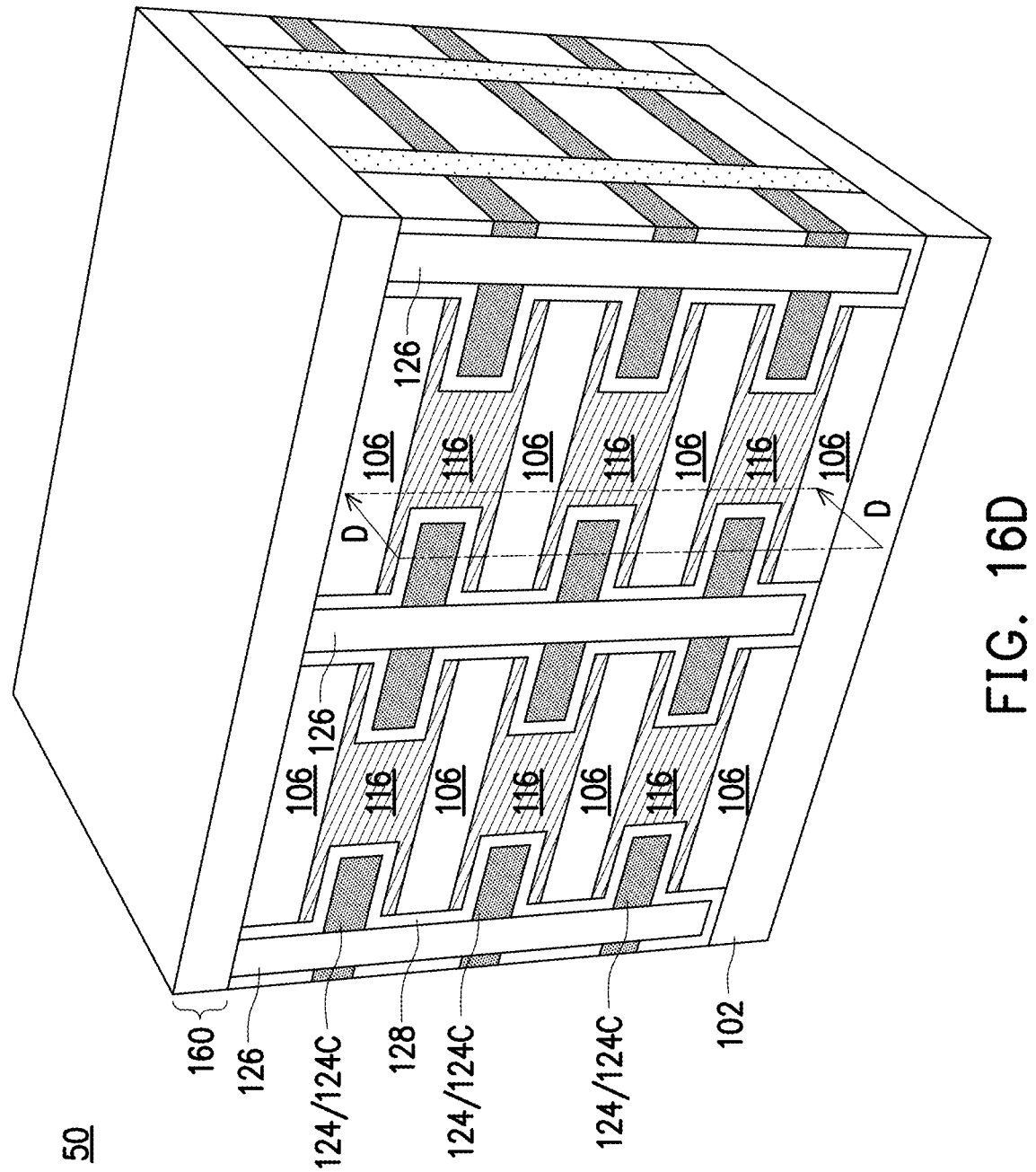

As shown in FIG. 16A, the bit lines 132B and the source lines 132S are formed in an alternating pattern along rows and columns of the memory array 50. Forming the bit lines 132B and the source lines 132S in an alternating pattern helps avoid shorting of adjacent bit lines 132B/source lines 132S in the cross-section of FIG. 16C when a word line 116 is activated.

As noted above, the dielectric layers 106 and the word lines 116 may be formed in a staircase structure. The dielectric layers 106 and the word lines 11616 may be patterned to form the staircase structure at any desired step before the formation of interconnect structure 160. Forming the interconnect structure 160 includes forming conductive contacts that are connected to the exposed portions of each of the word lines 116.

FIGS. 17A through 17J are views of intermediate stages in the manufacturing of a staircase structure of a memory array 50, in accordance with some embodiments. FIGS. 17A through 17J are illustrated along reference cross-section D-D illustrated in FIG. 16D. Some features of the transistors, such as the memory layers 128, the semiconductor layers 124, and the like (2 through 16D), are not shown for clarity of illustration.

FIGS. 17A through 17J are views of intermediate stages in the manufacturing of a staircase structure of a memory array 50, in accordance with some embodiments. FIGS. 17A through 17J are illustrated along reference cross-section D-D illustrated in FIG. 16D. Some features of the transistors, such as the memory layers 128, the semiconductor layers 124, and the like (see FIGS. 2 through 16D), are not shown for clarity of illustration.

Figure 17A:
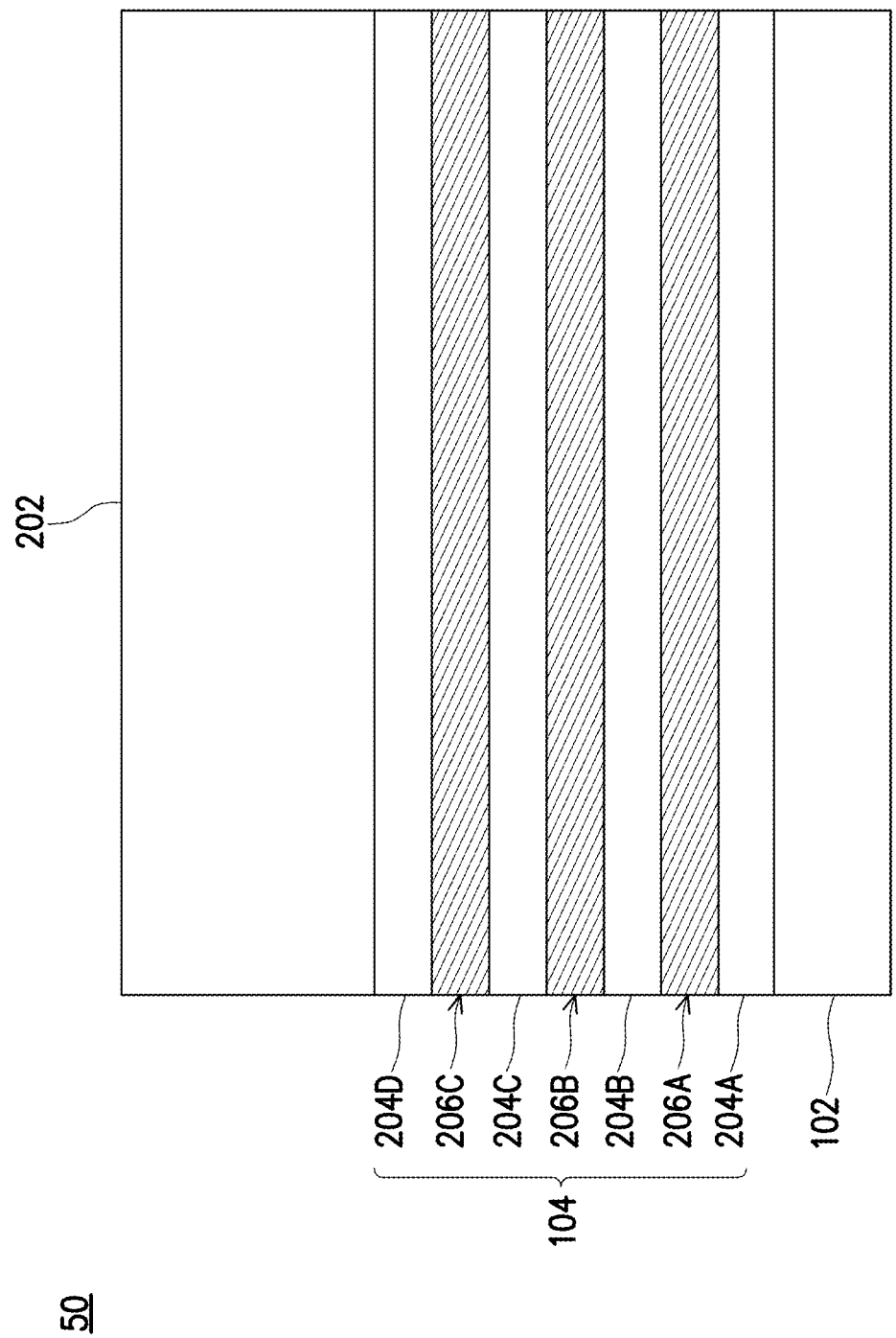
Figure 17B:
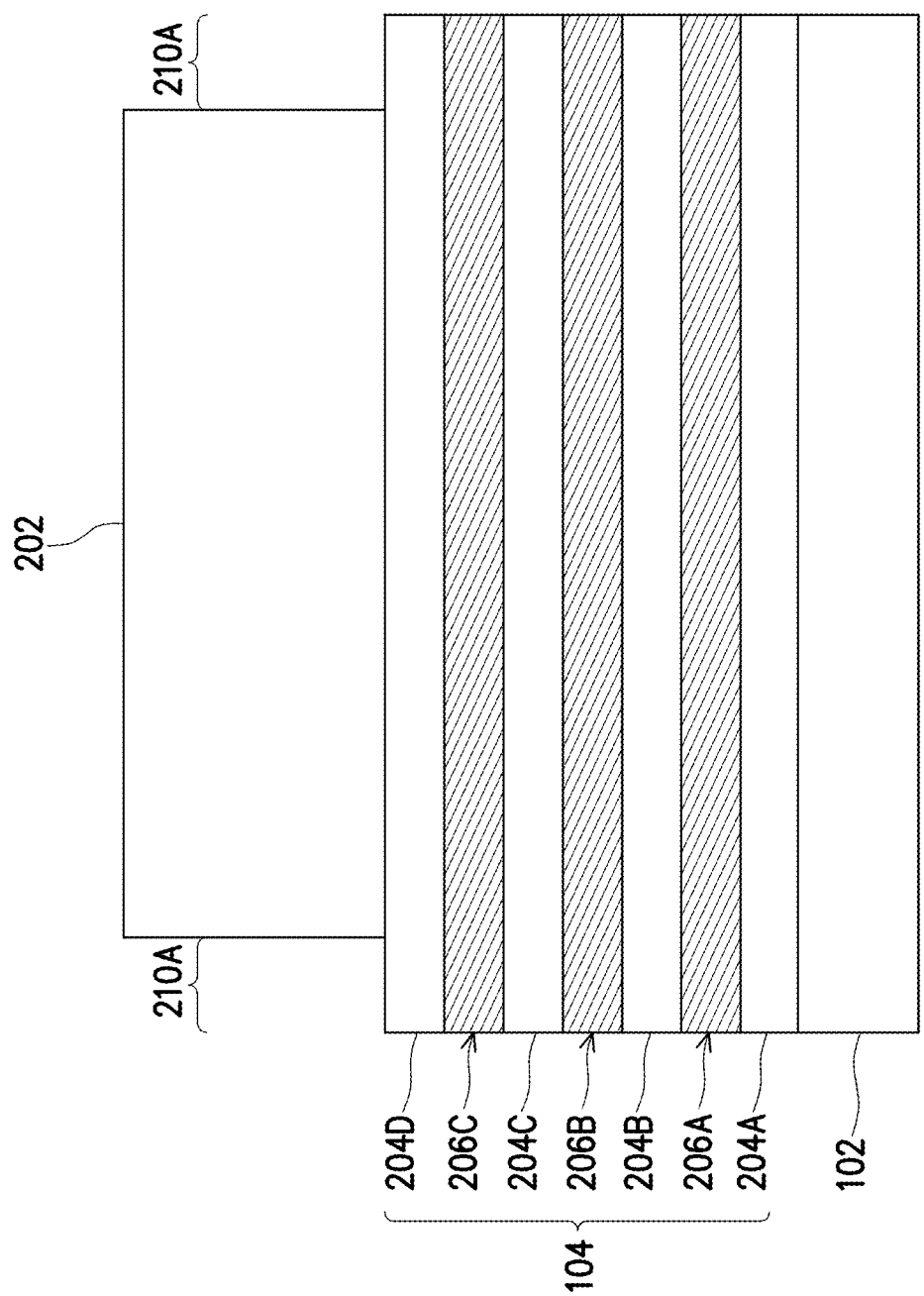

In FIG. 17B, the mask 202 is patterned to expose the multilayer stack 104 in regions 210A while masking remaining portions of the multilayer stack 104. For example, a topmost layer of the multilayer stack 104 (e.g., the dielectric layer 204D) may be exposed in the regions 210A. The mask 202 may be patterned using acceptable photolithography techniques.

In FIG. 17C, the exposed portions of the multilayer stack 104 in the regions 210A are etched using the mask 202 as an etching mask. The etching may be any acceptable etch process, such as by wet or dry etching, a reactive ion etch (RIE), neutral beam etch (NBE), the like, or a combination thereof. The etching may be anisotropic. The etching may remove portions of the dielectric layer 204D and conductive layer 206C in the regions 210A and define openings 212. Because the dielectric layer 204D and the conductive layer 206C have different material compositions, etchants used to remove exposed portions of these layers may be different. In some embodiments, the conductive layer 206C acts as an etch stop layer while etching the dielectric layer 204D, and the dielectric layer 204C acts as an etch stop layer while etching conductive layer 206C. As a result, the portions of the conductive layer 206C and the dielectric layer 204D may be selectively removed without removing remaining layers of the multilayer stack 104, and the openings 212 may be extended to a desired depth. Alternatively, a timed etch processes may be used to stop the etching of the openings 212 after the openings 212 reach a desired depth. In the resulting structure, the dielectric layer 204C is exposed in the regions 210A.

Figure 17D:
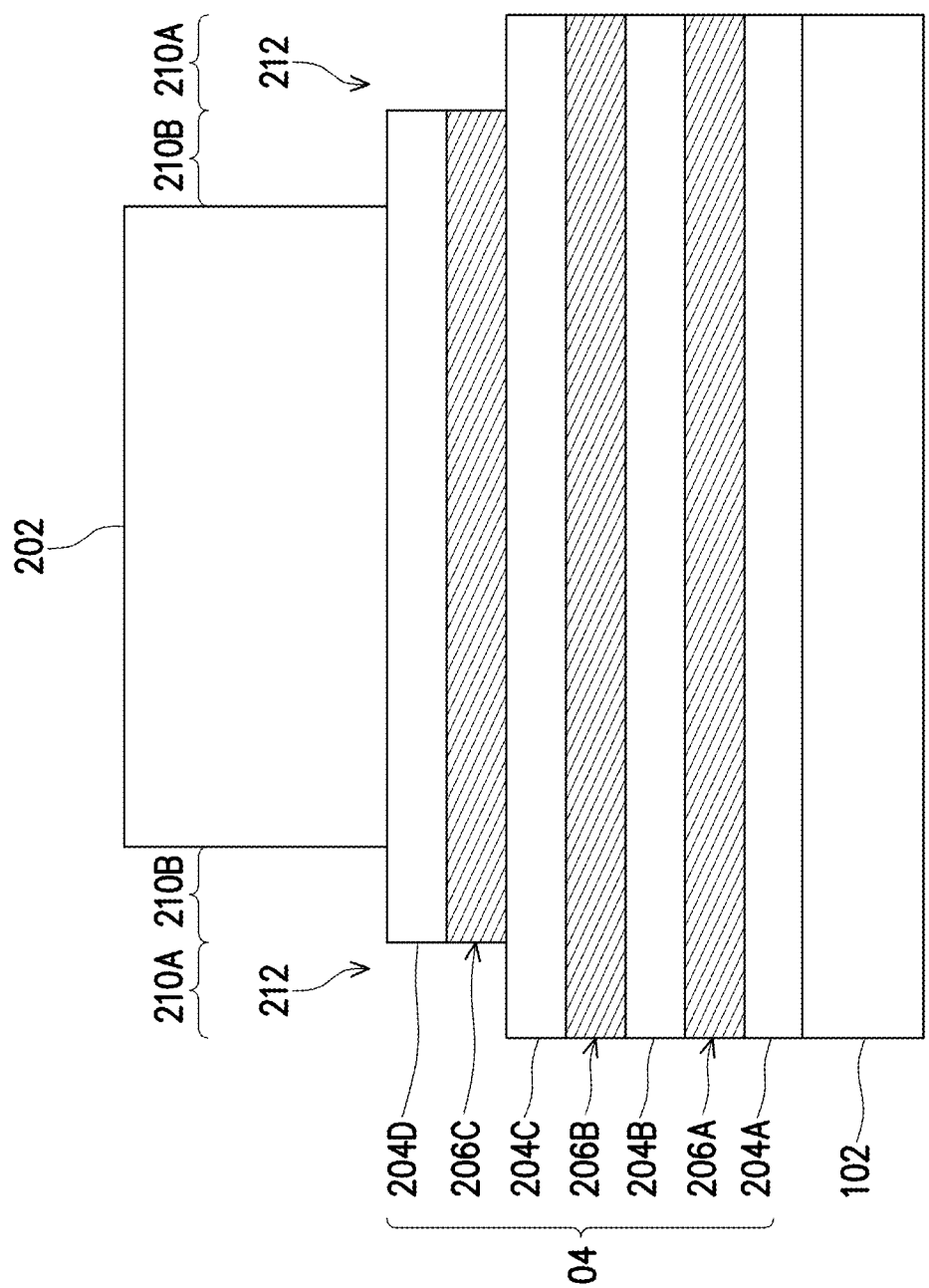

In FIG. 17D, the mask 202 is trimmed to expose additional portions of the multilayer stack 104. The mask 202 can be trimmed using acceptable photolithography and/or etching techniques. As a result of the trimming, a width of the mask 202 is reduced, and portions the multilayer stack 104 in regions 210B may also be exposed. For example, a top surface of the dielectric layer 204C may be exposed in the regions 210A, and a top surface of the dielectric layer 204D may be exposed in the regions 210B.

Figure 17E:
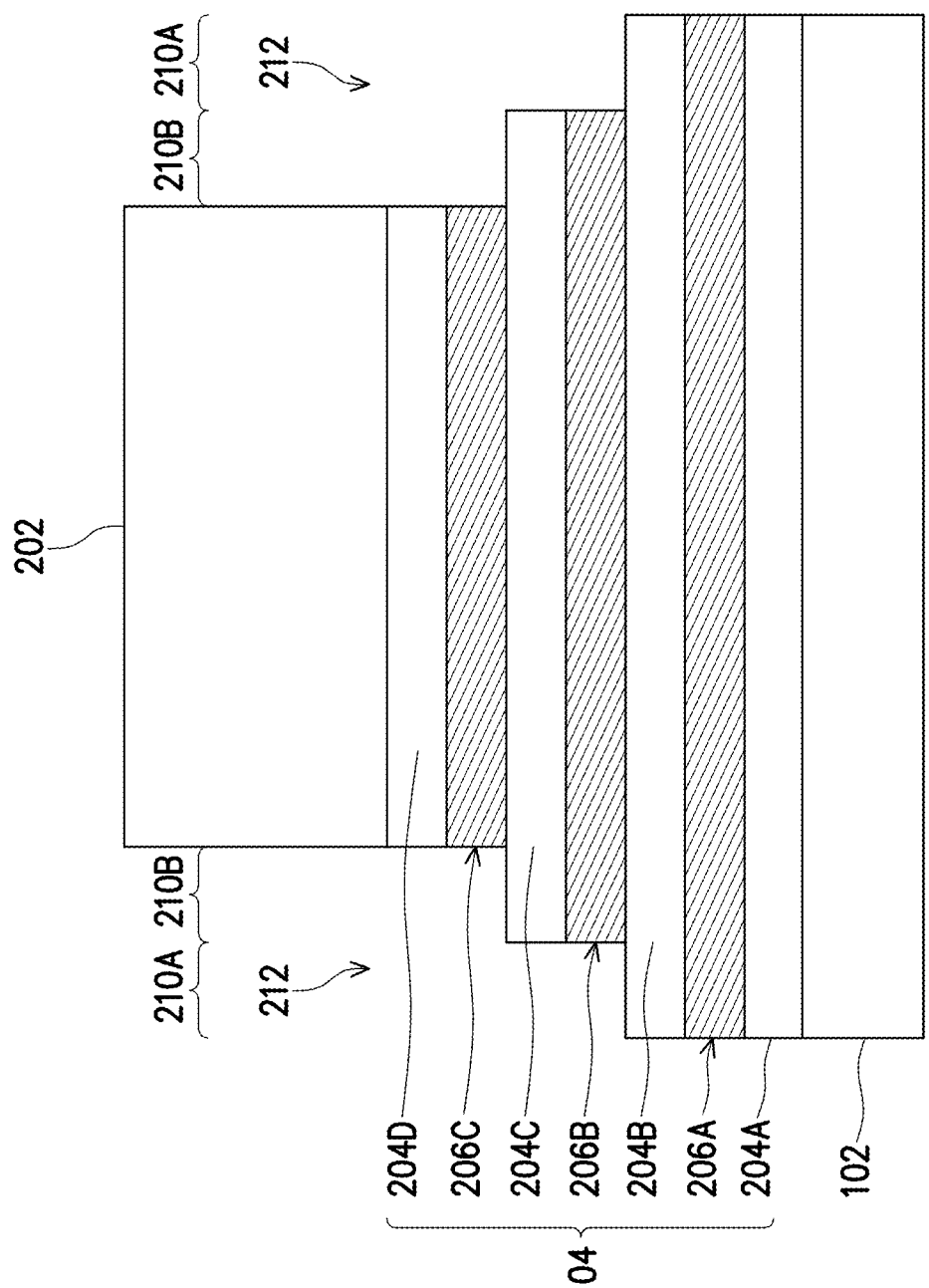

In FIG. 17E, portions of the dielectric layer 204D, the conductive layer 206C, the dielectric layer 204C, and the conductive layer 206B in the regions 210A and 210B are removed by acceptable etching processes using the mask 202 as an etching mask. The etching may be any acceptable etch process, such as by wet or dry etching, a reactive ion etch (RIE), neutral beam etch (NBE), the like, or a combination thereof. The etching may be anisotropic. The etching may extend the openings 212 further into the multilayer stack 104. Because the dielectric layers 204D/204C and the conductive layers 206C/206B have different material compositions, etchants used to remove exposed portions of these layers may be different. In some embodiments, the conductive layer 206C acts as an etch stop layer while etching the dielectric layer 204D; the dielectric layer 204C acts as an etch stop layer while etching conductive layer 206C; the conductive layer 206B acts as an etch stop layer while etching the dielectric layer 204C; and the dielectric layer 204B acts as an etch stop layer while etching the conductive layer 206B. As a result, portions of the dielectric layers 204D/204C and the conductive layer 206C/206B may be selectively removed without removing remaining layers of the multilayer stack 104, and the openings 212 may be extended to a desired depth. Further, during the etching processes, unetched portions of the dielectric layers 204 and conductive layers 206 act as an etching mask for underlying layers, and as a result a previous pattern of the dielectric layer 204D and conductive layer 206C (see FIG. 17D) may be transferred to the underlying dielectric layer 204C and conductive layer 206B. In the resulting structure, the dielectric layer 204B is exposed in the regions 210A, and the dielectric layer 204C is exposed in the regions 210B.

Figure 17F:
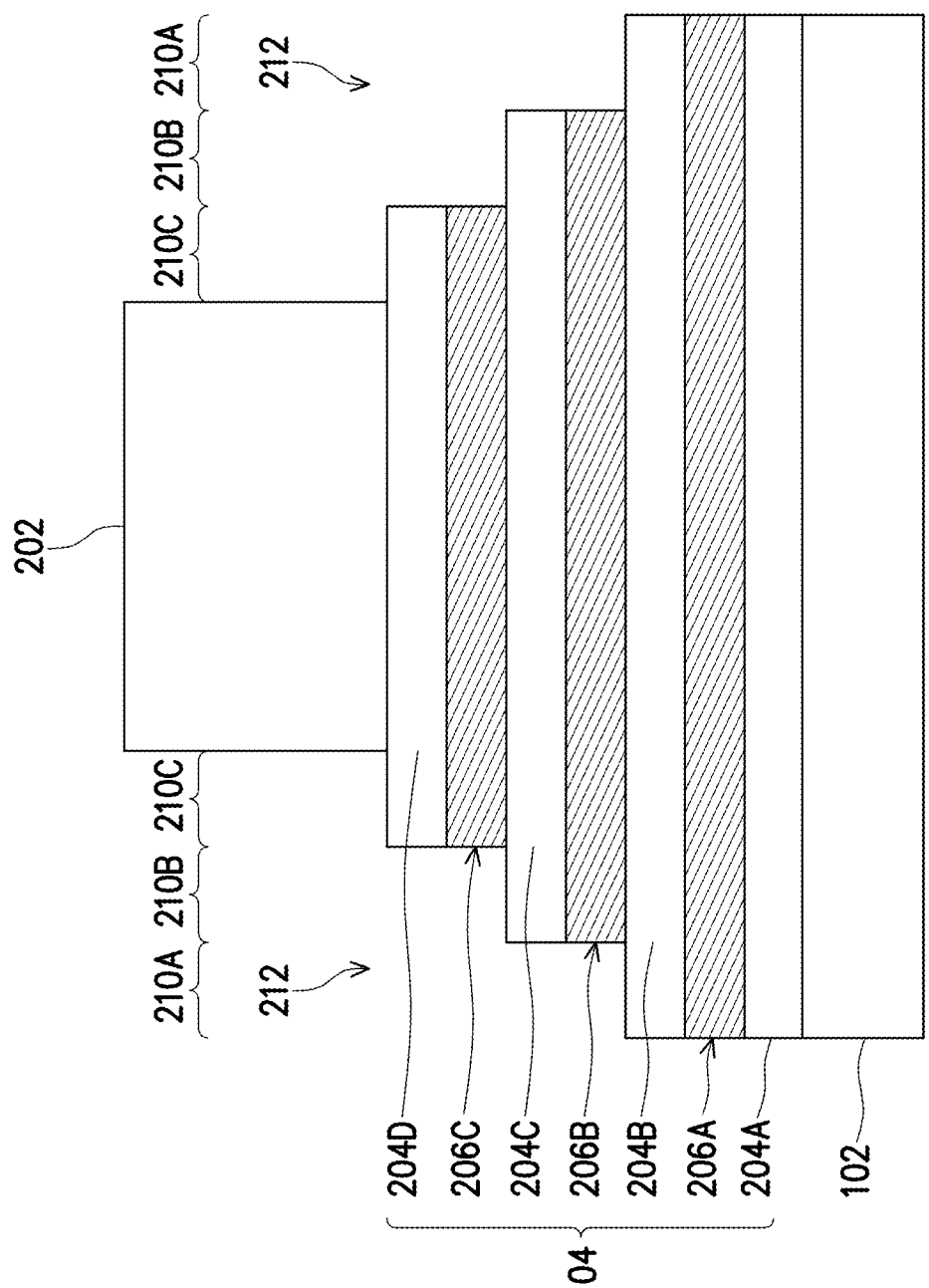

In FIG. 17F, the mask 202 is trimmed to expose additional portions of the multilayer stack 104. The photoresist can be trimmed using acceptable photolithography techniques. As a result of the trimming, a width of the mask 202 is reduced, and portions the multilayer stack 104 in regions 210C may also be exposed. For example, a top surface of the dielectric layer 204B may be exposed in the regions 210A; a top surface of the dielectric layer 204C may be exposed in the regions 210B; and a top surface of the dielectric layer 204D may be exposed in the regions 210C.

Figure 17G:
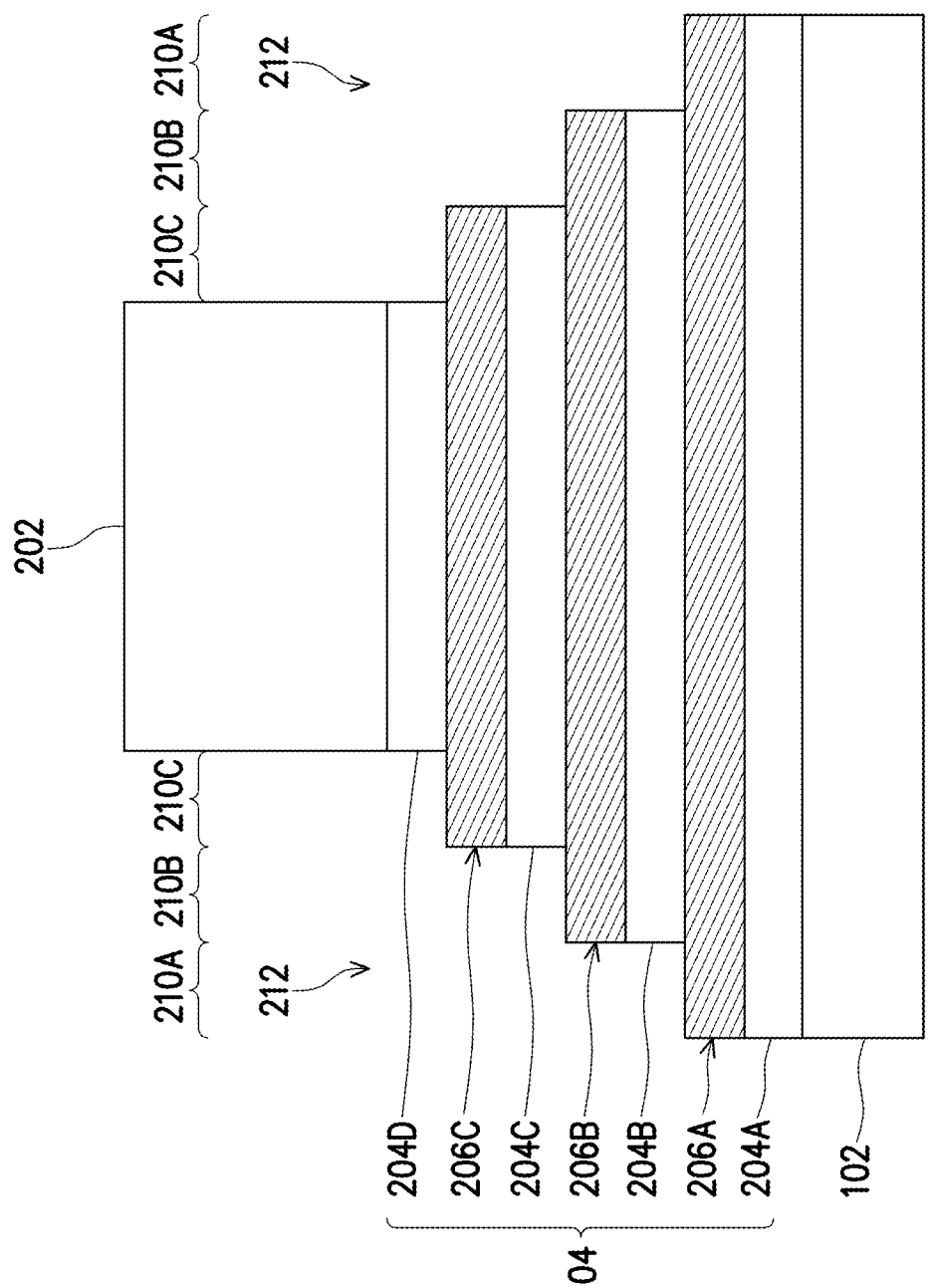

In FIG. 17G, portions of the dielectric layers 204D, 204C, 204B in the regions 210A, 210B, 210C are removed by acceptable etching processes using the mask 202 as an etching mask. The etching may be any acceptable etch process, such as by wet or dry etching, a reactive ion etch (RIE), neutral beam etch (NBE), the like, or a combination thereof. The etching may be anisotropic. The etching may extend the openings 212 further into the multilayer stack 104. In some embodiments, the conductive layer 206C acts as an etch stop layer while etching the dielectric layer 204D; the conductive layer 206B acts as an etch stop layer while etching the dielectric layer 204C; and the conductive layer 206A acts as an etch stop layer etching the dielectric layer 204B. As a result, portions of the dielectric layers 204D, 204C, 204B may be selectively removed without removing remaining layers of the multilayer stack 104, and the openings 212 may be extended to a desired depth. Further, during the etching processes, each of the conductive layers 206 act as an etching mask for underlying layers, and as a result a previous pattern of the conductive layers 206C/206B (see FIG. 17F) may be transferred to the underlying dielectric layers 204C/204B. In the resulting structure, the conductive layer 206A is exposed in the regions 210A; the conductive layer 206B is exposed in the regions 210B; and the conductive layer 206C is exposed in the regions 210C.

In FIG. 17H, the mask 202 may be removed, such as by an acceptable ashing or wet strip process. Thus, a staircase structure 214 is formed. The staircase structure comprises a stack of alternating ones of the dielectric layers 204 and the conductive layers 206. Lower conductive layers 206 are wider and extend laterally past upper conductive layers 206, and a width of each of the conductive layers 206 increases in a direction towards the substrate 102. For example, the conductive layer 206A may be longer than the conductive layer 206B; and the conductive layer 206B may be longer than the conductive layer 206C. As a result, conductive contacts can be made from above the staircase structure 214 to each of the conductive layers 206 in subsequent processing steps.

Figure 17I:
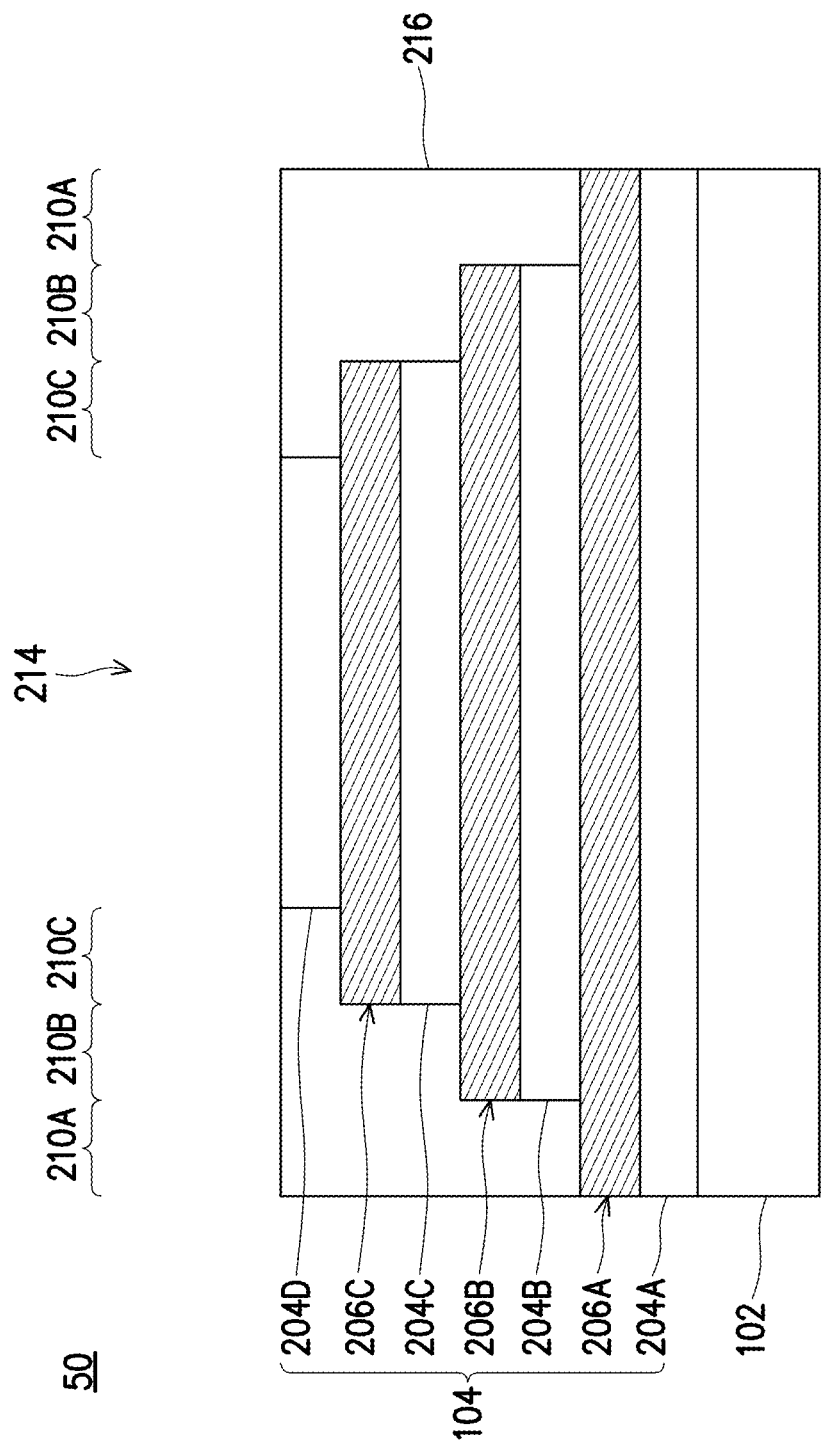

In FIG. 17I, an inter-metal dielectric (IMD) 216 is deposited over the multilayer stack 104. The IMD 216 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The IMD 216 extends along sidewalls of the dielectric layers 204 as well as sidewalls of the conductive layers 206. Further, the IMD 216 may contact top surfaces of each of the conductive layers 206.

As further illustrated in FIG. 17I, a removal process is then applied to the IMD 216 to remove excess dielectric material over the multilayer stack 104. In some embodiments, a planarization process such as a chemical mechanical polish (CMP), an etch-back process, combinations thereof, or the like may be utilized. The planarization process exposes the multilayer stack 104 such that top surfaces of the multilayer stack 104 and IMD 216 are level after the planarization process is complete.

Figure 17J:
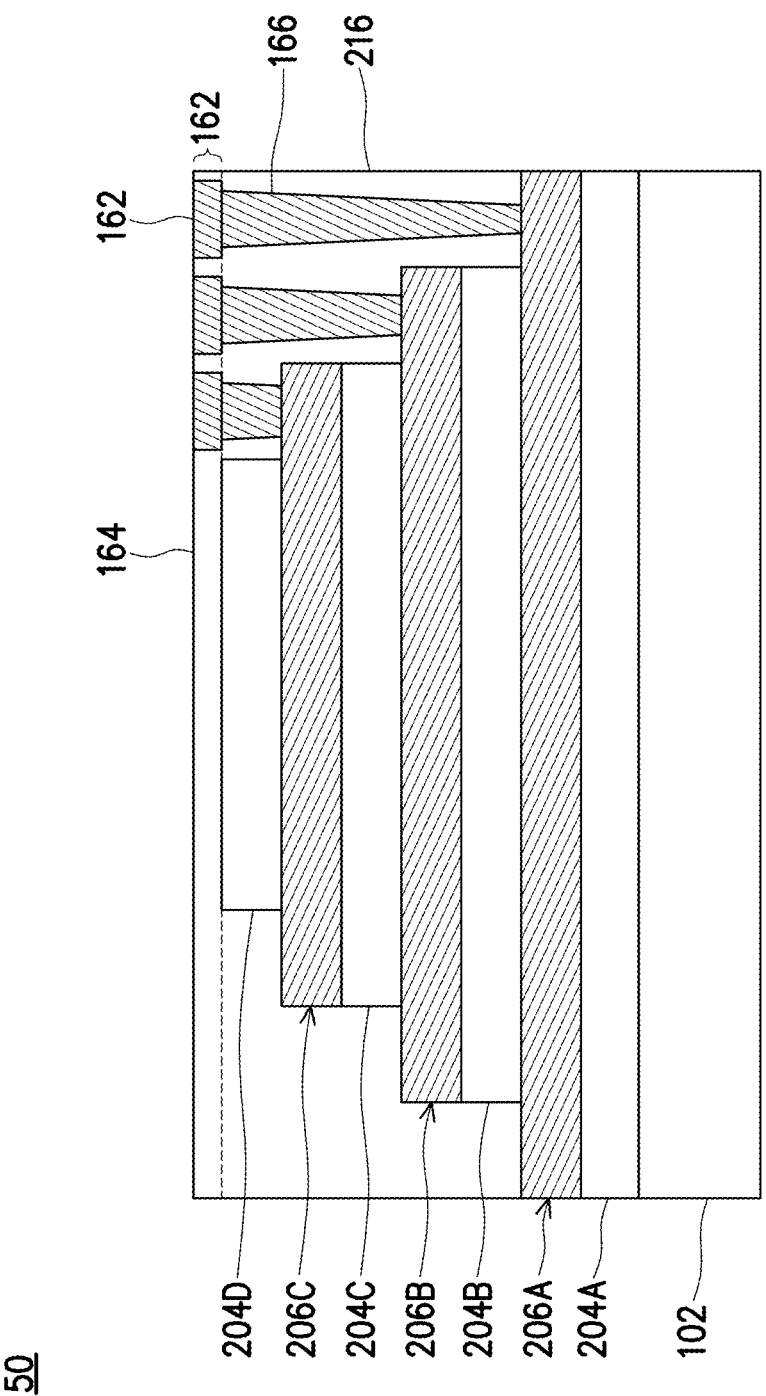

In FIG. 17J, portions of the interconnect structure 160 are formed. Only one layer of the interconnect structure 160 is shown for simplicity of illustration. In this embodiment, forming the interconnect structure 160 includes forming conductive contacts 166 through the IMD 216. The conductive contacts 166 may be formed by a damascene process, such as a single damascene process, a dual damascene process, or the like. The conductive contacts 166 are connected to the exposed portions of each of the conductive layers 206 (e.g., the word lines 116 discussed above).

Figure 18A:
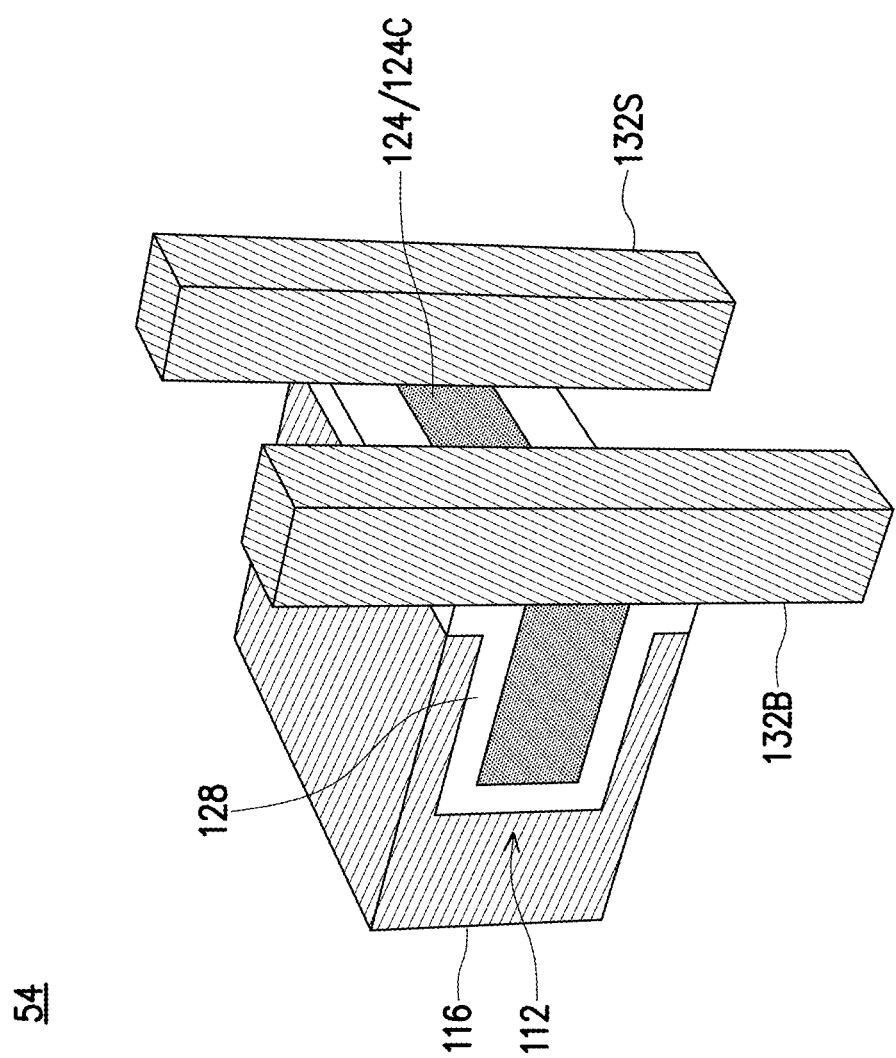
FIGS. 18A and 18B are three-dimensional views of thin film transistors, in accordance with various embodiments.
Figure 18B:
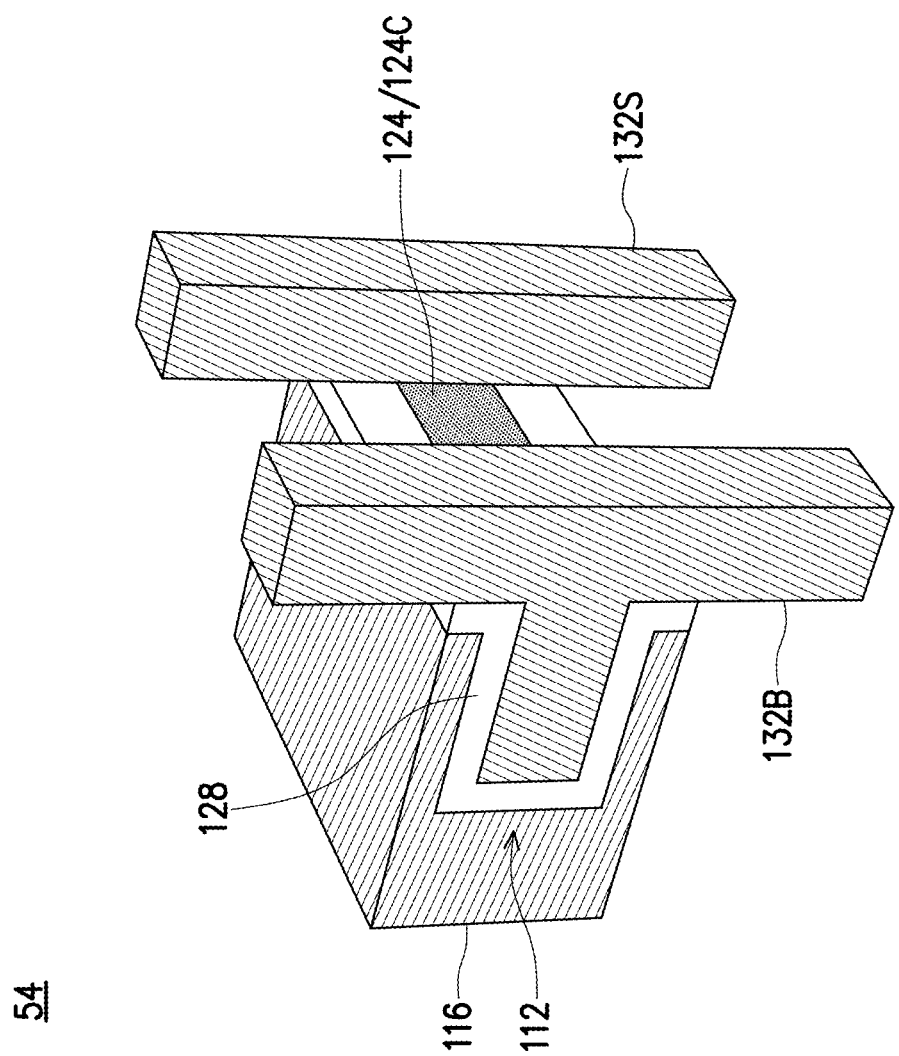

FIGS. 18A and 18B are three-dimensional views of transistors 54, in accordance with various embodiments. Some features, such as the dielectric layers 106, the isolation regions 126, etc. (see FIG. 16A-16D), are not shown for clarity of illustration. As noted above, the openings 130 (see FIGS. 12A and 12B) for the bit lines 132B and the source lines 132S may or may not be formed to extend laterally into the semiconductor layers 124. In the embodiment of FIG. 18A, the openings 130 (see FIGS. 12A and 12B) for the bit lines 132B and the source lines 132S are not formed through the semiconductor layers 124, and thus the bit lines 132B and the source lines 132S are conductive columns with continuous sidewalls that do not extend into the sidewall recesses 112, and are separated from portions of the memory layers 128 by the semiconductor layers 124/isolation regions 126. In the embodiment of FIG. 18B, the openings 130 (see FIGS. 12A and 12B) for the bit lines 132B and the source lines 132S are formed through the semiconductor layers 124, and thus the bit lines 132B and the source lines 132S include projecting portions that extend into the sidewall recesses 112.

Figure 19:
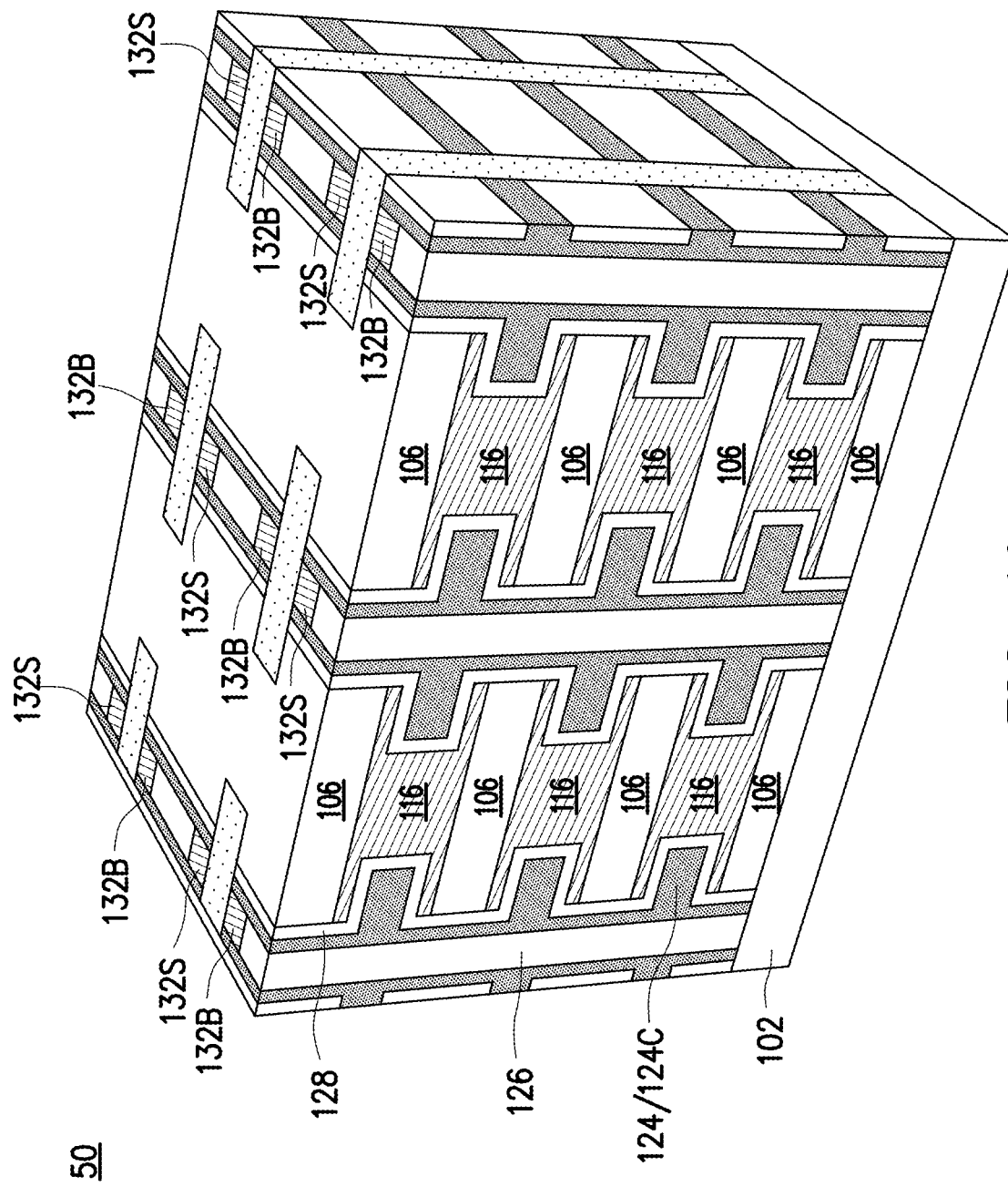
FIG. 19 is a three-dimensional view of a memory array at an intermediate stage of manufacturing, in accordance with some other embodiments.

FIG. 19 is a three-dimensional view of a memory array 50 at an intermediate stage of manufacturing, in accordance with some other embodiments. This embodiment is similar to the embodiment of FIG. 15D, except the portions of the semiconductor layer 122 (see FIG. 10) outside of the sidewall recesses 112 are not removed when the semiconductor layer 122 (see FIG. 10) is patterned to form the semiconductor layers 124. Thus, the semiconductor layers 124 of vertically adjacent transistors are not separated. It should be appreciated that an interconnect structure can be formed over the intermediate structure of FIG. 19, in a similar manner as that described with respect to FIGS. 16A through 17J. Further, this embodiment may be formed with bit lines 132B and source lines 132S that are conductive columns with continuous sidewalls (see FIG. 18A) or that include projecting portions extending into the sidewall recesses 112 (see FIG. 18B).

Figure 20:
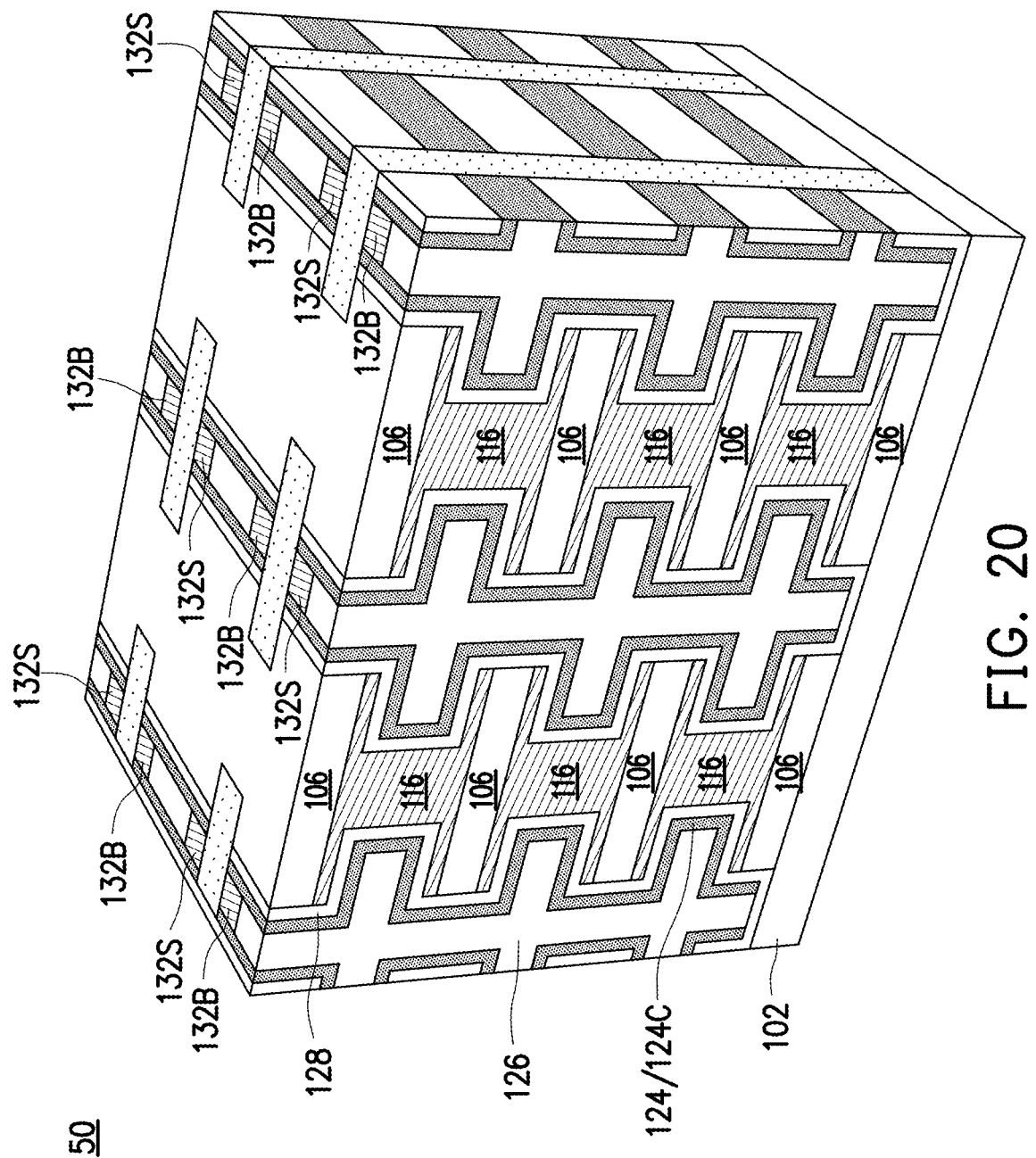
FIG. 20 is a three-dimensional view of a memory array at an intermediate stage of manufacturing, in accordance with some other embodiments.

FIG. 20 is a three-dimensional view of a memory array 50 at an intermediate stage of manufacturing, in accordance with some other embodiments. This embodiment is similar to the embodiment of FIG. 15D, except the semiconductor layers 124 and the memory layers 128 both only partially fill the sidewall recesses 112. Thus, the isolation regions 126 are also formed to fill the remaining portions of the sidewall recesses 112. It should be appreciated that an interconnect structure can be formed over the intermediate structure of FIG. 20, in a similar manner as that described with respect to FIGS. 16A through 17J. Further, this embodiment may be formed with bit lines 132B and source lines 132S that are conductive columns with continuous sidewalls (see FIG. 18A) or that include projecting portions extending into the sidewall recesses 112 (see FIG. 18B).

Figure 21:
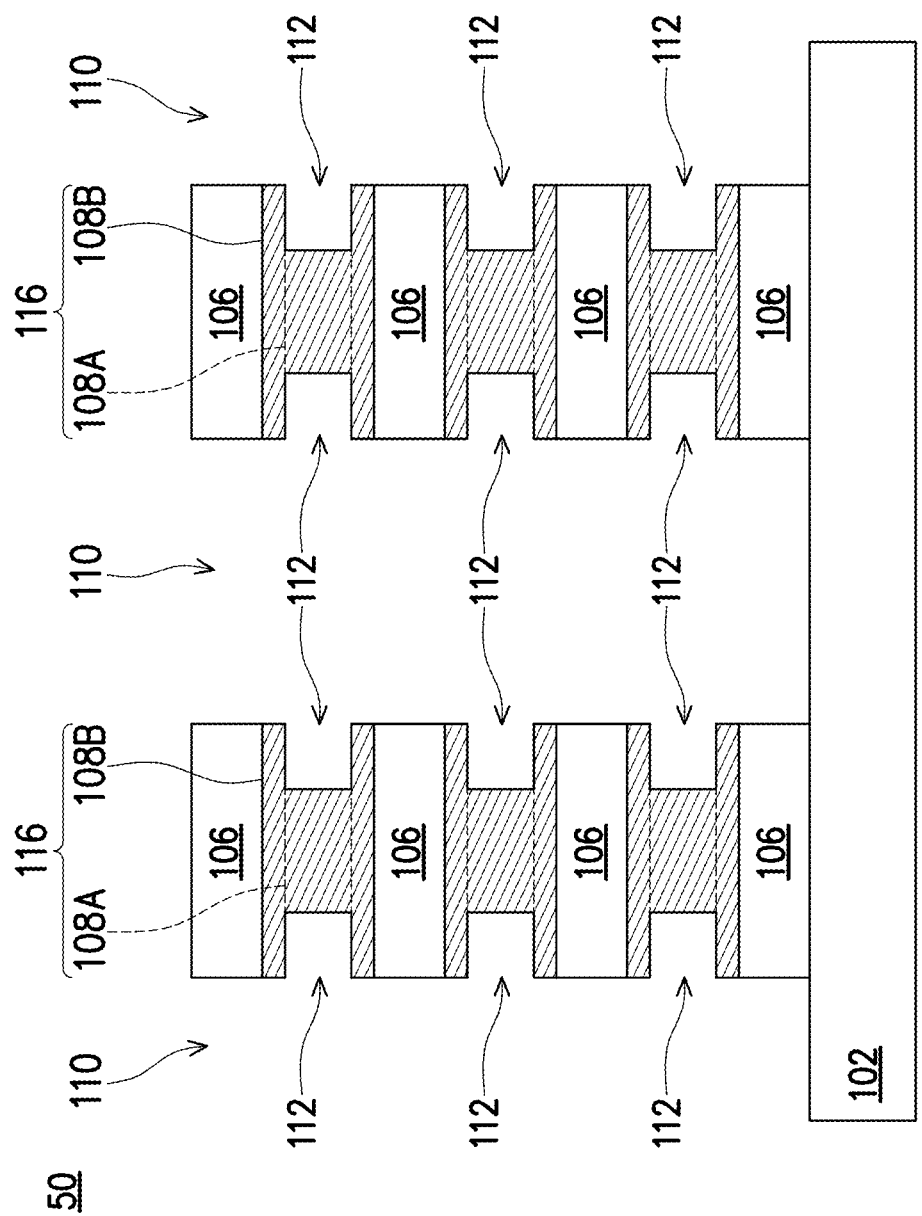
FIG. 21 is a view of an intermediate stage in the manufacturing of a memory array, in accordance with some other embodiments.

FIG. 21 is a view of an intermediate stage in the manufacturing of a memory array 50, in accordance with some other embodiments. FIG. 21 is a cross-sectional view shown along reference cross-section B-B in FIG. 15D. A portion of the memory array 50 is illustrated. Some features, such as the staircase arrangement of the word lines (see FIG. 1A), are not shown in some figures for clarity of illustration.

FIG. 21 illustrates a similar step of processing as FIG. 6, e.g., shows the definition of the word lines 116. However, in this embodiment, the sidewall recesses 112 are formed by a different manner than the steps described with respect to FIGS. 4 through 6. Specifically, each of the conductive layers 108 includes alternating first conductive sub-layers 108A and second conductive sub-layers 108B. For example, FIG. 21 illustrates each conductive layer 108 having one of the first conductive sub-layers 108A disposed between two of the second conductive sub-layers 108B. As will be described in greater detail below with respect to FIG. 22, the conductive layers 108 may have any desired quantity of the conductive sub-layers 108A, 108B. The first conductive sub-layers 108A are formed of a first conductive material (which may be formed of the candidate materials of the conductive layers 108 described with respect to FIG. 2) and the second conductive sub-layers 108B are formed of a second conductive material (which may be formed of the candidate materials of the conductive layers 108 described with respect to FIG. 2), with the first conductive material being different from the second conductive material. Specifically, the material of the first conductive sub-layers 108A has a high etching selectivity from the etching of the material of the second conductive sub-layers 108B. As such, in this embodiment, the sidewall recesses 112 may be formed after the step of processing shown in FIG. 3. The sidewall recesses 112 may be formed by an acceptable etching process, such as one that is selective to the material of the first conductive sub-layers 108A (e.g., selectively removes the material of the first conductive sub-layers 108A at a faster rate than the materials of the second conductive sub-layers 108B). The etching may be isotropic. As a result of such processing, the projecting portions 116P of the words lines 116 (see FIGS. 7A, 7B, 7C, and 7D) are formed of a different conductive material than the main portions 116M of the words lines 116 (see FIGS. 7A, 7B, 7C, and 7D).

Figure 22:
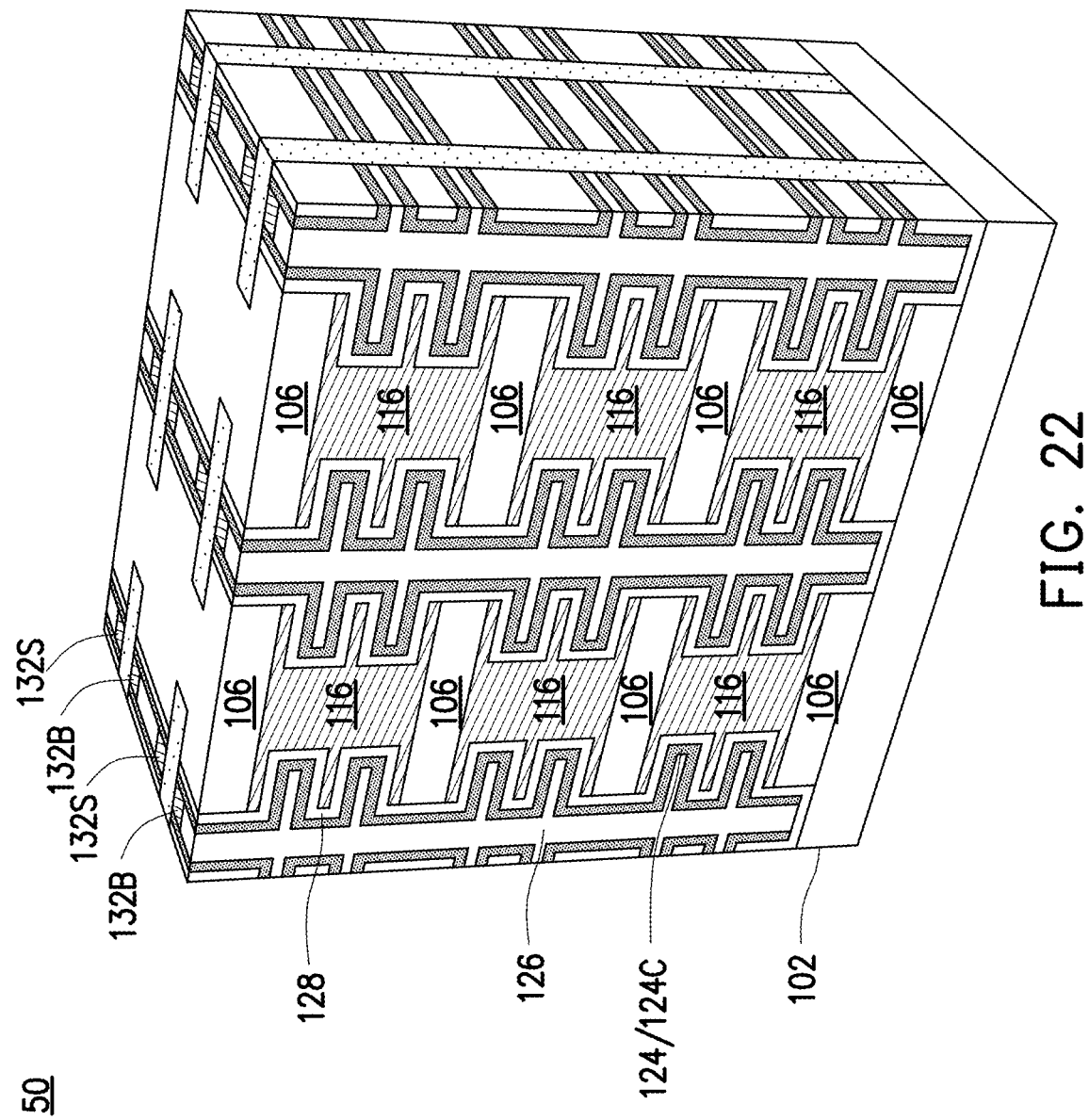
FIG. 22 is a three-dimensional view of a memory array at an intermediate stage of manufacturing, in accordance with some other embodiments.

FIG. 22 is a three-dimensional view of a memory array 50 at an intermediate stage of manufacturing, in accordance with some other embodiments. This embodiment is similar to the embodiment of FIG. 15D, except the word lines 116 have a plurality of sidewall recesses 112. The word lines 116 may be formed with a plurality of sidewall recesses 112 through a process that includes the step described with respect to FIG. 21. For example, each of the word lines 116 may be formed with a plurality of sidewall recesses 112 by forming each of the conductive layers 108 with two of the first conductive sub-layers 108A and three of the second conductive sub-layers 108B.

In the embodiments described with respect to FIGS. 1 through 22, the memory array 50 is formed over a substrate 102, such as a dielectric substrate. In some embodiments, the memory array 50 is formed as part of a standalone device (e.g., a memory die), which is integrated with other devices (e.g., a logic die) through device packaging. In some embodiments, the memory array 50 is embedded in another device, such as a logic die. In such embodiments, the substrate 102 may be omitted, or may be an underlying layer, such as an underlying dielectric layer, an underlying semiconductor substrate, or the like.

Figure 23:
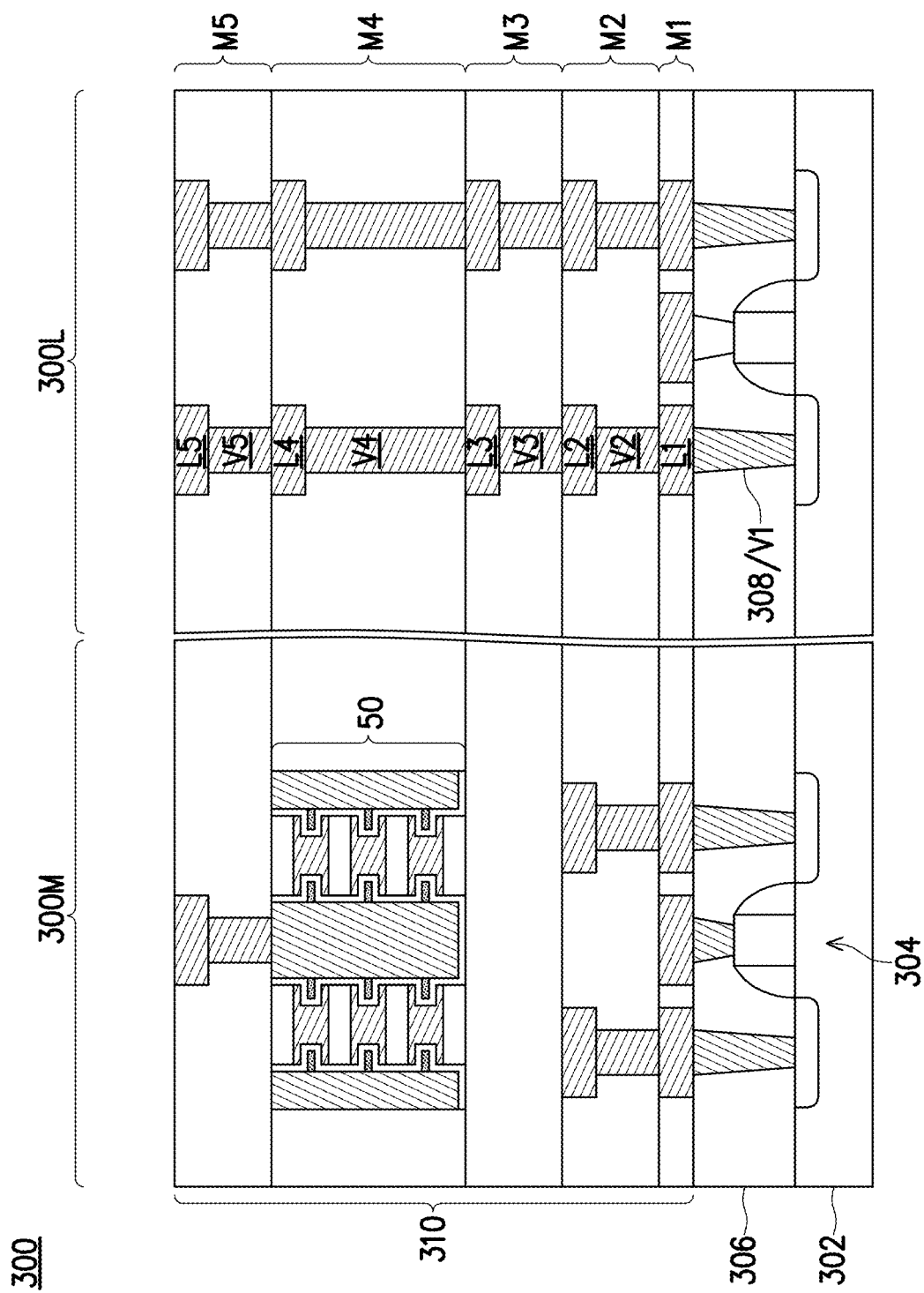
FIG. 23 is a cross-sectional view of a semiconductor device, in accordance with some embodiments.

FIG. 23 is a cross-sectional view of a semiconductor device 300, in accordance with some embodiments. FIG. 23 is a cross-sectional view shown along reference cross-section C-C in FIG. 16D. FIG. 23 is a simplified view, and some features are omitted for clarity of illustration. The semiconductor device 300 includes a logic region 300L and a memory region 300M. Memory devices (e.g., memories) are formed in the memory region 300M and logic devices (e.g., logic circuits) are formed in the logic region 300L. For example, a memory array 50 (see FIG. 1) can be formed in the memory region 300M, and logic devices can be formed in the logic region 300L. The memory region 300M can be disposed at an edge of the logic region 300L, or the logic region 300L can surround the memory region 300M.

The logic region 300L and the memory region 300M are formed over a same semiconductor substrate 302. The semiconductor substrate 302 may be silicon, doped or undoped, or an active layer of a semiconductor-on-insulator (SOI) substrate. The semiconductor substrate 302 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multilayered or gradient substrates, may also be used.

Devices 304 are formed at the active surface of the semiconductor substrate 302. The devices 304 may be active devices or passive devices. For example, the electrical components may be transistors, diodes, capacitors, resistors, or the like, formed by any suitable formation method. The devices 304 are interconnected to form the memory devices and logic devices of the semiconductor device 300.

One or more inter-layer dielectric (ILD) layer(s) 306 are formed on the semiconductor substrate 302, and electrically conductive features, such as contact plugs 308, are formed electrically connected to the devices 304. The ILD layer(s) 306 may be formed of any suitable dielectric material, for example, a an oxide such as silicon oxide, phosphosilicate glass (PSG), borosilicate glass (BSG), boron-doped phosphosilicate glass (BPSG), or the like; nitride such as silicon nitride; or the like. The ILD layer(s) may be formed by any acceptable deposition process, such as spin coating, physical vapor deposition (PVD), chemical vapor deposition (CVD), the like, or a combination thereof. The electrically conductive features in the ILD layer(s) may be formed through any suitable process, such as deposition, damascene (e.g., single damascene, dual damascene, etc.), the like, or combinations thereof.

An interconnect structure 310 is formed over the semiconductor substrate 302. The interconnect structure 310 interconnects the devices 304 to form integrated circuits in each of the logic region 300L and memory region 300M. The interconnect structure 310 includes multiple metallization layers M1-M5. Although five metallization layers are illustrated, it should be appreciated that more or less metallization layers may be included. Each of the metallization layers M1-M5 includes metallization patterns in dielectric layers. The metallization patterns are connected to the devices 304 of the semiconductor substrate 302, and include, respectively, metal lines L1-L5 and metal vias V1-V5 formed in one or more inter-metal dielectric (IMD) layers. The interconnect structure 310 may formed by a damascene process, such as a single damascene process, a dual damascene process, or the like. In some embodiments, the contact plugs 308 are also part of the metallization patterns, such as part of the lowest layer of metal vias V1.

In this embodiment, the memory array 50 is formed in the interconnect structure 310. The memory array 50 can be formed in any of the metallization layers M1-M5, and is illustrated as being formed in an intermediate metallization layer M4, although it could also be formed in lower metallization layers M1-M3 or an upper metallization layer M5. The memory array 50 is electrically connected to the devices 304. In this embodiment, a metallization layer overlying the memory array 50 (e.g., the metallization layer M5) contains interconnects to the source lines 132S and the bit lines 132B. The metallization layer overlying the memory array 50 (e.g., the metallization layer M5) can also contain interconnects to the word lines 116, such as through the conductive contacts 166 (see FIG. 17J). In another embodiment, a metallization layer underlying the memory array 50 (e.g., the metallization layer M3) contains interconnects to the source lines 132S, the bit lines 132B, and/or the word lines 116.

In some embodiments, the interconnect structure 310 may be formed by first forming the layers underlying the memory array 50, e.g., the metallization layers M1-M3. The memory array 50 can then be formed on the metallization layer M3, with the substrate 102 being an etch stop layer on the IMD of the metallization layer M3. After formation of the memory array 50, the remainder of the metallization layer M4 can be formed, such as by depositing and planarizing the IMD for the metallization layer M4, and then forming metal lines M4 and metal vias M4 (which may include the IMD 216 and the conductive contacts 166, see FIG. 17J). The layers (if any) overlying the memory array 50, e.g., the metallization layer M5, can then be formed.

Embodiments may achieve advantages. Each word line 116 can be formed with sidewall recess by recessing sidewalls of the word line 116 and redepositing conductive material of the word line 116 before forming the film stacks for the transistors 54. The word lines 116 can be used to form the transistors 54 with three-dimensional channel regions 124C. Forming the transistors 54 with three-dimensional channel regions may allow the performance of the transistors 54 to be improved. For example, three-dimensional channel regions can produce greater electric fields with lower gate voltages, a smaller on-current ($I_{ON}$), improved on-off current ratios, and less leakage than planar channel regions. Memory arrays suitable for applications that demand high performing memories (e.g., artificial intelligence, high-performance computing, etc.) may thus be formed. Further, the read/write window of the memories and the reliability of the memories may be improved. Further, forming memory arrays with three-dimensional channel regions may allow the average size of devices (e.g., transistors) in the memory arrays to be reduced while the channel regions maintain sufficient performance. The density of memories may thus be improved.

In an embodiment, a device includes: a first dielectric layer having a first sidewall; a second dielectric layer having a second sidewall; a word line between the first dielectric layer and the second dielectric layer, the word line having an outer sidewall and an inner sidewall, the inner sidewall recessed from the outer sidewall, the first sidewall, and the second sidewall; a memory layer extending along the outer sidewall of the word line, the inner sidewall of the word line, the first sidewall of the first dielectric layer, and the second sidewall of the second dielectric layer; and a semiconductor layer extending along the memory layer. In some embodiments of the device, the word line has a connecting surface extending between the outer sidewall and the inner sidewall, the connecting surface and the inner sidewall forming a right angle. In some embodiments of the device, the word line has a connecting surface extending between the outer sidewall and the inner sidewall, the connecting surface and the inner sidewall forming an obtuse angle. In some embodiments of the device, the word line has a connecting surface extending between the outer sidewall and the inner sidewall, the connecting surface and the inner sidewall forming a sharp corner. In some embodiments of the device, the word line has a connecting surface extending between the outer sidewall and the inner sidewall, the connecting surface and the inner sidewall forming a rounded corner. In some embodiments of the device, the inner sidewall is recessed from the outer sidewall by a depth in a range of 10 nm to 50 nm. In some embodiments, the device further includes: a bit line contacting a sidewall of the semiconductor layer and a sidewall of the memory layer; a source line contacting the sidewall of the semiconductor layer and the sidewall of the memory layer; and an isolation region between the source line and the bit line, the isolation region contacting the sidewall of the semiconductor layer and the sidewall of the memory layer. In some embodiments, the device further includes: a bit line contacting a sidewall of the semiconductor layer; a source line contacting the sidewall of the semiconductor layer; and an isolation region between the source line and the bit line, the semiconductor layer separating a sidewall of the memory layer from each of the source line, the bit line, and the isolation region. In some embodiments, the device further includes: a bit line contacting a sidewall of the semiconductor layer; a source line contacting the sidewall of the semiconductor layer; and an isolation region between the source line and the bit line, the semiconductor layer and the isolation region separating a sidewall of the memory layer from each of the source line and the bit line.

In an embodiment, a device includes: a word line including a main portion, a first projecting portion, and a second projecting portion, the first projecting portion and the second projecting portion each extending away from opposite sides of the main portion; a memory layer extending along the word line, a portion of the memory layer disposed between the first projecting portion and the second projecting portion of the word line; a semiconductor layer extending along the memory layer, a portion of the semiconductor layer disposed between the first projecting portion and the second projecting portion of the word line; and a conductive line extending along the semiconductor layer.

In some embodiments of the device, a portion of the conductive line is disposed between the first projecting portion and the second projecting portion of the word line. In some embodiments of the device, a portion of the semiconductor layer is disposed between the conductive line and the main portion of the word line. In some embodiments of the device, a thickness of the first projecting portion and the second projecting portion is from 5% to 30% of a thickness of the main portion.

In an embodiment, a method includes: forming a first conductive material between layers of a dielectric material; recessing a sidewall of the first conductive material from sidewalls of the dielectric material to form a sidewall recess; depositing a second conductive material in the sidewall recess; patterning the second conductive material to define a word line including the first conductive material and the second conductive material; forming a memory layer in the sidewall recess, the memory layer contacting the word line; and forming a semiconductor layer contacting the memory layer.

In some embodiments of the method, the first conductive material and the second conductive material are a same conductive material. In some embodiments of the method, the first conductive material and the second conductive material are different conductive materials. In some embodiments of the method, patterning the second conductive material includes: etching the second conductive material to remove portions of the second conductive material on the sidewalls of the dielectric material. In some embodiments of the method, etching the second conductive material includes: performing an anisotropic dry etch using a fluorine-based gas mixed with oxygen gas. In some embodiments of the method, the anisotropic dry etch removes the second conductive material from 2 to 5 times faster than the dielectric material. In some embodiments of the method, after depositing the second conductive material, the sidewall recess have a depth in a range of 10 nm to 50 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first dielectric layer;
a second dielectric layer;
a word line between the first dielectric layer and the second dielectric layer, the word line having an outer sidewall and an inner sidewall, the inner sidewall being recessed from the outer sidewall;
a memory layer on the word line, a portion of the memory layer being disposed between the outer sidewall of the word line and the inner sidewall of the word line;
a semiconductor layer on the memory layer, a portion of the semiconductor layer being disposed between the outer sidewall of the word line and the inner sidewall of the word line;
a first metal line on the semiconductor layer;
a second metal line on the semiconductor layer; and
an isolation region between the first metal line and the second metal line.

2. The device of claim 1, wherein a portion of the first metal line and a portion of the second metal line are disposed between the outer sidewall of the word line and the inner sidewall of the word line.

3. The device of claim 1, wherein no portion of the first metal line and no portion of the second metal line are disposed between the outer sidewall of the word line and the inner sidewall of the word line.

4. The device of claim 1, wherein the word line has a connecting surface extending between the outer sidewall and the inner sidewall, the connecting surface and the inner sidewall forming a right angle.

5. The device of claim 1, wherein the word line has a connecting surface extending between the outer sidewall and the inner sidewall, the connecting surface and the inner sidewall forming an obtuse angle.

6. The device of claim 1, wherein the word line has a connecting surface extending between the outer sidewall and the inner sidewall, the connecting surface and the inner sidewall forming a sharp corner.

7. The device of claim 1, wherein the word line has a connecting surface extending between the outer sidewall and the inner sidewall, the connecting surface and the inner sidewall forming a rounded corner.

8. The device of claim 1, wherein the first metal line is a bit line and the second metal line is a source line.

9. A device comprising:
a word line extending in a first direction, the word line having a main portion, a first projecting portion extending in a second direction away from the main portion, and a second projecting portion extending in the second direction away from the main portion, the second direction perpendicular to the first direction;
a memory layer contacting the word line;
a semiconductor layer contacting the memory layer;
a bit line contacting the semiconductor layer; and
a source line contacting the semiconductor layer, the source line and the bit line each extending in a third direction, the third direction perpendicular to the second direction and the first direction, wherein a first line extending in the third direction intersects the first projecting portion, the semiconductor layer, the memory layer, and the second projecting portion.

10. The device of claim 9 further comprising:
an isolation region contacting the semiconductor layer, the isolation region disposed between the source line and the bit line.

11. The device of claim 10, wherein the first line intersects the isolation region.

12. The device of claim 9, wherein the word line comprises:
a first conductive layer;

a second conductive layer; and a third conductive layer between the first conductive layer and the second conductive layer, a conductive material of the third conductive layer being the same as a conductive material of the second conductive layer and a conductive material of the first conductive layer.

13. The device of claim 9, wherein the word line comprises:

a first conductive layer;

a second conductive layer; and a third conductive layer between the first conductive layer and the second conductive layer, a conductive material of the third conductive layer being different from a conductive material of the second conductive layer and a conductive material of the first conductive layer.

14. The device of claim 9, wherein the word line comprises:

a first conductive layer;

a second conductive layer; and a third conductive layer between the first conductive layer and the second conductive layer, wherein a second line extending in the third direction intersects the first conductive layer, the second conductive layer, and the third conductive layer.

15. The device of claim 9, wherein the word line comprises:

a first conductive layer;

a second conductive layer; and a third conductive layer between the first conductive layer and the second conductive layer, wherein a second line extending in the second direction intersects the first conductive layer, the second conductive layer, and the third conductive layer.

16. A device comprising:

a word line having a lower portion, a middle portion, and an upper portion, a width of the middle portion being less than a width of the lower portion and a width of the upper portion;

a memory layer on a sidewall of the lower portion of the word line, on a sidewall of the middle portion of the word line, and on a sidewall of the upper portion of the word line;

a semiconductor layer on a sidewall of the memory layer;

a bit line on a sidewall of the semiconductor layer;

a source line on the sidewall of the semiconductor layer; and an isolation region between the source line and the bit line.

17. The device of claim 16, wherein a portion of the memory layer is disposed between the lower portion and the upper portion of the word line.

18. The device of claim 16, wherein a portion of the semiconductor layer is disposed between the lower portion and the upper portion of the word line.

19. The device of claim 16, wherein a portion of the bit line and a portion of the source line are disposed between the lower portion and the upper portion of the word line.

20. The device of claim 16, wherein a portion of the isolation region is disposed between the lower portion and the upper portion of the word line.

* * * * *